US012610574B2

(12) United States Patent
Chun et al.

(10) Patent No.: US 12,610,574 B2
(45) Date of Patent: Apr. 21, 2026

(54) SEMICONDUCTOR DEVICE AND METHOD FOR MANUFACTURING THE SAME

(71) Applicant: Samsung Electronics Co., Ltd.,
Suwon-si (KR)

(72) Inventors: Kyung Bin Chun, Suwon-si (KR); Jin Bum Kim, Suwon-si (KR); Dong Suk Shin, Suwon-si (KR); Gyeom Kim, Suwon-si (KR); Da Hye Kim, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 471 days.

(21) Appl. No.: 18/170,104

(22) Filed: Feb. 16, 2023

(65) Prior Publication Data

US 2024/0014304 A1 Jan. 11, 2024

(30) Foreign Application Priority Data

Jul. 5, 2022 (KR) ........................ 10-2022-0082258

(51) Int. Cl.
*H01L 29/775* (2006.01)
*H01L 29/08* (2006.01)
(Continued)

(52) U.S. Cl.
CPC ........... *H10D 30/43* (2025.01); *H10D 30/014* (2025.01); *H10D 30/031* (2025.01); *H10D 30/6735* (2025.01); *H10D 62/151* (2025.01)

(58) Field of Classification Search
CPC .... H10D 30/43; H10D 30/014; H10D 30/031; H10D 30/6735; H10D 62/151;
(Continued)

(56) References Cited

U.S. PATENT DOCUMENTS

| | | | |
|---|---|---|---|
| 10,944,009 | B2 | 3/2021 | Wang et al. |
| 11,264,502 | B2 | 3/2022 | Chang et al. |

(Continued)

FOREIGN PATENT DOCUMENTS

| | | |
|---|---|---|
| KR | 20040077504 A | 9/2004 |
| KR | 20200131497 A | 11/2020 |

OTHER PUBLICATIONS

European Office Action corresponding to EP 23173230.6; Dated: Dec. 13, 2023, (10 pages).
(Continued)

*Primary Examiner* — Tong-Ho Kim
(74) *Attorney, Agent, or Firm* — Wolf, Greenfield & Sacks, P.C.

(57) ABSTRACT

A semiconductor device includes a lower pattern on a substrate and protruding in a first direction, a source/drain pattern on the lower pattern and including a semiconductor liner film in contact with the lower pattern, and an epitaxial insulating liner extending along at least a portion of a sidewall of the semiconductor liner film, wherein the epitaxial insulating liner is in contact with the semiconductor liner film, wherein the semiconductor liner film includes a first portion, wherein the first portion of the semiconductor liner film includes a first point spaced apart from the lower pattern at a first height, and a second point spaced apart from the lower pattern at a second height, wherein the second height is greater than the first height, wherein a width of the semiconductor liner film in a second direction at the first point is less than a width of the semiconductor liner film in the second direction at the second point, and wherein the epitaxial insulating liner extends along at least a portion of a sidewall of the first portion of the semiconductor liner film.

20 Claims, 54 Drawing Sheets

(51) Int. Cl.

| | |
|---|---|
| *H01L 29/423* | (2006.01) |
| *H01L 29/66* | (2006.01) |
| *H10D 30/01* | (2025.01) |
| *H10D 30/43* | (2025.01) |
| *H10D 30/67* | (2025.01) |
| *H10D 62/13* | (2025.01) |

(58) Field of Classification Search
CPC ............ H10D 30/797; H10D 30/6757; H10D 62/822; H10D 64/017; H10D 64/256; H10D 62/10; H10D 62/124; H10D 84/0126; H10D 84/0165; H10D 84/038; H10D 84/834; H10D 84/853; H10D 84/856; H10D 84/83; H10D 30/024; H10D 30/62; H10D 30/6713; B82Y 10/00
USPC ........................................................ 257/401
See application file for complete search history.

(56) References Cited

U.S. PATENT DOCUMENTS

| | | | | |
|---|---|---|---|---|
| 2017/0084714 | A1 | 3/2017 | Ching et al. | |
| 2017/0148914 | A1* | 5/2017 | Lee ...................... | H10D 84/017 |
| 2020/0365690 | A1* | 11/2020 | Jeong ................... | H10D 84/834 |
| 2021/0134970 | A1 | 5/2021 | Lee et al. | |
| 2021/0336063 | A1* | 10/2021 | Liao ................... | H01L 23/5286 |
| 2021/0375864 | A1 | 12/2021 | Chang et al. | |
| 2021/0376101 | A1 | 12/2021 | Wang et al. | |
| 2021/0384306 | A1 | 12/2021 | Xie et al. | |
| 2022/0190134 | A1* | 6/2022 | Jeong ................... | H10D 30/014 |
| 2022/0199775 | A1 | 6/2022 | Park et al. | |

OTHER PUBLICATIONS

European Search Report corresponding to EP 23173230.6; Dated: Dec. 1, 2023, (4 pages).

* cited by examiner

ACT_L

SC_L

ACT_L

SC_L

ACT_L    U_AP

SC_L

ACT_L

SC_L

151P

150R

BP1

100

A                    A

D3

D2 ⊗ → D1

—120_HM

—150SP
—140P
—120P
—130P

ACT_L
SC_L
ACT_L
SC_L     U_AP
ACT_L
SC_L
ACT_L
SC_L

152 ⎫
151 ⎬150
151R
150R

BP1

100

A                                                    A

D3
⊗——D1
D2

SEMICONDUCTOR DEVICE AND METHOD FOR MANUFACTURING THE SAME

CROSS-REFERENCE TO RELATED APPLICATION

This application claims priority from Korean Patent Application No. 10-2022-0082258 filed on Jul. 5, 2022 in the Korean Intellectual Property Office, and all the benefits accruing therefrom under 35 U.S.C. 119, the contents of which are herein incorporated by reference in their entirety.

BACKGROUND

Technical Field

The present disclosure relates to a semiconductor device and a method for manufacturing the same, and more specifically, to a semiconductor device including an MBCFET™ (Multi-Bridge Channel Field Effect Transistor and) a method for manufacturing the same.

Description of Related Art

One of the scaling schemes for increasing a density of a semiconductor device includes a multi gate transistor in which a multi-channel active pattern (or silicon body) in a shape of a fin or a nanowire is formed on a substrate and a gate is formed on a surface of the multi-channel active pattern.

Because the multi-gate transistor uses a three-dimensional channel, it is generally easy to scale the multi-gate transistor. Further, current control ability of the multi-gate transistor may be improved without increasing a gate length of the multi-gate transistor. In addition, the multi-gate transistor may effectively suppress SCE (short channel effect) in which a potential of a channel area is affected by a drain voltage.

SUMMARY

Embodiments of the present disclosure may provide a semiconductor device capable of improving element performance and reliability.

Embodiments of the present disclosure may further provide a method for manufacturing a semiconductor device capable of improving element performance and reliability.

Functionality and/or applications of embodiments of the present disclosure are not limited to the above-mentioned examples. Other functionality, applications, and/or advantages according to embodiments of the present disclosure that are not mentioned may be understood based on the following description. Further, it will be understood that the functionality, applications, and/or advantages according to embodiments of the present disclosure may be realized using the devices and methods set forth in the claims and combinations thereof.

According to an aspect of the present disclosure, there is provided a semiconductor device comprising a lower pattern on a substrate and protruding in a first direction, a source/drain pattern on the lower pattern and including a semiconductor liner film in contact with the lower pattern, and an epitaxial insulating liner extending along at least a portion of a sidewall of the semiconductor liner film, wherein the epitaxial insulating liner is in contact with the semiconductor liner film, wherein the semiconductor liner film includes a first portion, wherein the first portion of the semiconductor liner film includes a first point spaced apart from the lower pattern at a first height, and a second point spaced apart from the lower pattern at a second height, wherein the second height is greater than the first height, wherein a width of the semiconductor liner film in a second direction at the first point is less than a width of the semiconductor liner film in the second direction at the second point, and wherein the epitaxial insulating liner extends along at least a portion of a sidewall of the first portion of the semiconductor liner film.

According to another aspect of the present disclosure, there is provided a semiconductor device comprising a lower pattern on a substrate and protruding in a first direction, a field insulating film on the substrate and at least partially covering a sidewall of the lower pattern, a source/drain pattern on the lower pattern, wherein the source/drain pattern includes a semiconductor liner film in contact with the lower pattern, and a semiconductor filling film on the semiconductor liner film, an epitaxial insulating liner extending along a portion of a sidewall of the source/drain pattern and contacting the semiconductor liner film, and a source/drain etch stop film extending along an upper surface of the field insulating film and the sidewall of the source/drain pattern, wherein the epitaxial insulating liner is between the source/drain etch stop film and the source/drain pattern, wherein the sidewall of the source/drain pattern includes a lower inclined sidewall, an upper inclined sidewall on the lower inclined sidewall, and a facet intersection at which the lower inclined sidewall and the upper inclined sidewall meet, wherein at the facet intersection, a width of the source/drain pattern in a second direction is maximum, wherein at least a portion of the lower inclined sidewall of the source/drain pattern is defined by the semiconductor liner film, wherein the epitaxial insulating liner does not extend along the upper inclined sidewall of the source/drain pattern, and wherein the epitaxial insulating liner extends along an entirety of the lower inclined sidewall of the source/drain pattern defined by the semiconductor liner film.

According to still another aspect of the present disclosure, there is provided a semiconductor device comprising an active pattern including a lower pattern on a substrate and protruding in a first direction and a sheet pattern spaced apart from the lower pattern in the first direction, a gate structure on the lower pattern and including a gate electrode and a gate spacer extending in the second direction, and a source/drain pattern on the lower pattern and contacting the sheet pattern and the gate spacer, wherein the source/drain pattern includes a semiconductor liner film in contact with the sheet pattern and the gate spacer and a semiconductor filling film on the semiconductor liner film, wherein in a plan view, the semiconductor liner film includes a first portion having a first width in a second direction, and a second portion having a second width in the second direction, wherein the second width is greater than the first width, and wherein the first portion of the semiconductor liner film is between the second portion of the semiconductor liner film and the sheet pattern, and is in contact with the sheet pattern.

According to still another aspect of the present disclosure, there is provided a method for fabricating a semiconductor device comprising forming a lower pattern and an upper pattern structure on a substrate, wherein the upper pattern structure includes a plurality of sacrificial patterns and a plurality of active patterns alternately stacked, forming a dummy gate electrode on the upper pattern structure, forming a source/drain recess in the upper pattern structure using the dummy gate electrode as a mask, forming a pre-semiconductor liner film on the lower pattern and in the source/drain recess, forming an epitaxial insulating liner on the pre-semiconductor liner film, etching a portion of the pre-semiconductor liner film using the epitaxial insulating liner as a mask to form a semiconductor liner film extending along a sidewall and a bottom surface of the source/drain recess, and forming a semiconductor filling film on the semiconductor liner film.

BRIEF DESCRIPTION OF DRAWINGS

The above and other aspects and features of the present disclosure will become more apparent by describing in detail illustrative embodiments thereof with reference to the attached drawings, in which:

FIGS. 31 to 34 are diagrams that illustrates a semiconductor device according to some embodiments;

DETAILED DESCRIPTION

Figure 1:
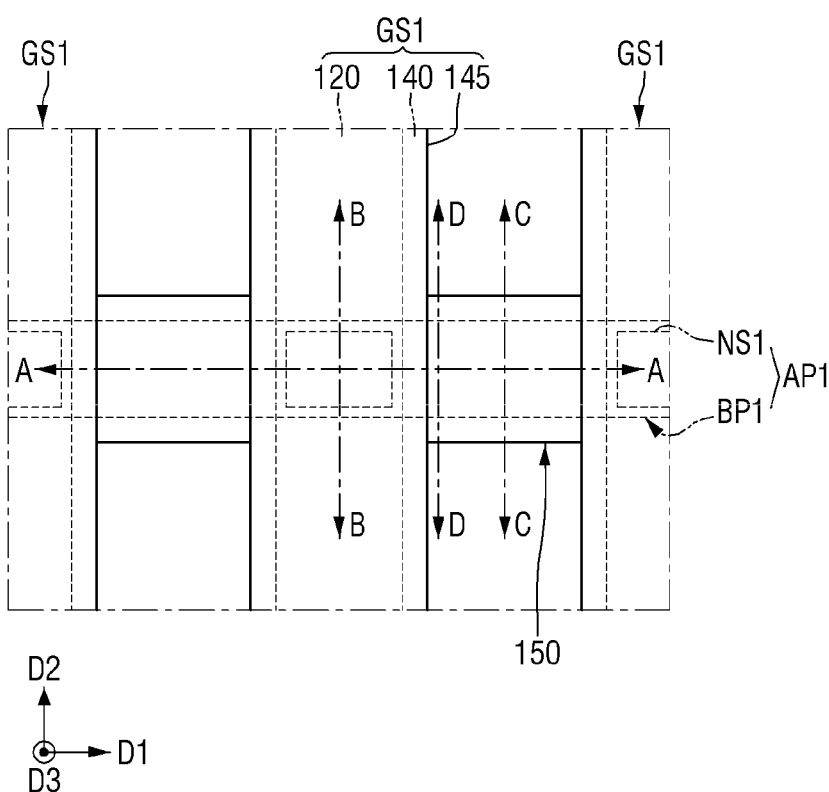
FIG. 1 is a plan view that illustrates a semiconductor device according to some embodiments.

Hereinafter, example embodiments of the present inventive concept will be described with reference to the accompanying drawings. The present inventive subject matter may, however, be embodied in many different forms and should not be construed as limited to the embodiments set forth herein. In the drawings, like numerals refer to like elements throughout the description and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. Terms as used herein "first direction D1", "second direction D2" and "third direction D3" should not be interpreted only to have a geometric relationship in which the first direction, the second direction, and the third direction are perpendicular to each other. The "first direction D1", "second direction D2" and "third direction D3" may be interpreted to have a broader direction within a range in which components herein may work functionally. It is noted that aspects described with respect to one embodiment may be incorporated in different embodiments although not specifically described relative thereto. That is, all embodiments and/or features of any embodiments can be combined in any way and/or combination.

A semiconductor device according to some embodiments may include a tunneling transistor (tunneling FET), a 3D transistor, or a 2D material-based FET based on a two-dimensional material, and a heterostructure thereof. Further, a semiconductor device according to some embodiments may include a bipolar junction transistor, a lateral double diffusion transistor (LDMOS), and the like.

With reference to FIG. 1 to FIG. 14, a description will be made of a semiconductor device according to some embodiments.

Figure 10:
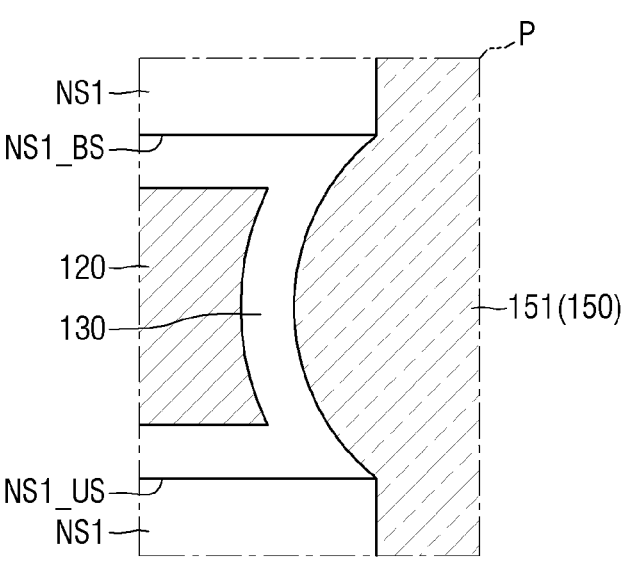
FIGS. 10 to 12 are enlarged views of a P area of FIG. 2.
Figure 11:
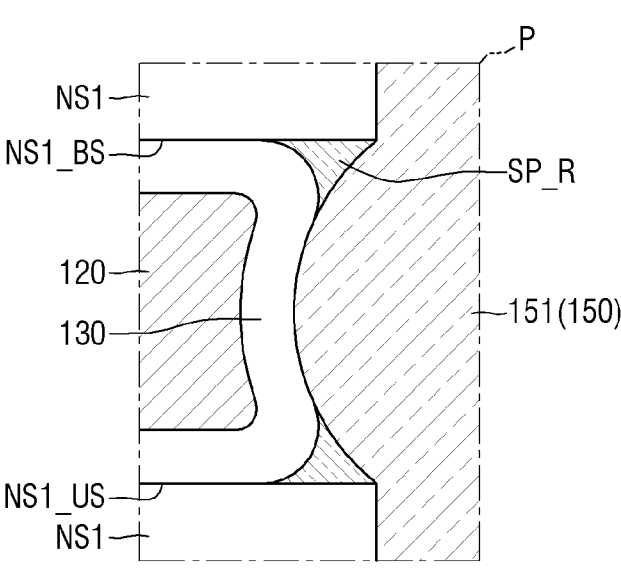
Figure 12:
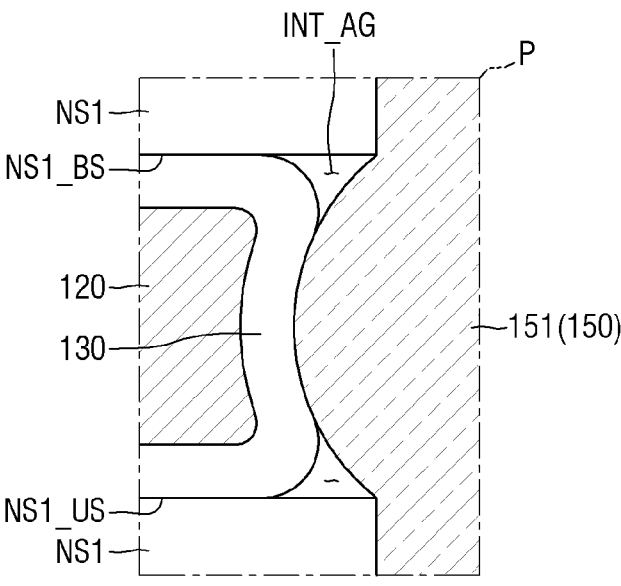
Figure 13:
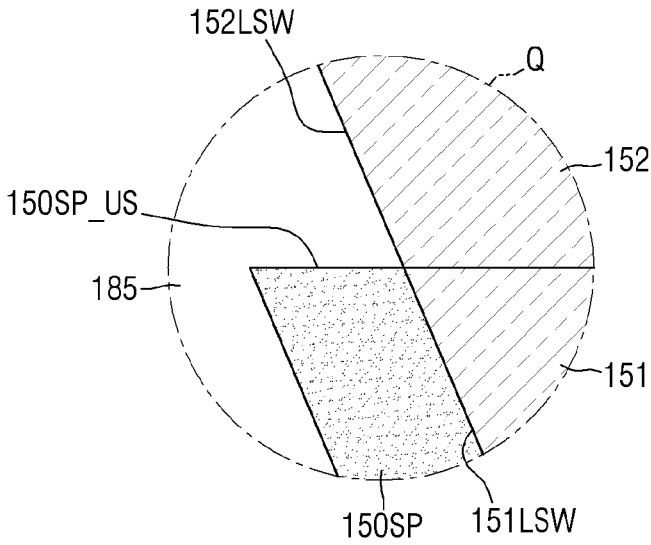
FIG. 13 and FIG. 14 are enlarged views of a Q portion of FIG. 4.
Figure 14:
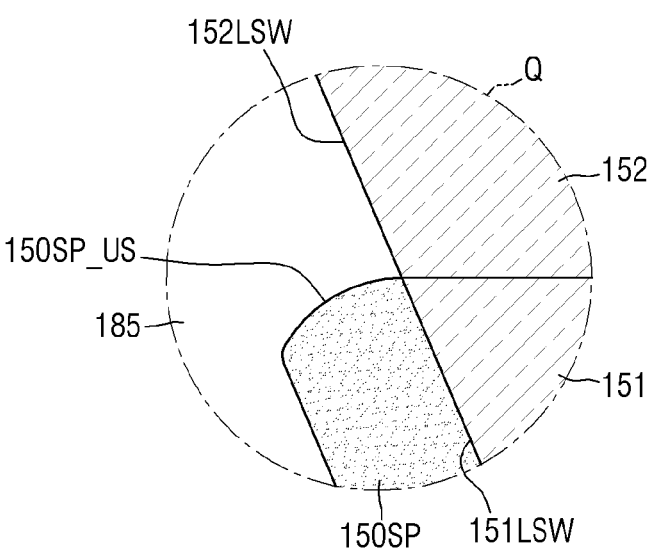

FIG. 1 is a plan view for illustrating a semiconductor device according to some embodiments. FIGS. 2 to 5 are cross-sectional views taken along A-A, B-B, C-C and D-D of FIG. 1, respectively. FIGS. 6 to 9 are plan views taken along E-E, F-F, G-G, and H-H of FIG. 2, respectively. FIGS. 10 to 12 are enlarged views of a P area of FIG. 2. FIG. 13 and FIG. 14 are enlarged views of a Q portion of FIG. 4.

For reference, FIG. 1 is shown at a high level while a first gate insulating film 130, a source/drain etch stop film 185, an interlayer insulating film 190, and a wiring structure 205 are omitted. Further, FIG. 5 may be a cross-sectional view of a portion adjacent to a first gate spacer 140, for example, a portion in which the source/drain etch stop film 185 is disposed.

Further, FIG. 6, FIG. 7 and FIG. 9 may be a plan view cut along a line below a facet intersection 150FC of FIG. 4 and FIG. 5, and FIG. 8 may be a plan view cut along a line above the facet intersection 150FC of FIG. 4 and FIG. 5.

Figure 8:
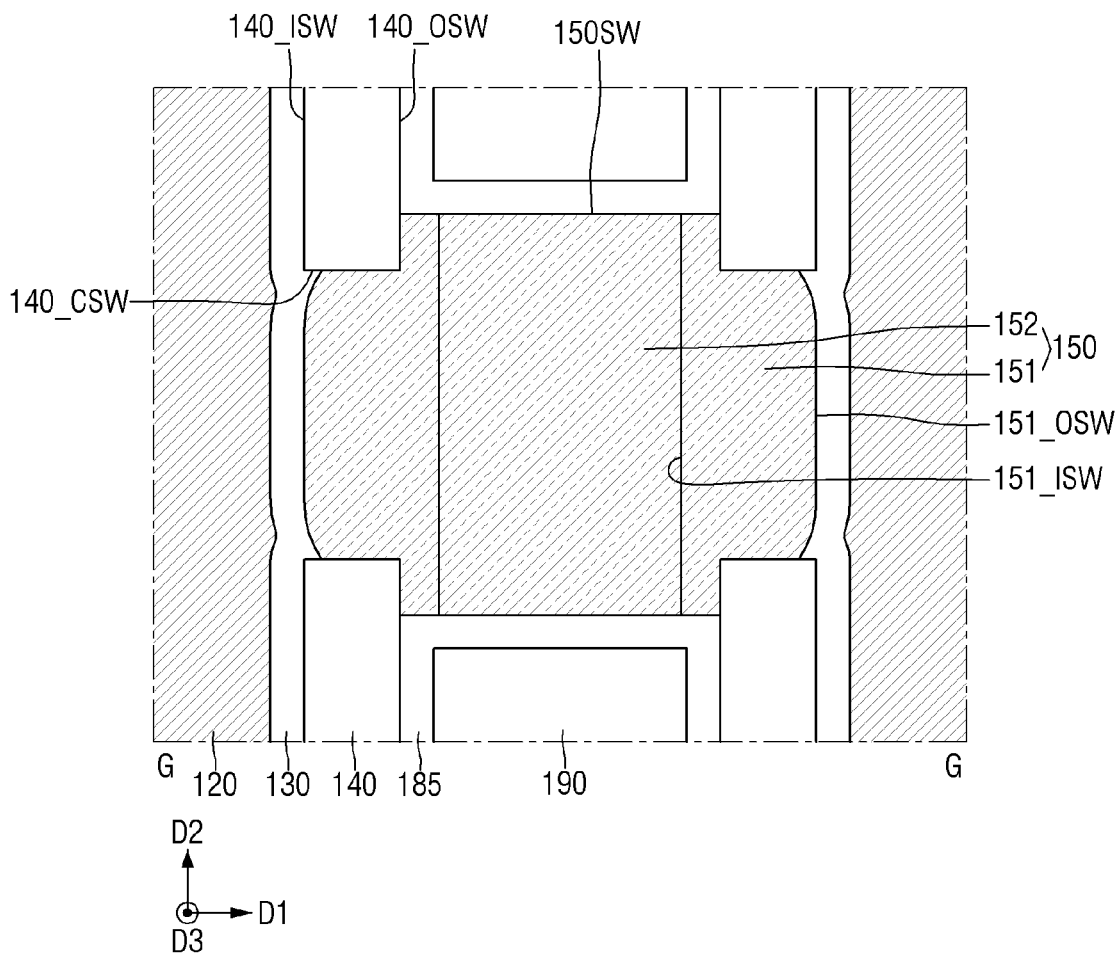

Although not shown, when a portion in which a first source/drain contact 180 is formed is excluded, a plan view at a level of a first sheet pattern NS1 disposed above a second inner gate structure INT2_GS1 may be similar to FIG. 8. Further, a plan view at a level of the first inner gate structure INT1_GS1 may be similar to FIG. 8. A person of ordinary skill in the art may easily infer a plan view at a level of a third inner gate structure INT3_GS1 using FIG. 5.

Referring to FIG. 1 to FIG. 14, a semiconductor device according to some embodiments may include a first active pattern AP1, a plurality of first gate structures GS1, a first source/drain pattern 150, and an epitaxial insulating liner 150SP.

A substrate 100 may be made of bulk silicon or SOI (silicon-on-insulator). Alternatively, the substrate 100 may be embodied as a silicon substrate, or may be made of a material other than silicon, such as silicon germanium, SGOI (silicon germanium on insulator), indium antimonide, lead telluride, indium arsenide, indium phosphide, gallium arsenide and/or gallium antimonide, but embodiments may not limited thereto.

The first active pattern AP1 may be disposed on the substrate 100. The first active pattern AP1 may extend in an elongate manner in the first direction D1. In one example, the first active pattern AP1 may be disposed in an area where a NMOS transistor is formed. In another example, the first active pattern AP1 may be disposed in an area where a PMOS transistor is formed. In following description, an example in which the first active pattern AP1 is disposed in an area where the PMOS transistor is formed is described.

The first active pattern AP1 may be, for example, a multi-channel active pattern. The first active pattern AP1 may include a first lower pattern BP1 and a plurality of first sheet patterns NS1.

The first lower pattern BP1 may protrude from the substrate 100 in a third direction D3. The first lower pattern BP1 may extend in the first direction D1. The first lower pattern BP1 may be defined by a fin trench FT extending in the first direction D1. The fin trench FT may define a sidewall of the first lower pattern BP1.

The plurality of first sheet patterns NS1 may be disposed on an upper surface BP1_US of the first lower pattern. The plurality of first sheet patterns NS1 may be spaced apart from the first lower pattern BP1 in the third direction D3. The first sheet patterns NS1 may be spaced apart from each other in the third direction D3.

Each of the first sheet patterns NS1 may include an upper surface NS1_US and a bottom surface NS1_BS. The upper surface NS1_US of the first sheet pattern is opposite to the bottom surface NS1_BS of the first sheet pattern in the third direction D3. The third direction D3 may be a direction intersecting the first direction D1 and the second direction D2. For example, the third direction D3 may be a thickness direction of the substrate 100. The first direction D1 may be a direction intersecting the second direction D2.

Although it is illustrated that four first sheet patterns NS1 are arranged in the third direction D3, this is only for convenience of illustration. However, embodiments of the present disclosure are not limited thereto.

The first lower pattern BP1 may be formed by etching a portion of the substrate 100, or may include an epitaxial layer grown from the substrate 100. The first lower pattern BP1 may include silicon or germanium as an elemental semiconductor material. Further, the first lower pattern BP1 may include a compound semiconductor, for example, a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto.

The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

The first sheet pattern NS1 may include one of silicon or germanium as an elemental semiconductor material, a group IV-IV compound semiconductor, or a group III-V compound semiconductor. Each of the first sheet patterns NS1 may include the same material as that of the first lower pattern BP1, or may include a material other than that of the first lower pattern BP1.

In the semiconductor device according to some embodiments, the first lower pattern BP1 may be a silicon lower pattern including silicon, while the first sheet pattern NS1 may be a silicon sheet pattern including silicon.

A width of the first sheet pattern NS1 in the second direction D2 may be increased or decreased in proportion to a width of the first lower pattern BP1 in the second direction D2. In one example, widths in the second direction D2 of the first sheet patterns NS1 arranged in the third direction D3 are shown to be equal to each other. However, this is only for convenience of illustration and embodiments of the present disclosure are not limited thereto. Unlike the illustration, as vertical levels of the first sheet patterns NS1 based on the first lower pattern BP1 increase, the widths in the second direction D2 of the first sheet patterns NS1 stacked in the third direction D3 may decrease. That is, a width of the topmost first sheet patterns NS1 in the second direction D2 may be the smallest.

A field insulating film 105 may be formed on the substrate 100. The field insulating film 105 may at least partially fill the fin trench FT. The field insulating film 105 may be disposed on a sidewall of the first lower pattern BP1. The field insulating film 105 is not disposed on the upper surface BP1_US of the first lower pattern.

In one example, the field insulating film 105 may be on and cover the entire sidewall of the first lower pattern BP1. Unlike what is shown, the field insulating film 105 may cover a portion of a sidewall of the first lower pattern BP1. In this case, a portion of the first lower pattern BP1 may protrude in the third direction D3 upwardly beyond an upper surface 105US of the field insulating film 105. In other embodiments, an amount by which the field insulating film 105 covers the sidewall of the first lower pattern BP1 may vary depending on a cut position.

A vertical level of each of the first sheet patterns NS1 is higher than that of the upper surface 105US of the field insulating film 105. The field insulating film 105 may include, for example, an oxide film, a nitride film, an oxynitride film, or a combination thereof. Although the field insulating film 105 is shown as a single film, this is only for convenience of illustration and embodiments of the present disclosure are not limited thereto.

A plurality of first gate structures GS1 may be disposed on the substrate 100. Each of the first gate structures GS1 may extend in the second direction D2. The first gate structures GS1 may be disposed to be spaced apart from each other in the first direction D1. The first gate structures GS1 may be adjacent to each other in the first direction D1. For example, the first gate structure GS1 may be disposed on each of both opposing sides of a first source/drain pattern 150 in the first direction D1.

The first gate structure GS1 may be disposed on the first active pattern AP1. The first gate structure GS1 may intersect the first active pattern AP1.

The first gate structure GS1 may intersect the first lower pattern BP1. The first gate structure GS1 may at least partially surround each of the first sheet patterns NS1.

The first gate structure GS1 may include, for example, a first gate electrode 120, a first gate insulating film 130, a first gate spacer 140, and a first gate capping pattern 145.

The first gate structure GS1 may include a plurality of inner gate structures INT1_GS1, INT2_GS1, INT3_GS1, and INT4_GS1 disposed between adjacent ones of the first sheet patterns NS1 adjacent to each other in the third direction D3 and between the first lower pattern BP1 and the first sheet pattern NS1. The inner gate structures INT1_GS1, INT2_GS1, INT3_GS1, and INT4_GS1 may be disposed between the upper surface BP1_US of the first lower pattern BP1 and a bottom surface NS1_BS of the lowest first sheet pattern, and an upper surface NS1_US of any first sheet pattern and a bottom surface NS1_BS of another first sheet pattern adjacent thereto in the third direction D3.

The number of the inner gate structures INT1_GS1, INT2_GS1, INT3_GS1, and INT4_GS1 may be proportional to the number of the first sheet patterns NS1 included in the active pattern AP1. For example, the number of the inner gate structures INT1_GS1, INT2_GS1, INT3_GS1, and INT4_GS1 may be equal to the number of the first sheet patterns NS1. Because the first active pattern AP1 includes the plurality of first sheet patterns NS1, the first gate structure GS1 may include the plurality of inner gate structures.

The inner gate structures INT1_GS1, INT2_GS1, INT3_GS1, and INT4_GS1 may contact the upper surface BP1_US of the first lower pattern, the upper surface NS1_US of the first sheet pattern, and the bottom surface NS1_BS of the first sheet pattern.

The inner gate structures INT1_GS1, INT2_GS1, INT3_GS1, and INT4_GS1 may contact the first source/drain pattern 150 to be described later. For example, the inner gate structures INT1_GS1, INT2_GS1, INT3_GS1, and INT4_GS1 may directly contact the first source/drain pattern 150.

Following description is made based on a case where the number of the inner gate structures INT1_GS1, INT2_GS1, INT3_GS1, and INT4_GS1 is 4.

The first gate structure GS1 may include a first inner gate structure INT1_GS1, a second inner gate structure INT2_GS1, a third inner gate structure INT3_GS1, and a fourth inner gate structure INT4_GS1. The first inner gate structure INT1_GS1, the second inner gate structure INT2_GS1, the third inner gate structure INT3_GS1, and the fourth inner gate structure INT4_GS1 may be sequentially stacked on the first lower pattern BP1.

The fourth inner gate structure INT4_GS1 may be disposed between the first lower pattern BP1 and the first sheet pattern NS1. The fourth inner gate structure INT4_GS1 may constitute the lowermost one of the inner gate structures INT1_GS1, INT2_GS1, INT3_GS1, and INT4_GS1. The fourth inner gate structure INT4_GS1 may constitute the lowermost inner gate structure.

Each of the first inner gate structure INT1_GS1, the second inner gate structure INT2_GS1, and the third inner gate structure INT3_GS1 may be disposed between adjacent ones of the first sheet patterns NS1 adjacent to each other in the third direction D3. The first inner gate structure INT1_GS1 may constitute the uppermost one of the inner gate structures INT1_GS1, INT2_GS1, INT3_GS1, and INT4_GS1. The first inner gate structure INT1_GS1 may be an uppermost inner gate structure. The second inner gate structure INT2_GS1 and the third inner gate structure INT3_GS1 are disposed between the first inner gate structure INT1_GS1 and the fourth inner gate structure INT4_GS1.

Each of the inner gate structures INT1_GS1, INT2_GS1, INT3_GS1, and INT4_GS1 includes a first gate electrode 120 and a first gate insulating film 130 disposed between the adjacent first sheet patterns NS1 and between the first lower pattern BP1 and the first sheet pattern NS1.

Figure 2:
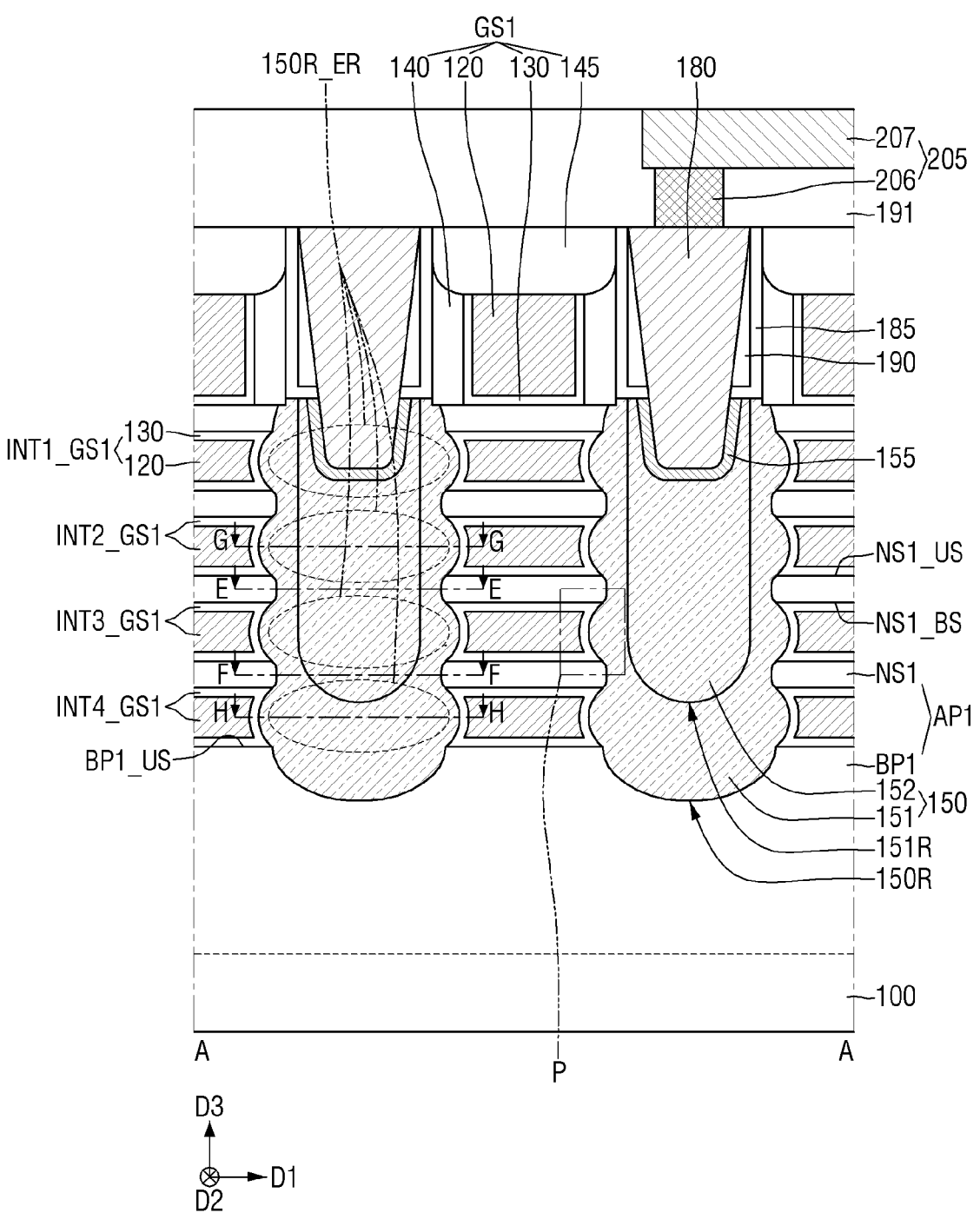
FIGS. 2 to 5 are cross-sectional views taken along A-A, B-B, C-C and D-D of FIG. 1, respectively.
Figure 3:
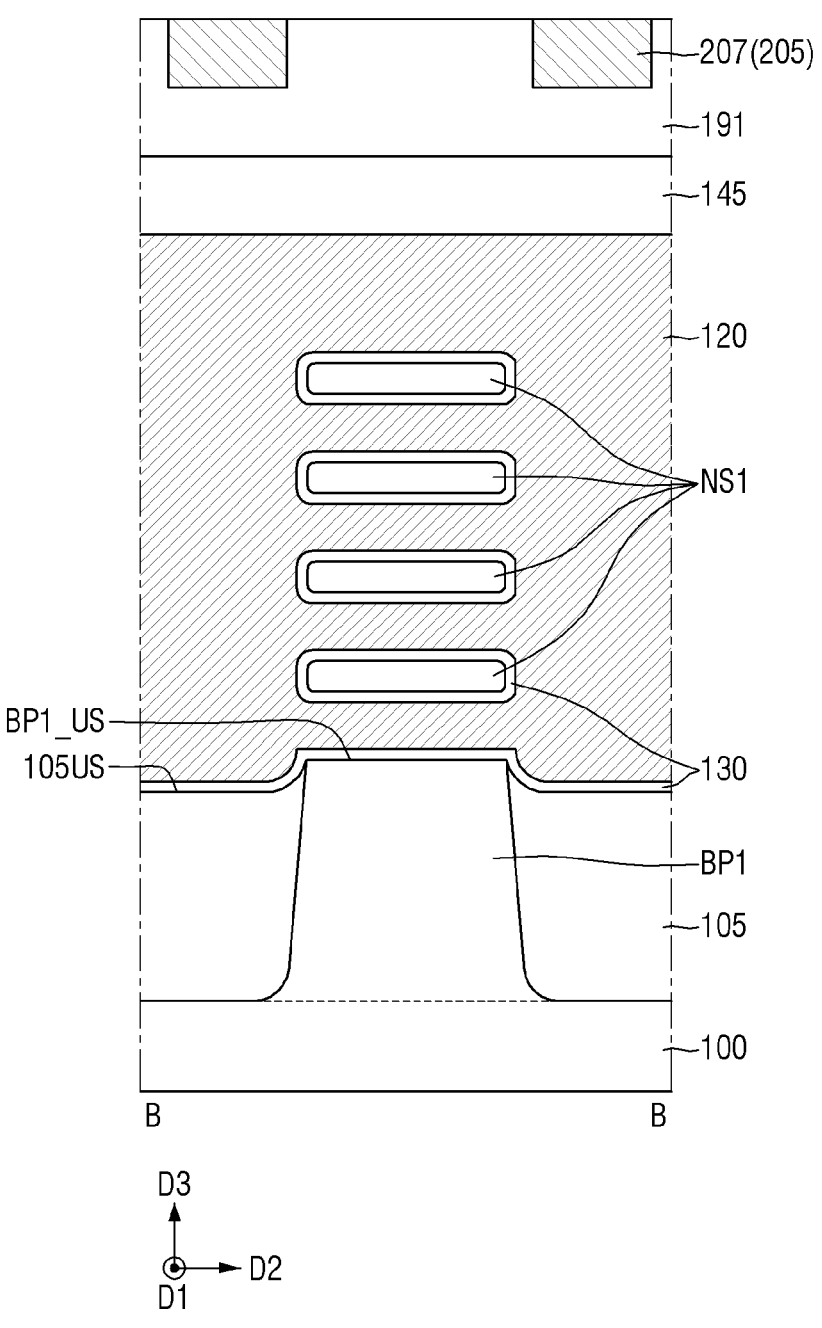

The following description is based on FIG. 2 as a cross-sectional view cut in the first direction D1. In one example, a width of the first inner gate structure INT1_GS1 may be equal to each of a width of the second inner gate structure INT2_GS1 and a width of the third inner gate structure INT3_GS1. A width of the fourth inner gate structure INT4_GS1 may be equal to the width of the third inner gate structure INT3_GS1.

In another example, the width of the fourth inner gate structure INT4_GS1 may be greater than the width of the third inner gate structure INT3_GS1. The width of the first inner gate structure INT1_GS1 may be equal to each of the width of the second inner gate structure INT2_GS1 and the width of the third inner gate structure INT3_GS1.

The second inner gate structure INT2_GS1 will be described by way of an example. The width of the second inner gate structure INT2_GS1 may be measured in a space between the upper surface NS1_US of the first sheet pattern and the bottom surface NS1_BS of the first sheet pattern facing each other in the third direction D3.

The first gate electrode 120 may be formed on the first lower pattern BP1. The first gate electrode 120 may intersect the first lower pattern BP1. The first gate electrode 120 may at least partially surround the first sheet pattern NS1. A portion of the first gate electrode 120 may be disposed between the adjacent first sheet patterns NS1 and between the first lower pattern BP1 and the first sheet pattern NS1.

The first gate electrode 120 may include one or more materials including, for example, a metal, a metal alloy, a conductive metal nitride, a metal silicide, a doped semiconductor material, a conductive metal oxide, and/or a conductive metal oxynitride. The first gate electrode 120 may include one or more materials including, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. Embodiments of the present disclosure, however, are not limited thereto. The conductive metal oxide and the conductive metal oxynitride may include oxidized products of the above-mentioned materials. Embodiments of the present disclosure, however, are not limited thereto.

The first gate electrode 120 may be disposed on each of both opposing sides of the first source/drain pattern 150 to be described later. The first gate structure GS1 may be disposed on each of both opposing sides opposite to each other in the first direction D1 of the first source/drain pattern 150.

In one example, each of the first gate electrodes 120 disposed on each of both opposing sides of the first source/drain pattern 150 may be embodied as a normal gate electrode used as a gate of a transistor. In another example, the first gate electrode 120 disposed on one side of the first source/drain pattern 150 may be used as a gate of the transistor, while the first gate electrode 120 disposed on the other side of the first source/drain pattern 150 may act as a dummy gate electrode.

The first gate insulating film 130 may extend along and on the upper surface 105US of the field insulating film 105 and the upper surface BP1_US of the first lower pattern. The first gate insulating film 130 may at least partially surround the plurality of first sheet patterns NS1. The first gate insulating film 130 may be disposed along a circumference of the first sheet pattern NS1. The first gate electrode 120 is disposed on the first gate insulating film 130. The first gate insulating film 130 is disposed between the first gate electrode 120 and the first sheet pattern NS1. A portion of the first gate insulating layer 130 may be disposed between adjacent ones of the first sheet patterns NS1 adjacent to each other in the third direction D3 and between the first lower pattern BP1 and the first sheet pattern NS1.

The first gate insulating film 130 may include silicon oxide, silicon-germanium oxide, germanium oxide, silicon oxynitride, silicon nitride, and/or a high-k material having a higher dielectric constant than that of silicon oxide. The high dielectric constant (high-k) material may include one or more materials, such as, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

Although it is illustrated that the first gate insulating film 130 is embodied as a single film, this is only for convenience of illustration, and embodiments of the present disclosure are not limited thereto. The first gate insulating film 130 may include a plurality of films. The first gate insulating film 130 may include an interfacial film disposed between the first sheet pattern NS1 and the first gate electrode 120, and a high dielectric constant insulating film.

The semiconductor device according to some embodiments may include an NC (negative capacitance) FET using a negative capacitor. For example, the first gate insulating film 130 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. Conversely, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, one or more materials, such as, for example hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and/or oxygen (O).

The ferroelectric material film may further contain doped dopants. For example, the dopant may include one or more materials, such as, for example, aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn). A type of the dopant contained in the ferroelectric material film may vary based on a type of the ferroelectric material included in the ferroelectric material film.

When the ferroelectric material film includes hafnium oxide, the dopant contained in the ferroelectric material film may include, for example, gadolinium (Gd), silicon (Si), zirconium (Zr), aluminum (Al), and/or yttrium (Y).

When the dopant is aluminum (Al), the ferroelectric material film may contain about 3 to about 8 at % (atomic %) of aluminum. In this example, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, silicon oxide and/or metal oxide having a high dielectric constant. Although the metal oxide contained in the paraelectric material film may include, for example, hafnium oxide, zirconium oxide and/or aluminum oxide. However, embodiments of the present disclosure are not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nm, embodiments of the present disclosure are not limited thereto. Because a critical thickness exhibiting the ferroelectric properties may be vary based on a type of the ferroelectric material, the thickness of the ferroelectric material film may vary based on the type of the ferroelectric material.

In one example, the first gate insulating film 130 may include one ferroelectric material film. In another example, the first gate insulating film 130 may include a plurality of ferroelectric material films spaced apart from each other. The first gate insulating film 130 may have a multilayer structure in which a plurality of ferroelectric material films and a plurality of paraelectric material films are alternately stacked on top of each other.

The first gate spacer 140 may be disposed on a sidewall of the first gate electrode 120. The first gate spacer 140 may not be disposed between the first lower pattern BP1 and the first sheet pattern NS1 and between adjacent ones of the first sheet patterns NS1 adjacent to each other in the third direction D3.

The first gate spacer 140 may include an inner sidewall 140_ISW, a connection sidewall 140_CSW, and an outer sidewall 140_OSW. The inner sidewall 140_ISW of the first gate spacer faces a sidewall of the first gate electrode 120 extending in the second direction D2. The inner sidewall 140_ISW of the first gate spacer may extend in the second direction D2. The inner sidewall 140_ISW of the first gate spacer may be opposite to the outer sidewall 140_OSW of the first gate spacer facing the first interlayer insulating film 190. The connection sidewall 140_CSW of the first gate spacer connects the inner sidewall 140_ISW2 of the first gate spacer and the outer sidewall 140_OSW of the first gate spacer to each other. The connection sidewall 140_CSW of the first gate spacer may extend in the first direction D1.

The first gate insulating film 130 may extend along the inner sidewall 140_ISW of the first gate spacer. The first gate insulating film 130 may contact the inner sidewall 140_ISW of the first gate spacer.

The first gate spacer 140 may include, for example, one or more materials, such as silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. Embodiments of the present disclosure, however, are not limited thereto. Although it is illustrated that the first gate spacer 140 is embodied as a single film, this is only for convenience of illustration and embodiments of the present disclosure are not limited thereto.

The first gate capping pattern 145 may be disposed on the first gate electrode 120 and the first gate spacer 140. An upper surface of the first gate capping pattern 145 may be coplanar with an upper surface of the first interlayer insulating film 190. Unlike what is shown, the first gate capping pattern 145 may be disposed between the first gate spacers 140.

The first gate capping pattern 145 may include, for example, one or more materials, such as silicon nitride (SiN), silicon oxynitride (SiON), silicon carbonitride (SiCN), silicon oxycarbonitride (SiOCN), and combinations thereof. The first gate capping pattern 145 may include a material having an etching selectivity with respect to the first interlayer insulating film 190.

The first source/drain pattern 150 may be disposed on the first active pattern AP1. The first source/drain pattern 150 may be disposed on the first lower pattern BP1. The first source/drain pattern 150 is connected to the first sheet pattern NS1. The first source/drain pattern 150 contacts the first sheet pattern NS1.

The first source/drain pattern 150 may be disposed on a side of the first gate structure GS1. The first source/drain pattern 150 may be disposed between the first gate structures GS1 adjacent to each other in the first direction D1. For example, the first source/drain pattern 150 may be disposed on each of both opposing sides of the first gate structure GS1. Unlike what is shown, the first source/drain pattern 150 may be disposed on one side of the first gate structure GS1, and may not be disposed on the other side of the first gate structure GS1.

The first source/drain pattern 150 may be included in a source/drain of a transistor using the first sheet pattern NS1 as a channel region thereof.

The first source/drain pattern 150 may be disposed in a first source/drain recess 150R. The first source/drain pattern 150 may be in and at least partially fill the first source/drain recess 150R.

The first source/drain recess 150R extends in the third direction D3. The first source/drain recess 150R may be defined between adjacent ones of the first gate structure GS1 adjacent to each other in the first direction D1.

A bottom surface of the first source/drain recess 150R is defined by the first lower pattern BP1. A sidewall of the first source/drain recess 150R may be defined by the first sheet pattern NS1 and the inner gate structure INT1_GS1, INT2_GS1, INT3_GS1, and INT4_GS1. The inner gate structure INT1_GS1, INT2_GS1, INT3_GS1, and INT4_GS1 may define a portion of the sidewall of the first source/drain recess 150R. In FIG. 6 to FIG. 9, the first source/drain recess 150R contains the connection sidewall 140_CSW of the first gate spacer.

Each of the inner gate structures INT1_GS1, INT2_GS1, INT3_GS1, and INT4_GS1 may include an upper surface facing the bottom surface NS1_BS of a corresponding first sheet pattern. Each of the inner gate structures INT1_GS1, INT2_GS1, INT3_GS1, and INT4_GS1 may include a bottom surface facing the upper surface NS1_US of a corresponding first sheet pattern or the upper surface BP1_US of the first lower pattern. Each of the inner gate structures INT1_GS1, INT2_GS1, INT3_GS1, and INT4_GS1 may include a side wall connecting the upper surface of each of the inner gate structures INT1_GS1, INT2_GS1, INT3_GS1, and INT4_GS1 and the bottom surface of each of the inner gate structures INT1_GS1, INT2_GS1, INT3_GS1, and INT4_GS1 to each other. The sidewall of each of the inner gate structures INT1_GS1, INT2_GS1, INT3_GS1, and INT4_GS1 may define a portion of the sidewall of the first source/drain recess 150R.

In an area between the lowest first sheet pattern NS1 and the first lower pattern BP1, a boundary between the first gate insulating film 130 and the first lower pattern BP1 may be the upper surface BP1_US of the first lower pattern. The upper surface BP1_US of the first lower pattern may be a boundary between the fourth inner gate structure INT4_GS1 and the first lower pattern BP1. A vertical level (D3 direction) of a bottom surface of the first source/drain recess 150R is lower than that of the upper surface BP1_US of the first lower pattern.

The sidewall of the first source/drain recess 150R may have a wavy shape. The first source/drain recess 150R may include a plurality of first width extension regions 150R_ER. Each of the first width extension regions 150R_ER may be defined above the upper surface BP1_US of the first lower pattern.

The first width extension region 150R_ER may be defined between adjacent ones of the first sheet patterns NS1 adjacent to each other in the third direction D3. The first width extension region 150R_ER may be defined between the first lower pattern BP1 and the first sheet pattern NS1. The first width extension region 150R_ER may extend into a space between adjacent ones of the first sheet patterns NS1 adjacent to each other in the third direction D3. The first width extension region 150R_ER may be defined between adjacent ones of the inner gate structures INT1_GS1, INT2_GS1, INT3_GS1, and INT4_GS1 adjacent to each other in the first direction D1.

As it moves away from the upper surface BP1_US of the first lower pattern, each of the first width extension regions 150R_ER may include a portion in which the width in the first direction D1 increases, and a portion in which the width in the first direction D1 decreases. For example, a width of the first width extension region in the first direction D1 may increase and then decrease in the direction away from the upper surface BP1_US of the first lower pattern.

In each of the first width extension regions 150R_ER, a point at which a width of the first width extension region 150R_ER is maximum may be positioned between the first sheet pattern NS1 and the first lower pattern BP1, or between adjacent ones of the first sheet pattern NS1 adjacent to each other in the third direction D3.

The first source/drain pattern 150 may contact the first sheet pattern NS1 and the first lower pattern BP1. The first gate insulating film 130 of each of the inner gate structures INT1_GS1, INT2_GS1, INT3_GS1, and INT4_GS1 may contact the first source/drain pattern 150. The first source/drain pattern 150 may contact the first gate spacer 140. For example, the first source/drain pattern 150 may contact the connection sidewall 140_CSW of the first gate spacer.

The first source/drain pattern 150 may include an epitaxial pattern. The first source/drain pattern 150 includes a semiconductor material. The first source/drain pattern 150 may include a semiconductor liner film 151 and a semiconductor filling film 152. Although it is illustrated that the semiconductor filling film 152 is embodied as a single film, this is only for convenience of illustration, and embodiments of the present disclosure are not limited thereto.

The semiconductor liner film 151 is disposed on the first lower pattern BP1. The semiconductor liner film 151 may extend continuously along the first source/drain recess 150R. The semiconductor liner film 151 may extend along the sidewall of the first source/drain recess 150R and the bottom surface of the first source/drain recess 150R. The semiconductor liner film 151 formed along the first source/drain recess 150R defined by the first sheet pattern NS1 is directly connected to the semiconductor liner film 151 formed along the first source/drain recess 150R defined by the inner gate structures INT1_GS1, INT2_GS1, INT3_GS1, and INT4_GS1.

The semiconductor liner film 151 is in contact with the first sheet pattern NS1, the first lower pattern BP1 and inner gate structures INT1_GS1, INT2_GS1, INT3_GS1, and INT4_GS1. The semiconductor liner film 151 is in contact with the first gate insulating film 130 of each of the inner gate structures INT1_GS1, INT2_GS1, INT3_GS1, and INT4_GS1. The semiconductor liner film 151 may be in contact with the first gate spacer 140. For example, the semiconductor liner film 151 may contact the connection sidewall 140_CSW of the first gate spacer.

The semiconductor liner film 151 may include an outer face 151_OSW and an inner face 151_ISW. The outer face 151_OSW of the semiconductor liner film is in contact with the first gate insulating film 130, the first sheet pattern NS1, the first gate spacer 140 and the first lower pattern BP1. The outer face 151_OSW of the semiconductor liner film is in contact with the sidewall of each of the inner gate structures INT1_GS1, INT2_GS1, INT3_GS1, and INT4_GS1. The outer face 151_OSW of the semiconductor liner film may conform to a profile of the first source/drain recess 150R.

The inner face 151_ISW of the semiconductor liner film may be opposite to the outer face 151_OSW of the semiconductor liner film. The inner face 151_ISW of the semiconductor liner film faces the semiconductor filling film 152. The semiconductor liner film 151 may define a liner recess 151R. For example, the liner recess 151R may be defined by the inner face 151_ISW of the semiconductor liner film.

For example, in FIG. 2 and FIG. 10, the semiconductor liner film 151 may contact the entire sidewall of the third inner gate structure INT3_GS1. Although not shown, the semiconductor liner film 151 may contact the entire sidewall of the first inner gate structure INT1_GS1, the entire sidewall of the second inner gate structure INT2_GS2 and the entire sidewall of the fourth inner gate structure INT4_GS1.

In FIG. 2 and FIG. 11, a semiconductor residual pattern SP_R may be disposed between the third inner gate structure INT3_GS1 and the semiconductor liner film 151. The semiconductor residual pattern SP_R may contact the first sheet pattern NS1. The semiconductor residual pattern SP_R may contact the outer face 151_OSW of the semiconductor liner film and the sidewall of the third inner gate structure INT3_GS1.

The semiconductor residual pattern SP_R may include, for example, silicon-germanium. When the semiconductor liner film 151 includes silicon-germanium, a fraction of germanium in the semiconductor residual pattern SP_R is greater than that in the semiconductor liner film 151. The semiconductor residual pattern SP_R may be a remainder remaining after a sacrificial pattern (SC_L of FIG. 53) has been removed.

Although not shown, the semiconductor residual pattern SP_R may be disposed between the first inner gate structure INT1_GS1 and the semiconductor liner film 151, between the second inner gate structure INT2_GS1 and the semiconductor liner film 151, or between the fourth inner gate structure INT4_GS1 and the semiconductor liner film 151.

In FIG. 2 and FIG. 12, an inner gate air gap INT AG may be disposed between the third inner gate structure INT3_GS1 and the semiconductor liner film 151. The inner gate air gap INT AG may be disposed between the semiconductor liner film 151 and the first gate insulating film 130 of the third inner gate structure INT3_GS1. The inner gate air gap INT AG may be defined between the semiconductor liner film 151, the first sheet pattern NS1, and the third inner gate structure INT3_GS1.

Although not shown, when the first gate insulating film 130 includes the interfacial film and the high dielectric constant insulating film, the interfacial film may be formed on the semiconductor liner film 151 in contact with the inner gate air gap INT AG.

Further, although not shown, the inner gate air gap INT AG may be disposed between the first inner gate structure INT1_GS1 and the semiconductor liner film 151, between the second inner gate structure INT2_GS1 and the semiconductor liner film 151, or between the fourth inner gate structure INT4_GS1 and the semiconductor liner film 151.

The semiconductor filling film 152 is disposed on the semiconductor liner film 152. The semiconductor filling film 152 is disposed in the liner recess 151R. The semiconductor filling film 152 may be in and at least partially fill the liner recess 151R.

The semiconductor filling film 152 is in contact with the semiconductor liner film 151. The semiconductor filling film 152 is in contact with the inner face 151_ISW of the semiconductor liner film.

Each of the semiconductor liner film 151 and the semiconductor filling film 152 may include silicon-germanium. Each of the semiconductor liner film 151 and the semiconductor filling film 152 may include a silicon-germanium film. Each of the semiconductor liner film 151 and the semiconductor filling film 152 may be embodied as an epitaxial semiconductor film.

Each of the semiconductor liner film 151 and the semiconductor filling film 152 may contain doped p-type impurities. For example, the p-type impurity may be boron (B). However, embodiments of the disclosure are not limited thereto. A fraction of germanium in the semiconductor filling film 152 is greater than that in the semiconductor liner film 151.

Although not shown, the first source/drain pattern 150 may further include a semiconductor capping film disposed on the semiconductor filling film 152. In one example, the semiconductor capping film may include a silicon film. In another example, the semiconductor capping film may include a silicon-germanium film. When the semiconductor capping film includes the silicon-germanium film, a fraction of germanium in the semiconductor capping film is less than that in the semiconductor filling film 152.

Referring to FIG. 2, FIG. 6 to FIG. 9, a shape of the first source/drain pattern 150 in a plan view is described below.

The semiconductor liner film 151 may cover the entire connection sidewall 140_CSW of the first gate spacer. The semiconductor liner film 151 may protrude in the first direction D1 beyond the outer sidewall 140_OSW of the first gate spacer. The inner face 151_ISW of the semiconductor liner film may protrude in the first direction D1 beyond the outer sidewall 140_OSW of the first gate spacer.

In a plan view, the semiconductor liner film 151 may include a first horizontal portion 151_HP1 and a second horizontal portion 151_HP2. The second horizontal portion 151_HP2 of the semiconductor liner film is disposed between the first horizontal portion 151_HP1 of the semiconductor liner film and the semiconductor filling film 152. For example, in FIG. 6 and FIG. 7, the first horizontal portion 151_HP1 of the semiconductor liner film is disposed between the second horizontal portion 151_HP2 of the semiconductor liner film and the first sheet pattern NS1.

The first horizontal portion 151_HP1 of the semiconductor liner film is in contact with the first sheet pattern NS1 and the inner gate structures INT1_GS1, INT2_GS1, INT3_GS1, and INT4_GS1. The first horizontal portion 151_HP1 of the semiconductor liner film may cover the entire connection sidewall 140_CSW of the first gate spacer. The entire connection sidewall 140_CSW of the first gate spacer may be in contact with the first horizontal portion 151_HP1 of the semiconductor liner film.

The second horizontal portion 151_HP2 of the semiconductor liner film may protrude in the first direction D1 beyond the outer sidewall 140_OSW of the first gate spacer. The second horizontal portion 151_HP2 of the semiconductor liner film may be on and cover at least a portion of the outer sidewall 140_OSW of the first gate spacer. A portion of the second horizontal portion 151_HP2 of the semiconductor liner film may protrude in the second direction D2 beyond the connection sidewall 140_CSW of the first gate spacer.

The first horizontal portion 151_HP1 of the semiconductor liner film is not on and does not cover the outer sidewall 140_OSW of the first gate spacer. The first horizontal portion 151_HP1 of the semiconductor liner layer and the second horizontal portion 151_HP2 of the semiconductor liner layer may be divided based on the outer wall 140_OSW of the first gate spacer.

Figure 6:
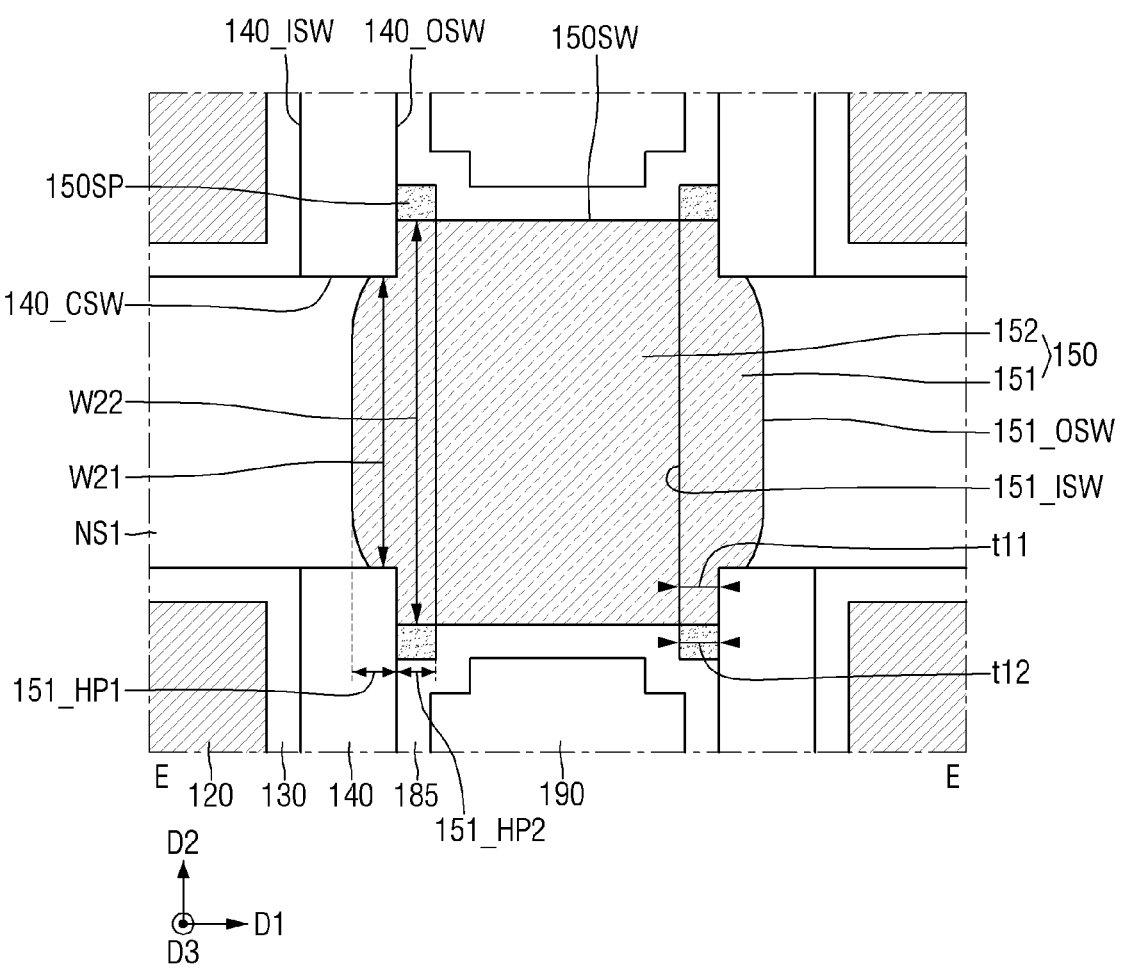
FIGS. 6 to 9 are top views taken along E-E, F-F, G-G, and H-H of FIG. 2, respectively.

In a plan view as shown in FIG. 6, a width W21 of the first horizontal portion 151_HP1 of the semiconductor liner film in the second direction D2 is smaller than a width W22 of the second horizontal portion 151_HP2 of the semiconductor liner film in the second direction D2.

In the semiconductor device according to some embodiments, in a plan view, the second horizontal portion 151_HP2 of the semiconductor liner film may be disposed between the semiconductor filling film 152 and the first gate spacer 140. For example, the semiconductor filling film 152 may not come into contact with the outer sidewall 140_OSW of the first gate spacer.

Figure 4:
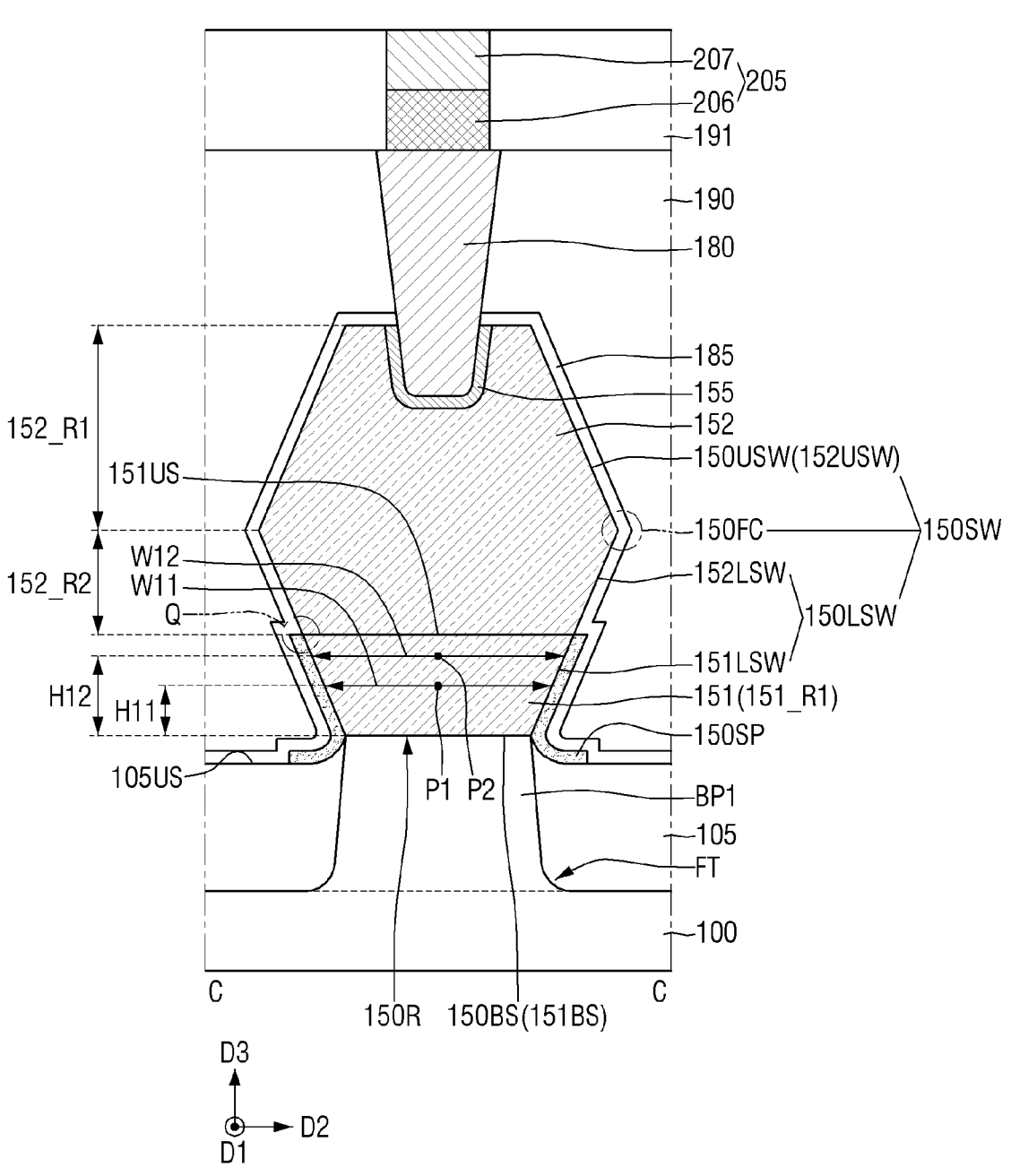
Figure 5:
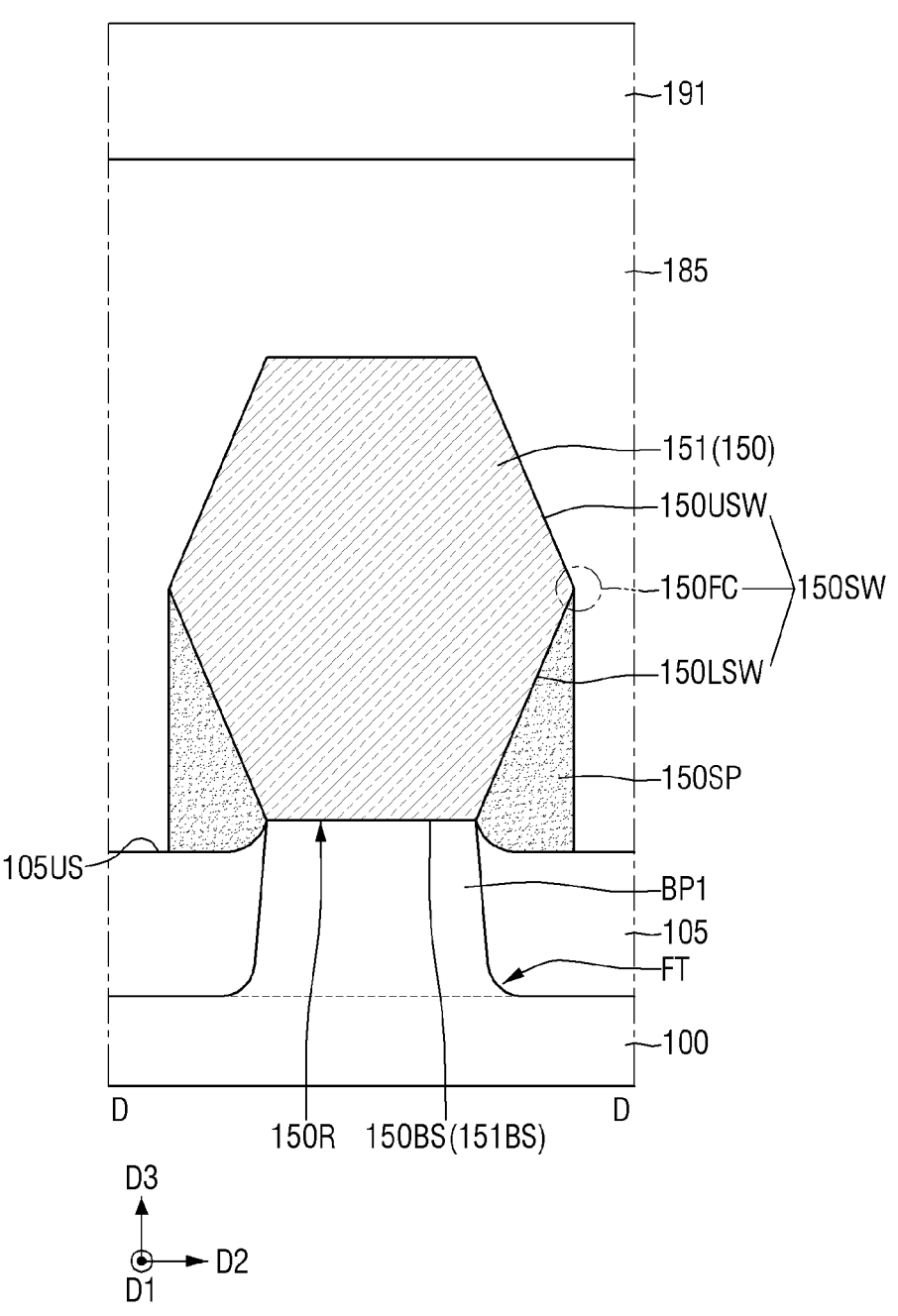

Referring to FIG. 4 and FIG. 5, a shape of the first source/drain pattern 150 in a cross-sectional view is described below.

The first source/drain pattern 150 may include a bottom surface 150BS and a sidewall 150SW.

The bottom surface 150BS of the first source/drain pattern is in contact with the first lower pattern BP1. The sidewall 150SW of the first source/drain pattern may extend from the bottom surface 150BS of the first source/drain pattern in the third direction D3. The sidewall 150SW of the first source/drain pattern is directly connected to the bottom surface 150BS of the first source/drain pattern.

In the semiconductor device according to some embodiments, the sidewall 150SW of the first source/drain pattern may include a lower inclined sidewall 150LSW, an upper inclined sidewall 150USW, and a facet intersection 150FC.

For example, the lower inclined sidewall 150LSW of the first source/drain pattern may be directly connected to the bottom face 150BS of the first source/drain pattern. The upper inclined sidewall 150USW of the first source/drain pattern is disposed on the lower inclined sidewall 150LSW of the first source/drain pattern. The facet intersection 150FC of the first source/drain pattern refers to a point where the upper inclined sidewall 150USW of the first source/drain pattern and the lower inclined sidewall 150LSW of the first source/drain pattern meet each other. The facet intersection 150FC of the first source/drain pattern may refer to a point where the upper inclined sidewall 150USW of the first source/drain pattern and the lower inclined sidewall 150LSW of the first source/drain pattern are directly connected to each other.

In a portion of the first source/drain pattern 150 including the lower inclined sidewall 150LSW of the first source/drain pattern, a width of the first source/drain pattern 150 in the second direction D2 may increase in the direction away from the first lower pattern BP1. In a portion of the first source/drain pattern 150 including the upper inclined sidewall 150USW of the first source/drain pattern, a width of the first source/drain pattern 150 in the second direction D2 may decrease in the direction away from the first lower pattern BP1. In the facet intersection 150FC of the first source/drain pattern, a width of the first source/drain pattern 150 in the second direction D2 may be maximum.

The semiconductor liner film 151 includes a bottom surface 151BS in contact with the first lower pattern BP1. The bottom surface 151BS of the semiconductor liner film is the bottom surface 150BS of the first source/drain pattern. In FIGS. 4 and 5, it is illustrated that the bottom surface 151BS of the semiconductor liner film is flat. However, embodiments of the present disclosure are not limited thereto. Unlike the illustration, the bottom surface 151BS of the semiconductor liner film may be curved.

The semiconductor liner film 151 may include a first vertical area 151_R1. In the semiconductor device according to some embodiments, the semiconductor liner film 151 may be the first vertical area 151_R1 of the semiconductor liner film. The first vertical area 151_R1 of the semiconductor liner film may include the bottom surface 151BS of the semiconductor liner film and an upper surface 151US of the semiconductor liner film.

In the first vertical area 151_R1 of the semiconductor liner film, a width of the semiconductor liner film 151 in the second direction D2 may increase in the direction away from the first lower pattern BP1. The first vertical area 151_R1 of the semiconductor liner film may include a first point P1 and a second point P2. The first point P1 of the semiconductor liner film 151 may be spaced from the first lower pattern BP1 by a first height H11. The second point P2 of the semiconductor liner film 151 may be spaced from the first lower pattern BP1 by a second height H12.

For example, the second height H12 is greater than the first height H11. A width W11 of the semiconductor liner film 151 in the second direction D2 at the first point P1 of the semiconductor liner film 151 may be less than a width W12 of the semiconductor liner film 151 in the second direction D2 at the second point P2 of the semiconductor liner film 151.

The first vertical area 151_R1 of the semiconductor liner film includes a first sub-lower sidewall 151LSW. The first sub-lower sidewall 151LSW may be a lower inclined sidewall defined by the first vertical area 151_R1 of the semiconductor liner film. The semiconductor liner film 151 includes the first sub-lower sidewall 151LSW. In the semiconductor device according to some embodiments, the first sub-lower sidewall 151LSW may be directly connected to the bottom surface 151BS of the semiconductor liner film.

The semiconductor filling film 152 is disposed on the upper surface 151US of the semiconductor liner film. The semiconductor filling film 152 may contact the upper surface 151US of the semiconductor liner film. In FIG. 4, the upper surface 151US of the semiconductor liner film as a boundary between the semiconductor liner film 151 and the semiconductor filling film 152, may be flat, in one example.

In the semiconductor device according to some embodiments, the semiconductor filling film 152 may include a first vertical area 152_R1 and a second vertical area 152_R2. The first vertical area 152_R1 of the semiconductor filling film is disposed on the second vertical area 152_R2 of the semiconductor filling film. For example, the second vertical area 152_R2 of the semiconductor filling film is disposed between the first vertical area 152_R1 of the semiconductor filling film and the first vertical area 151_R1 of the semiconductor liner film. The second vertical area 152_R2 of the semiconductor filling film may contact the upper surface 151US of the semiconductor liner film.

In the first vertical area 152_R1 of the semiconductor filling film, a width of the semiconductor filling film 152 in the second direction D2 may decrease in the direction away from the first lower pattern BP1. In the second vertical area 152_R2 of the semiconductor filling film, a width of semiconductor filling film 152 in the second direction D2 may increase in the direction away from the first lower pattern BP1.

The second vertical area 152_R2 of the semiconductor filling film includes a second sub-lower sidewall 152LSW. The second sub-lower sidewall 152LSW may be a lower inclined sidewall defined by the second vertical area 152_R2 of the semiconductor filling film. The first vertical area 152_R1 of the semiconductor filling film includes a sub-upper sidewall 152USW. The sub-upper sidewall 152USW may be an upper inclined sidewall defined by the first vertical area 152_R1 of the semiconductor filling film.

Figure 45:
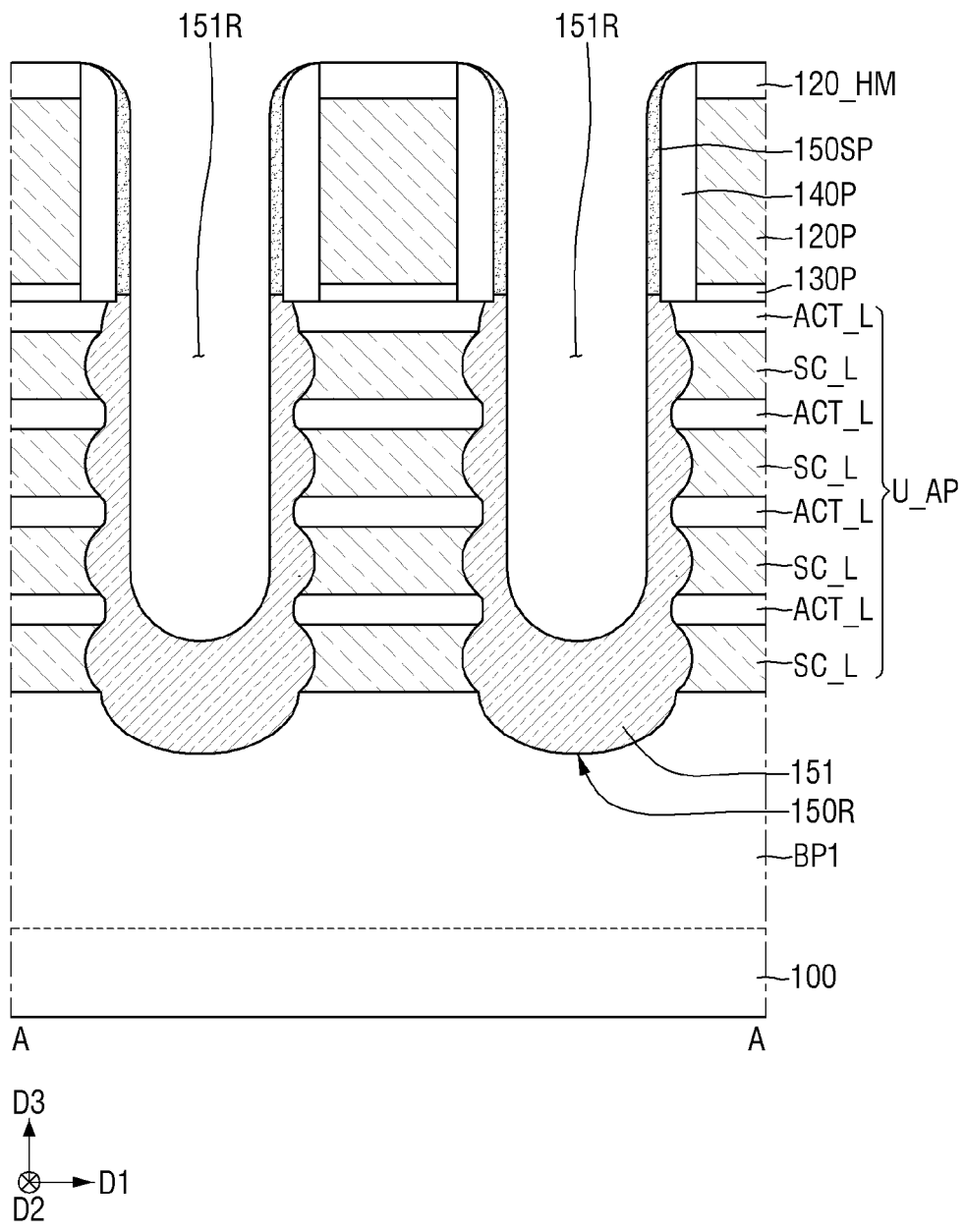
Figure 46:
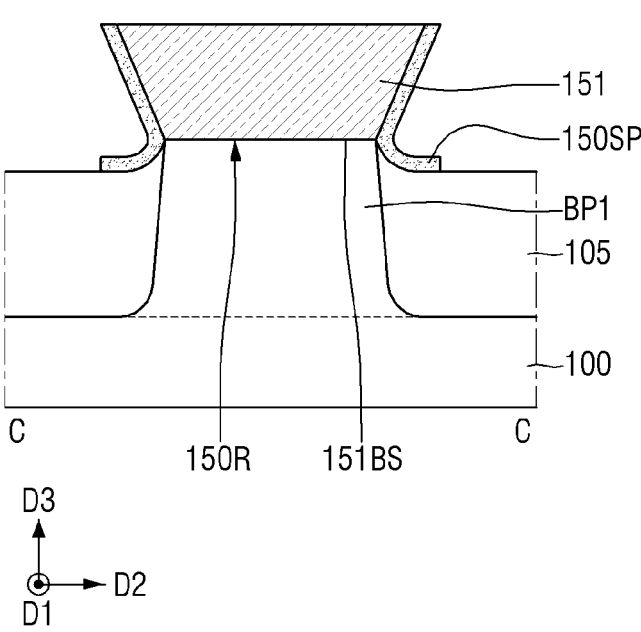
Figure 47:
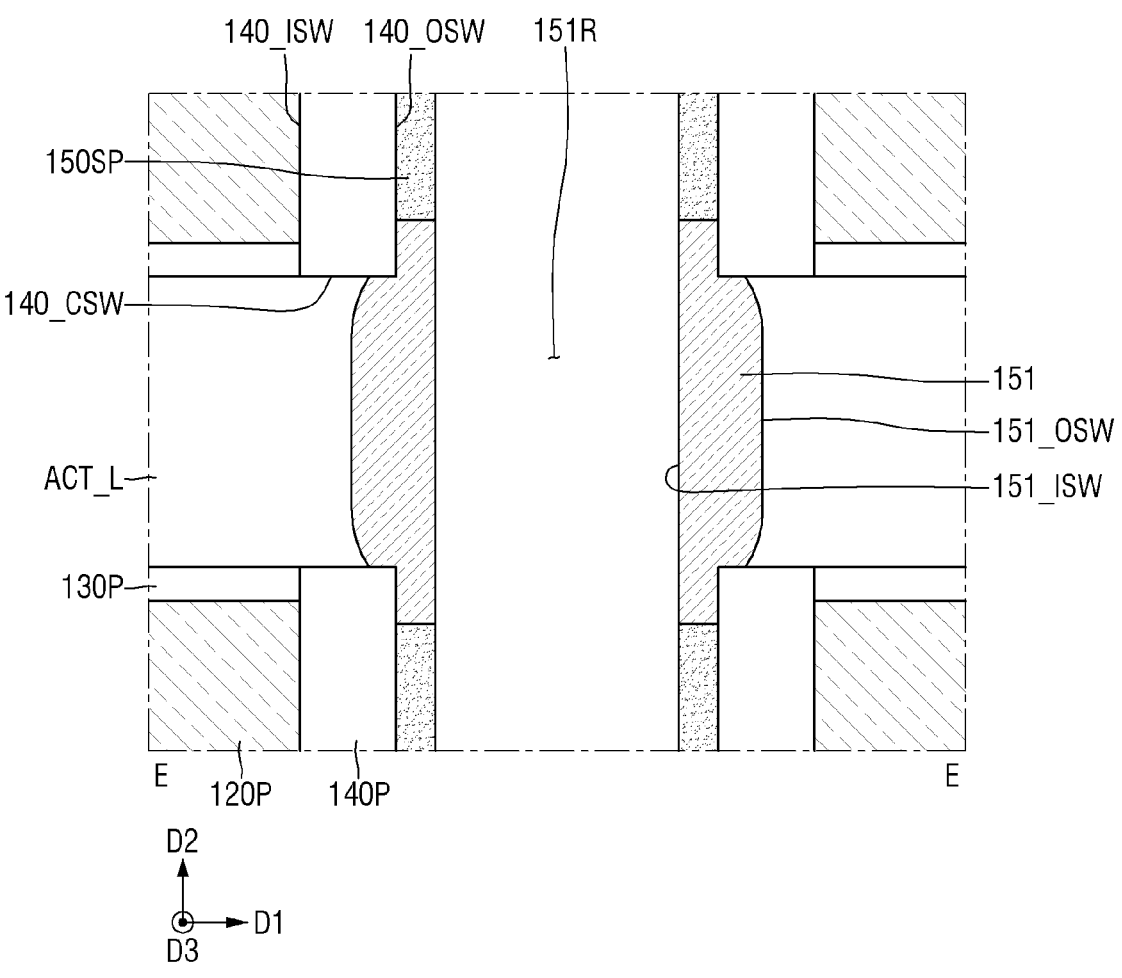

In a cross-sectional view as shown in FIG. 4, the first source/drain pattern 150 may include the semiconductor liner film 151 and the semiconductor filling film 152. In other embodiments, in the cross-sectional view shown in FIG. 5, the first source/drain pattern 150 may not include the semiconductor filling film 152. FIG. 5 may be a cross-sectional view of a portion masked with the epitaxial insulating liner (150SP of FIG. 45) during a manufacturing process.

For example, at least a portion of the lower inclined sidewall 150LSW of the first source/drain pattern may be defined by the semiconductor liner film 151. In FIG. 4, the lower inclined sidewall 150LSW of the first source/drain pattern may include the first sub-lower sidewall 151LSW and the second sub-lower sidewall 152LSW. In the semiconductor device according to some embodiments, a portion of the lower inclined sidewall 150LSW of the first source/drain pattern may be defined by the semiconductor filling film 152.

The upper inclined sidewall 150USW of the first source/drain pattern may be the sub-upper sidewall 152USW. For example, the entire upper inclined sidewall 150USW of the first source/drain pattern may be defined by the semiconductor filling film 152. In the semiconductor device according to some embodiments, the facet intersection 150FC of the first source/drain pattern may be included in the semiconductor filling film 152.

In FIG. 5, the lower inclined sidewall 150LSW of the first source/drain pattern and the upper inclined sidewall 150USW of the first source/drain pattern may be defined by semiconductor liner film 151.

Although not shown, when the first source/drain pattern 150 includes a semiconductor capping film, a portion of the sidewall 150SW of the first source/drain pattern may be defined by the semiconductor capping film.

In FIGS. 4 and 5, it is illustrated that both opposing sidewalls 150SW of the first source/drain pattern spaced apart from each other in the second direction D2 do not meet each other. However, embodiments of the present disclosure are not limited thereto. In another example, unlike the illustration, the first source/drain pattern 150 may have a shape similar to a pentagon.

The epitaxial insulating liner 150SP may be disposed on the first source/drain pattern 150 and the field insulating film 150. The epitaxial insulating liner 150SP may extend along a portion of the sidewall 150SW of the first source/drain pattern.

In the semiconductor device according to some embodiments, the epitaxial insulating liner 150SP may contact the first source/drain pattern 150. For example, the epitaxial insulating liner 150SP may contact the semiconductor liner film 151.

The epitaxial insulating liner 150SP does not extend along the upper inclined sidewall 150USW of the first source/drain pattern. The epitaxial insulating liner 150SP may extend along at least a portion of the lower inclined sidewall 150LSW of the first source/drain pattern. For example, the epitaxial insulating liner 150SP may extend along a portion of the lower inclined sidewall 150LSW of the first source/drain pattern.

The epitaxial insulating liner 150SP may extend along at least a portion of the sidewall of the semiconductor liner film 151. For example, the epitaxial insulating liner 150SP may extend along at least a portion of the sidewall 151LSW of the first vertical area 151_R1 of the semiconductor liner film.

In the semiconductor device according to some embodiments, the epitaxial insulating liner 150SP may extend along the entire first sub-lower sidewall 151LSW. The epitaxial insulating liner 150SP may extend along the entire lower inclined sidewall 150LSW of the first source/drain pattern defined by the semiconductor liner film 151.

The epitaxial insulating liner 150SP may not extend along the second sub-lower sidewall 152LSW.

In FIG. 5, the epitaxial insulating liner 150SP may extend along the entire lower inclined sidewall 150LSW of the first source/drain pattern. The epitaxial insulating liner 150SP may extend up to the facet intersection 150FC of the first source/drain pattern.

In the semiconductor device according to some embodiments, the epitaxial insulating liner 150SP may extend along the upper surface 105US of the field insulating film. For example, the epitaxial insulating liner 150SP on the upper surface 105US of the field insulating film may overlap the first source/drain pattern 150 in the third direction D3.

In FIG. 13, the upper surface 150SP_US of the epitaxial insulating liner may be flat.

In FIG. 14, the upper surface 150SP_US of the epitaxial insulating liner may be a convexly curved face. While the semiconductor liner film 151 is formed, a portion of the epitaxial insulating liner 150SP may be etched, so that the upper surface 150SP_US of the epitaxial insulating liner may be rounded.

Figure 7:
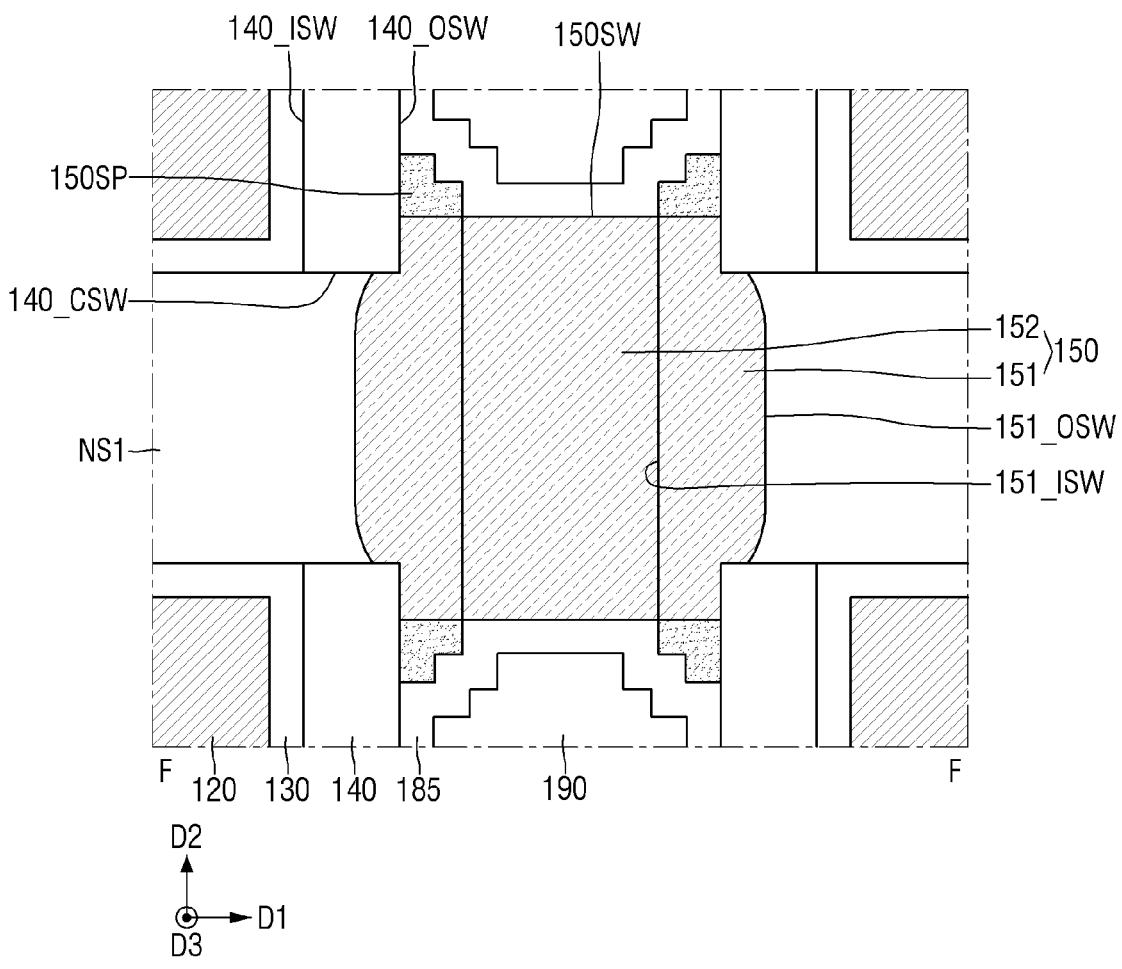
Figure 9:
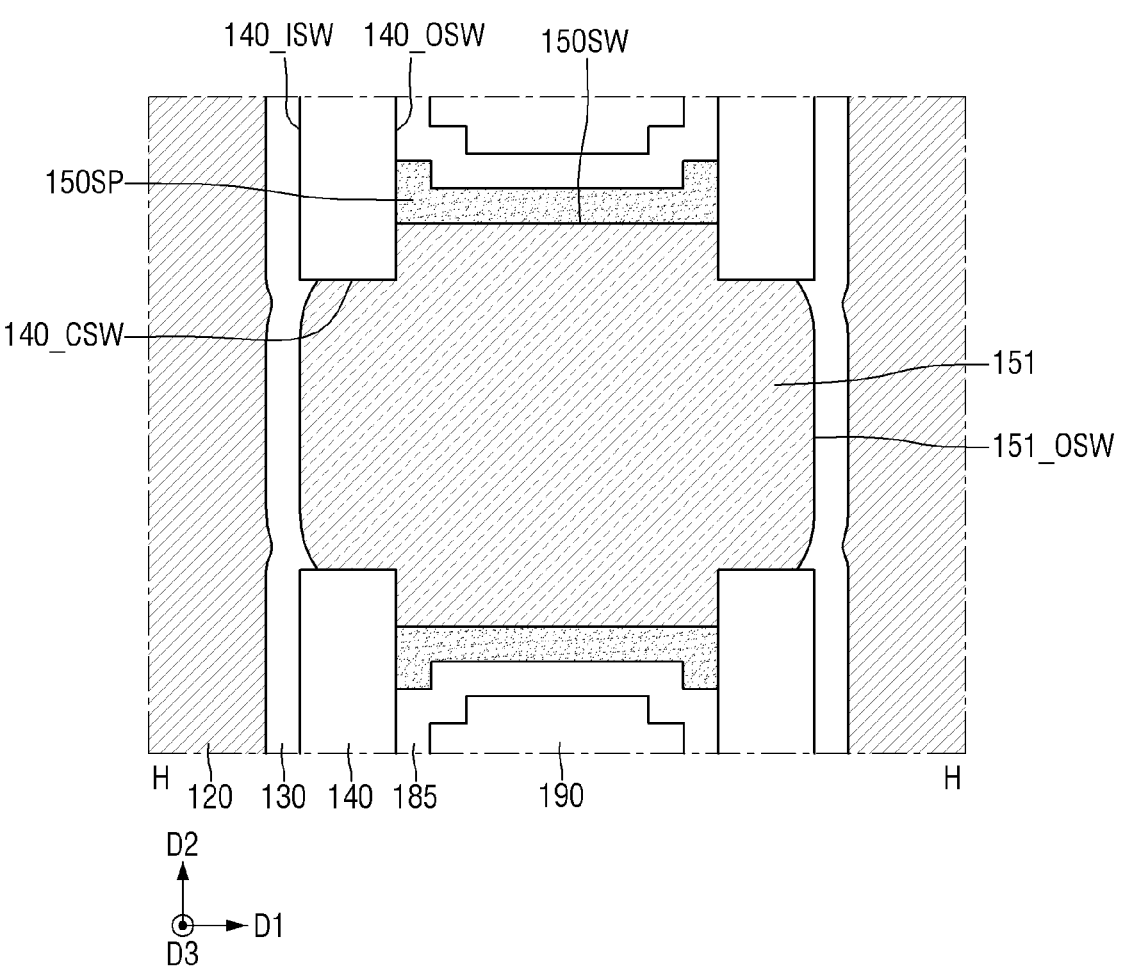

In FIG. 6, FIG. 7, and FIG. 9 as plan views cut along a line below the facet intersection 150FC in FIG. 4 and FIG. 5, the epitaxial insulating liner 150SP is disposed on the outer sidewall 140_OSW of the first gate spacer. The epitaxial insulating liner 150SP may contact the outer sidewall 140_OSW of the first gate spacer and the sidewall 150SW of the first source/drain pattern.

In FIG. 6, the epitaxial insulating liner 150SP is in contact with the second horizontal portion 151_HP2 of the semiconductor liner film. The epitaxial insulating liner 150SP may not contact the first horizontal portion 151_HP1 of the semiconductor liner film. A thickness t11 of the second horizontal portion 151_HP2 of the semiconductor liner film in the first direction D1 may be equal to a thickness t12 of the epitaxial insulating liner 150SP in the first direction D1. The epitaxial insulating liner 150SP may have a rectangular shape, in one example.

As shown in FIG. 6, in FIG. 7, a thickness in the first direction D1 of a portion of the semiconductor liner film 151 protruding beyond the outer sidewall 140_OSW of the first gate spacer may be equal to a thickness of the epitaxial insulating liner 150SP in the first direction D1. The epitaxial insulating liner 150SP may have an "L" shape.

In other embodiments, in FIG. 9, the epitaxial insulating liner 150SP extends along the entire sidewall 150SW of the first source/drain pattern extending in the first direction D1. In this case, the entire sidewall 150SW of the first source/drain pattern is defined by the semiconductor liner film 151. The epitaxial insulating liner 150SP may have a "U" shape.

In other words, in the plan views cut along a line below the facet intersection 150FC in FIGS. 4 and 5, the epitaxial insulating liner 150SP may have various shapes.

In FIG. 8 as a plan view cut along a line above the facet intersection 150FC in FIGS. 4 and 5, the epitaxial insulating liner 150SP is not disposed on the outer sidewall 140_OSW of the first gate spacer.

The epitaxial insulating liner 150SP may include an insulating material. The epitaxial insulating liner 150SP may include, for example, one or more materials, such as silicon oxide (SiO$_2$), silicon nitride (SiN), silicon oxynitride (SiON), silicon oxycarbonitride (SiOCN), silicon boronitride (SiBN), silicon oxyboronitride (SiOBN), and/or silicon oxycarbide (SiOC). It is illustrated that the epitaxial insulating liner 150SP is embodied as a single film. However, embodiments of the present disclosure are not limited thereto.

The source/drain etch stop film 185 is disposed on the first source/drain pattern 150 and the field insulating film 105. The source/drain etch stop film 185 may extend along the sidewall of the first gate structure GS1, the upper surface of the first source/drain pattern 150, the sidewall 150SW of the first source/drain pattern, and the upper surface 105US of the field insulating film.

For example, the source/drain etch stop film 185 may extend along the sidewall 151LSW of the semiconductor liner film and the sidewalls 152LSW and 152USW of the semiconductor filling film. The epitaxial insulating liner 150SP is disposed between the source/drain etch stop film 185 and the first source/drain pattern 150. The epitaxial insulating liner 150SP may be disposed between the source/drain etch stop film 185 and the field insulating film 105.

The source/drain etch stop film 185 may include a material having an etch selectivity relative to that of the first interlayer insulating film 190 to be described below. The source/drain etch stop film 185 may include, for example, one or more materials, such as silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof. Unlike the illustration, the source/drain etch stop film 185 may not be formed.

The first interlayer insulating film 190 may be disposed on the source/drain etch stop film 185. The first interlayer insulating film 190 may be disposed on the first source/drain pattern 150. The first interlayer insulating film 190 may not be on and may not cover the upper surface of the first gate capping pattern 145. For example, the upper surface of the first interlayer insulating film 190 may be coplanar with the upper surface of the first gate capping pattern 145.

The first interlayer insulating film 190 may include, for example, one or more materials, such as silicon oxide, silicon nitride, silicon oxynitride, and/or a low dielectric constant (low-k) material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or a combination thereof. Embodiments of the present disclosure are not limited thereto.

The first source/drain contact 180 is disposed on the first source/drain pattern 150. The first source/drain contact 180 is connected to the first source/drain pattern 150. The first source/drain contact 180 may extend through the first interlayer insulating film 190 and the source/drain etch stop film 185 and then be connected to the first source/drain pattern 150.

A first contact silicide layer 155 may be further disposed between the first source/drain contact 180 and the first source/drain pattern 150.

Although it is illustrated that the first source/drain contact 180 is embodied as a single film, this is only for convenience of illustration, and embodiments of the present disclosure are not limited thereto. The first source/drain contact 180 may include, for example, one or more materials, such as a metal, a metal alloy, a conductive metal nitride, a conductive metal carbide, a conductive metal oxide, a conductive metal carbonitride, and/or a two-dimensional (2D) material.

The first contact silicide layer 155 may include a metal silicide material.

A second interlayer insulating film 191 is disposed on the first interlayer insulating film 190. The second interlayer insulating film 191 may include, for example, one or more materials, such as silicon oxide, silicon nitride, silicon oxynitride, and/or a low-k material.

The wiring structure 205 is disposed in the second interlayer insulating film 191. The wiring structure 205 may be connected to the first source/drain contact 180. The wiring structure 205 may include a wiring line 207 and a wiring via 206.

Although it is illustrated that the wiring line 207 and the wiring via 206 are separated from each other, this is only for convenience of illustration, and embodiments of the present disclosure are not limited thereto. That is, in one example, the wiring via 206 may be formed, and then, the wiring line 207 may be formed. In another example, the wiring via 206 and the wiring line 207 may be formed simultaneously.

Although it is illustrated that each of the wiring line 207 and the wiring via 206 is embodied as a single layer, this is only for convenience of illustration, and embodiments of the present disclosure are not limited thereto. Each of the wiring line 207 and the wiring via 206 may include, for example, one or more materials, such as a metal, a metal alloy, a conductive metal nitride, a conductive metal carbide, a conductive metal oxide, a conductive metal carbonitride, and/or a two-dimensional (2D) material.

For example, an upper surface of a portion of the first source/drain contact 180 connected to the wiring structure 205 may be coplanar with an upper surface of a portion of the first source/drain contact 180 not connected to the wiring structure 205.

FIGS. 15 to 19 are diagrams that illustrate semiconductor devices according to some embodiments, respectively. For convenience of description, the following descriptions are based on differences thereof from those as described above with reference to FIGS. 1 to 14.

Figure 15:
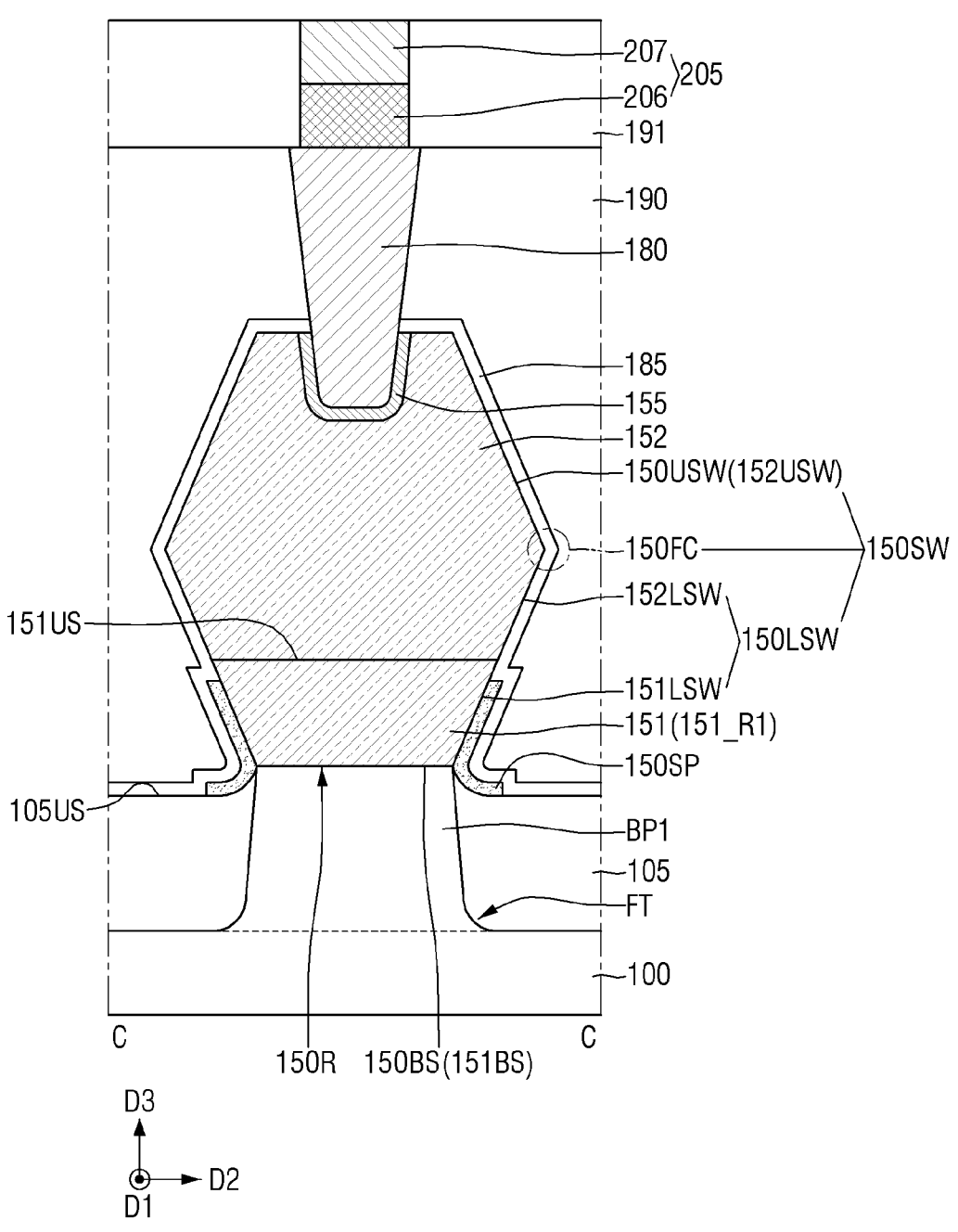
FIGS. 15 to 19 are diagrams that illustrates semiconductor devices according to some embodiments, respectively.

Referring to FIG. 15, in the semiconductor device according to some embodiments, the epitaxial insulating liner 150SP may extend along a portion of a sidewall of the first vertical area 151_R1 of the semiconductor liner film.

The epitaxial insulating liner 150SP may extend along a portion of the first sub-lower sidewall 151LSW. The epitaxial insulating liner 150SP may extend along a portion of the lower inclined sidewall 150LSW of the first source/drain pattern defined by the semiconductor liner film 151.

Figure 16:
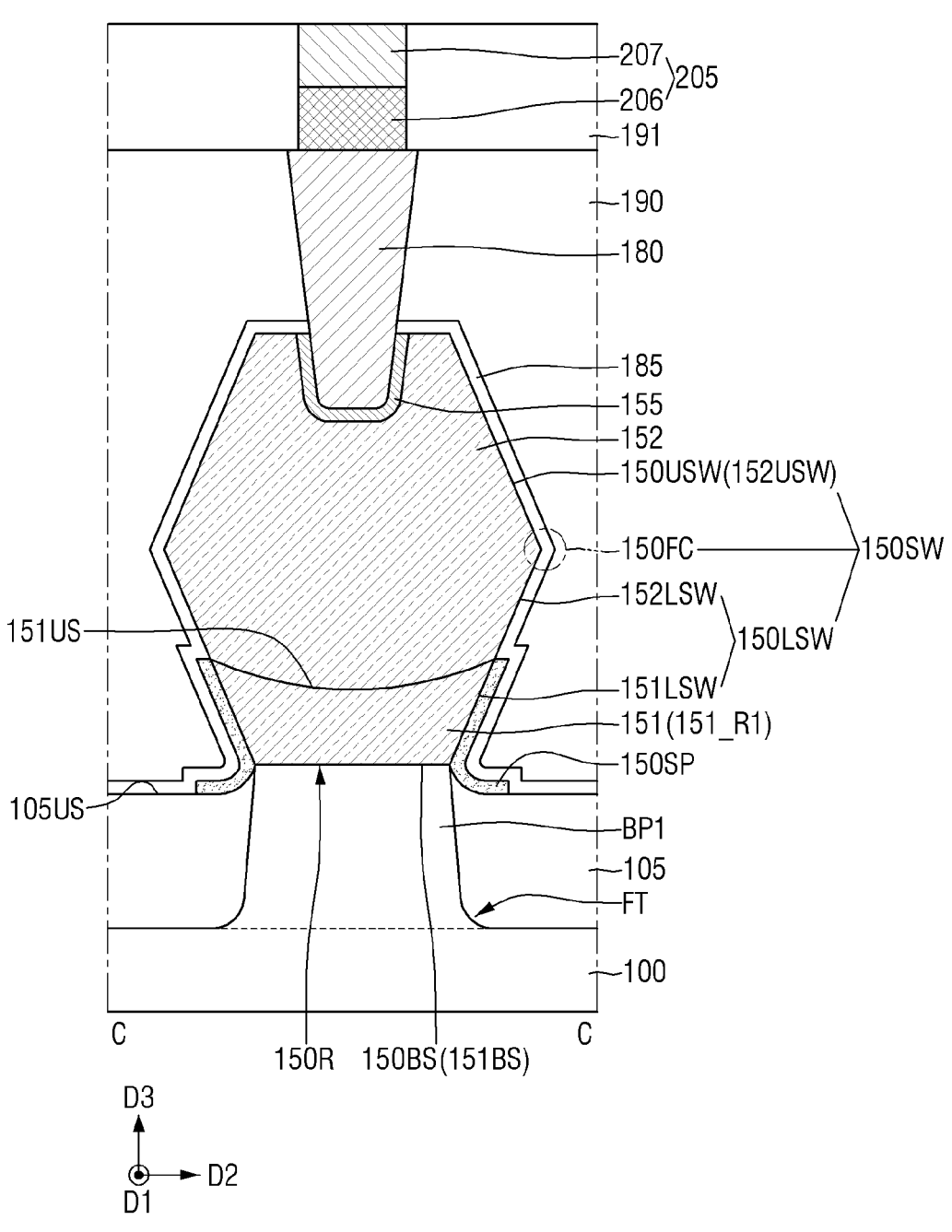
Figure 17:
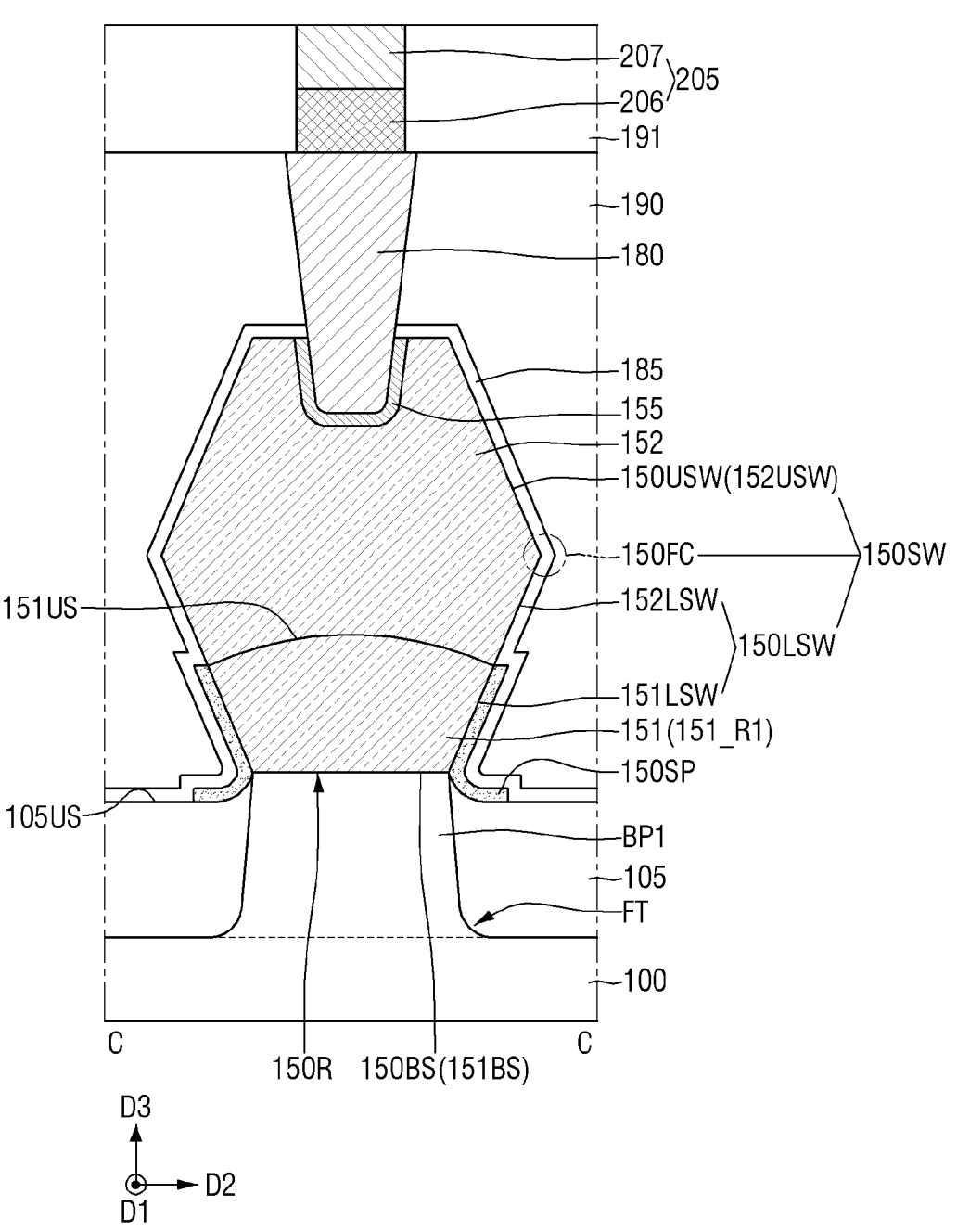

Referring to FIGS. 16 and 17, in the semiconductor device according to some embodiments, the upper surface 151US of the semiconductor liner film as a boundary between the semiconductor liner film 151 and the semiconductor filling film 152 may be curved.

In FIG. 16, the upper surface 151US of the semiconductor liner film may be a concavely curved face.

In FIG. 17, the upper surface 151US of the semiconductor liner film may be a convexly curved face.

Figure 18:
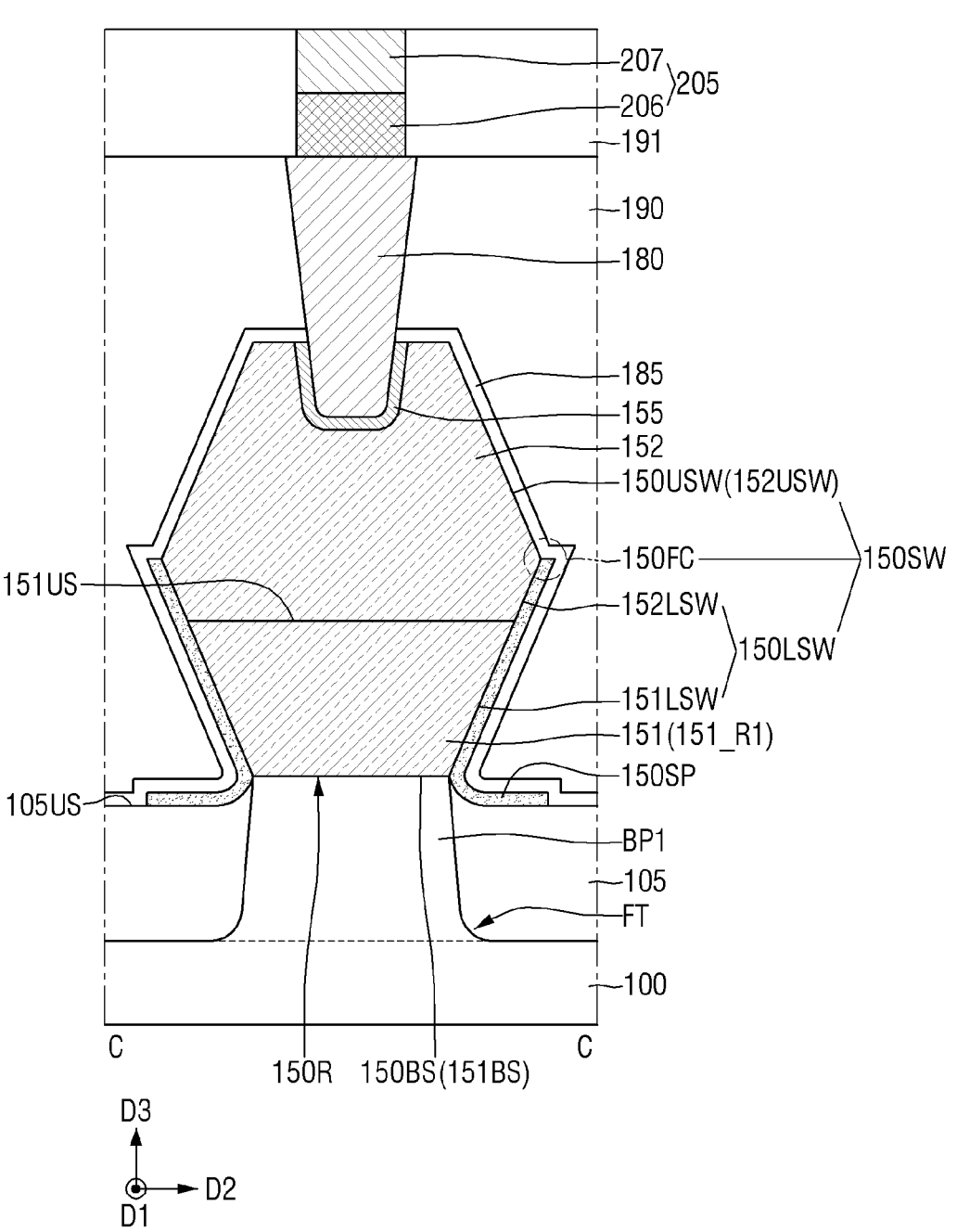

Referring to FIG. 18, in the semiconductor device according to some embodiments, the epitaxial insulating liner 150SP may extend along a portion of each of the sidewalls 152LSW and 152USW of the semiconductor filling film.

The epitaxial insulating liner 150SP may be on and cover at least a portion of the sidewall 152LSW of the second vertical area 152_R2 of the semiconductor filling film. The epitaxial insulating liner 150SP may extend along at least a portion of the second sub-lower sidewall 152LSW.

It is illustrated that the epitaxial insulating liner 150SP extends along the entire lower inclined sidewall 150LSW of the first source/drain pattern. However, embodiments of the present disclosure are not limited thereto.

Figure 19:
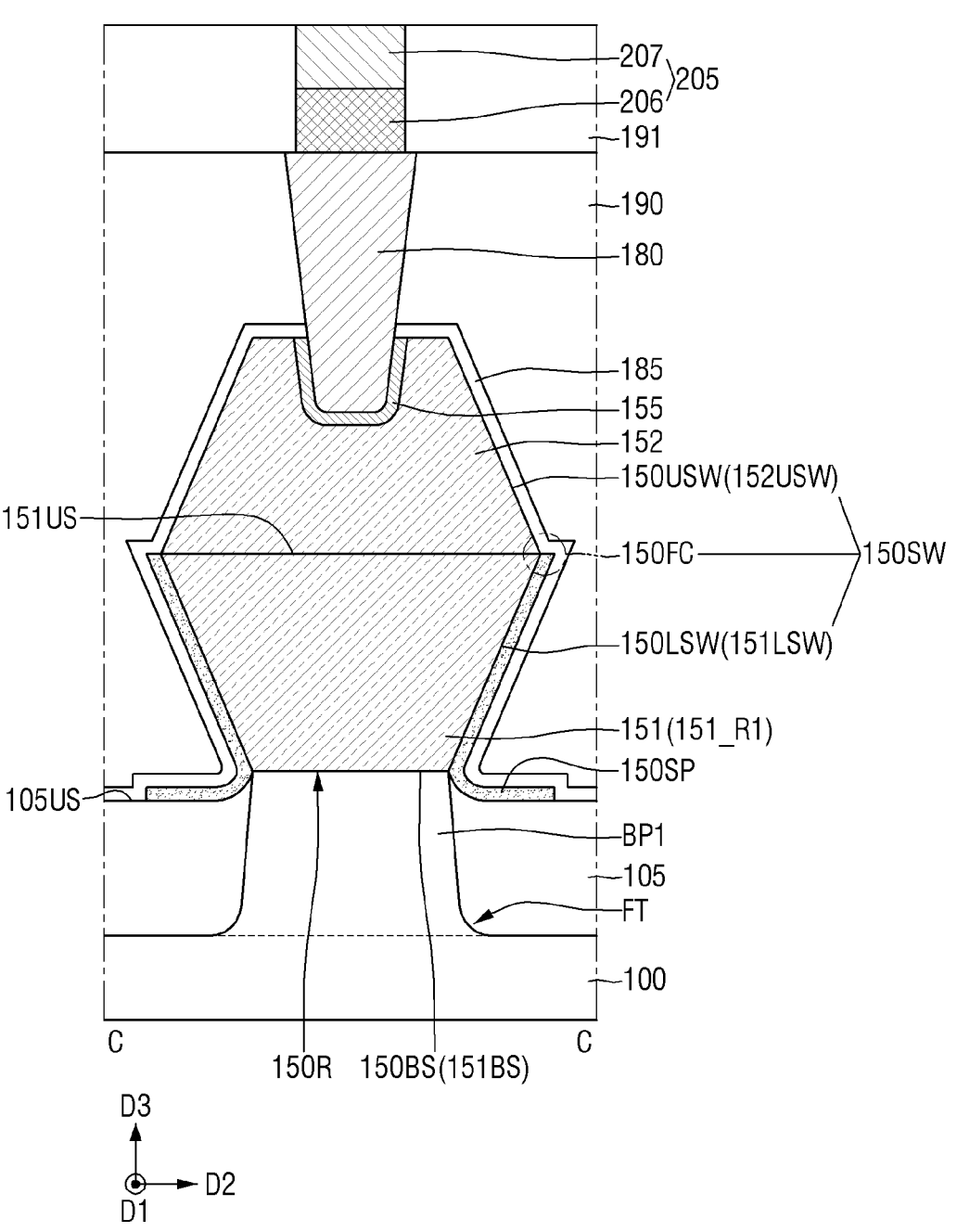

Referring to FIG. 19, in the semiconductor device according to some embodiments, the semiconductor filling film 152 includes the first vertical area 152_R1 and does not include the second vertical area (152_R2 of FIG. 4).

The first vertical area 152_R1 of the semiconductor filling film may be disposed immediately above the first vertical area 151_R1 of the semiconductor liner film. The first vertical area 152_R1 of the semiconductor filling film may contact the upper surface 151US of the semiconductor liner film.

The lower inclined sidewall 150LSW of the first source/drain pattern does not include a portion defined by the semiconductor filling film 152. The lower inclined sidewall 150LSW of the first source/drain pattern may be the sidewall 151LSW of the first vertical area 151_R1 of the semiconductor liner film.

The facet intersection 150FC of the first source/drain pattern may be included in the semiconductor liner film 151 and the semiconductor filling film 152.

Figure 20:
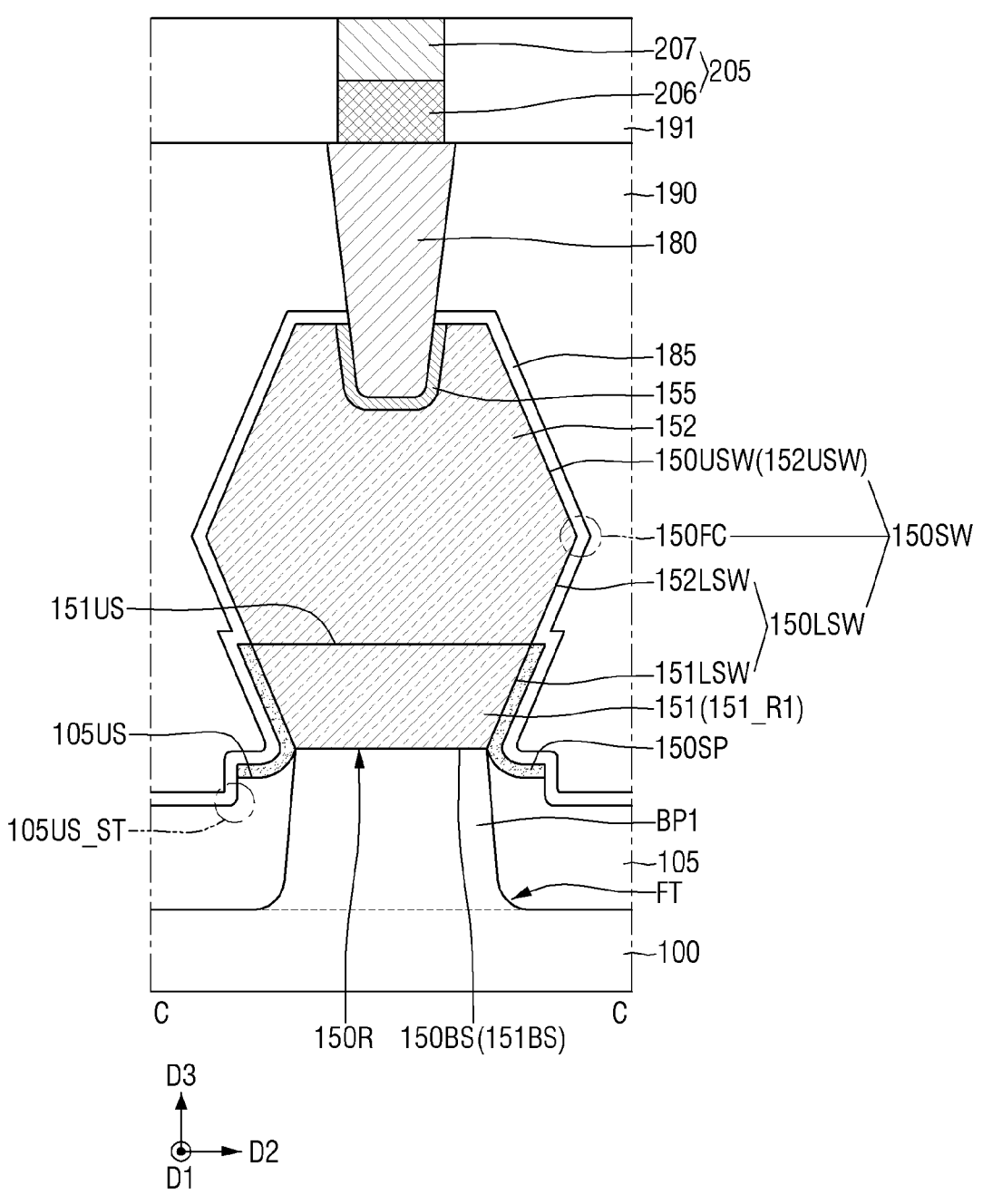
FIGS. 20 and 21 are diagrams that illustrates semiconductor devices according to some embodiments, respectively.
Figure 21:
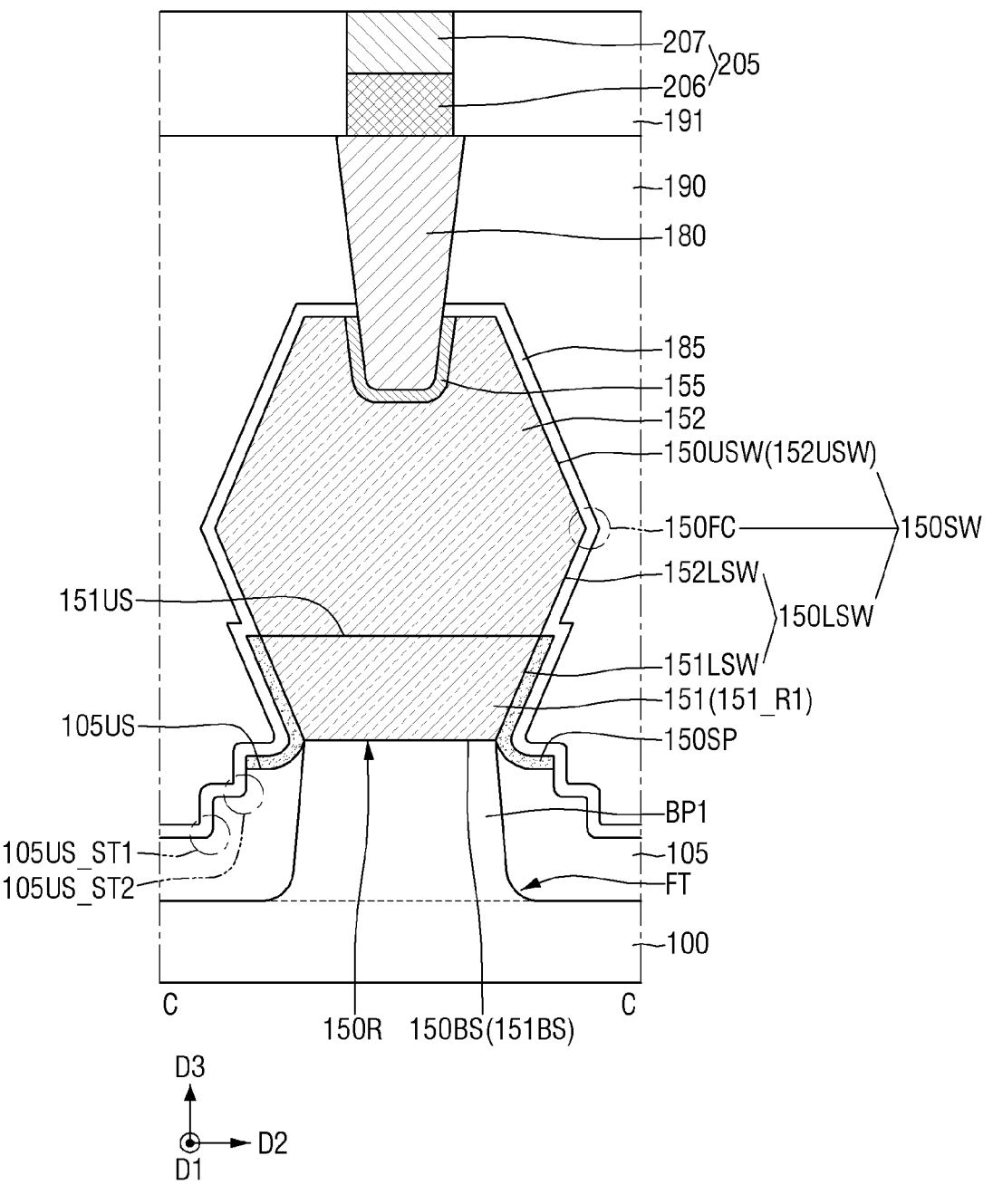

FIGS. 20 and 21 are diagrams that illustrate semiconductor devices according to some embodiments, respectively. For convenience of description, following descriptions are based on differences thereof from those as described above with reference to FIGS. 1 to 14.

Referring to FIG. 20 and FIG. 21, in the semiconductor device according to some embodiments, the upper surface 105US of the field insulating film may include at least one step area.

The epitaxial insulating liner 150SP on the sidewall 150SW of the first source/drain pattern may include an terminating end. The terminating end of the epitaxial insulating liner 150SP may include the upper surface (150SP_US in FIG. 13 and FIG. 14) of the epitaxial insulating liner 150SP.

In FIG. 20, the upper surface 105US of the field insulating film may include one step area 105US_ST.

The step area 105US_ST and the terminating end of the epitaxial insulating liner 150SP may be aligned with each other in the third direction D3. In other words, the step area 105US_ST may be located at a point displaced in the third direction D3 from the terminating end of the epitaxial insulating liner 150SP.

In FIG. 21, the upper surface 105US of the field insulating film may include a first step area 105US_ST1 and a second step area 105US_ST2.

The first step area 105US_ST1 may be located at a point displaced in the third direction D3 from the terminating end of the epitaxial insulating liner 150SP. The second step area 105US_ST2 may be located at a point displaced in the third direction D3 from the facet intersection 150FC of the first source/drain pattern.

Figure 22:
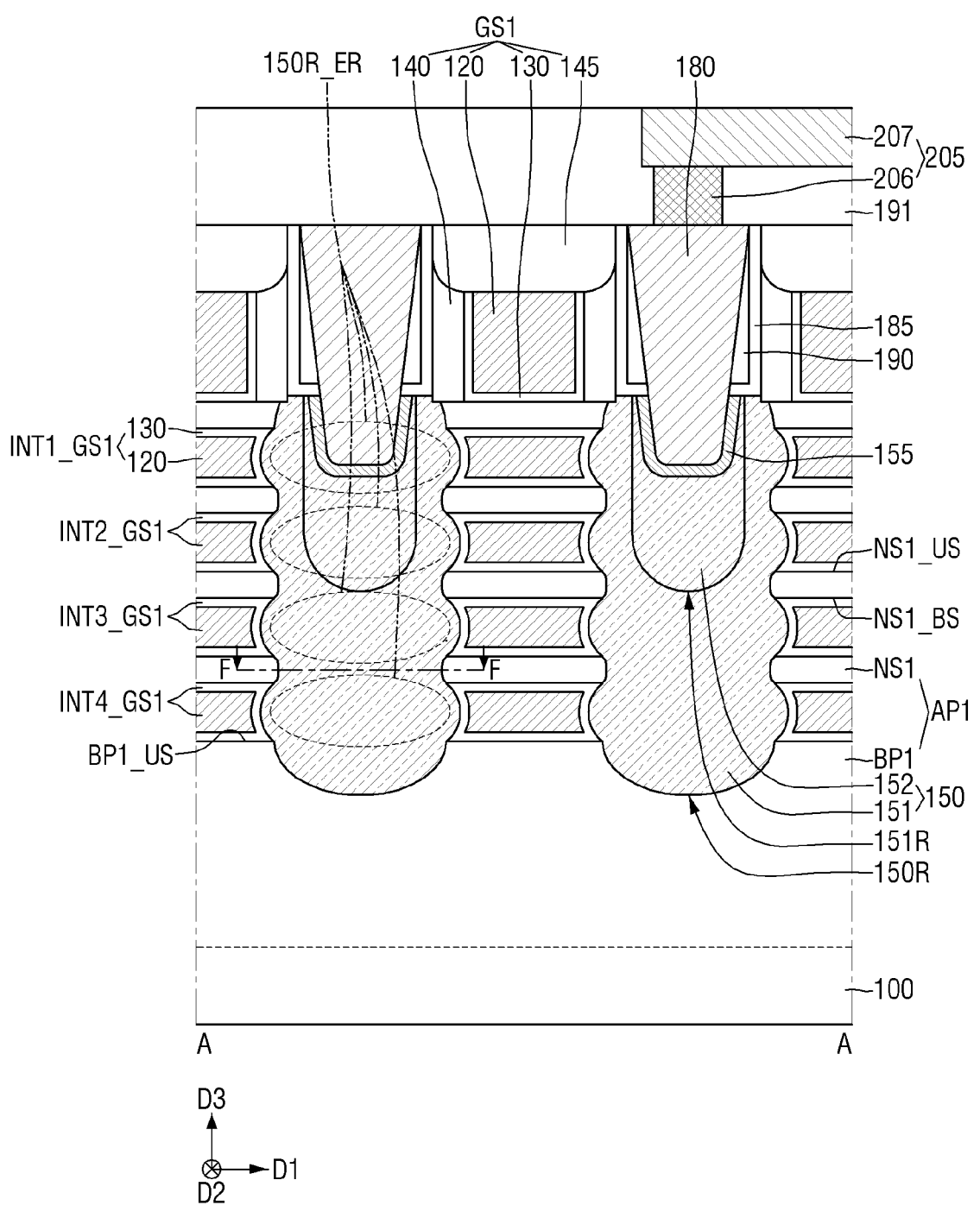
FIGS. 22 to 24 are diagrams that illustrates a semiconductor device according to some embodiments.
Figure 23:
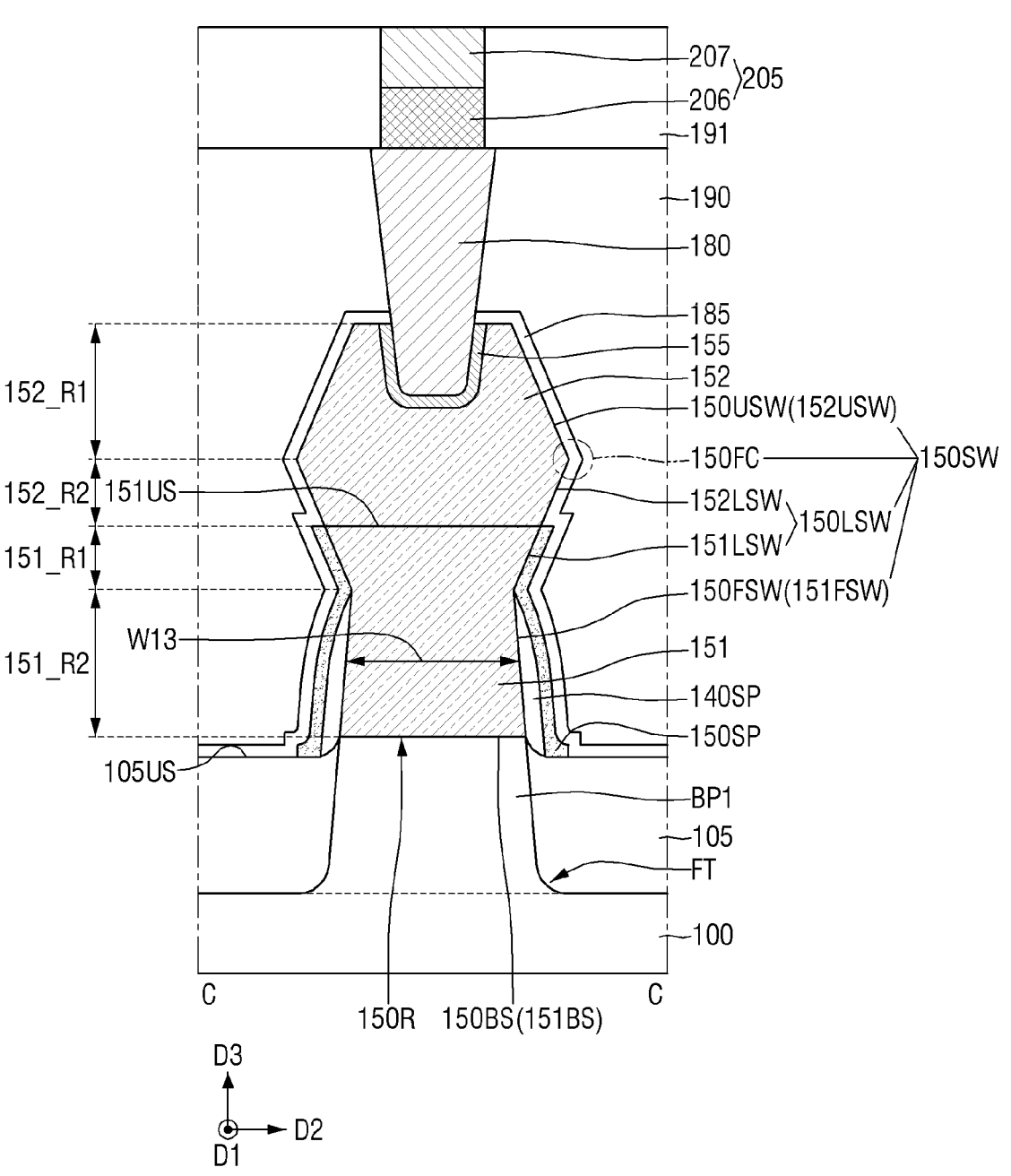
Figure 24:
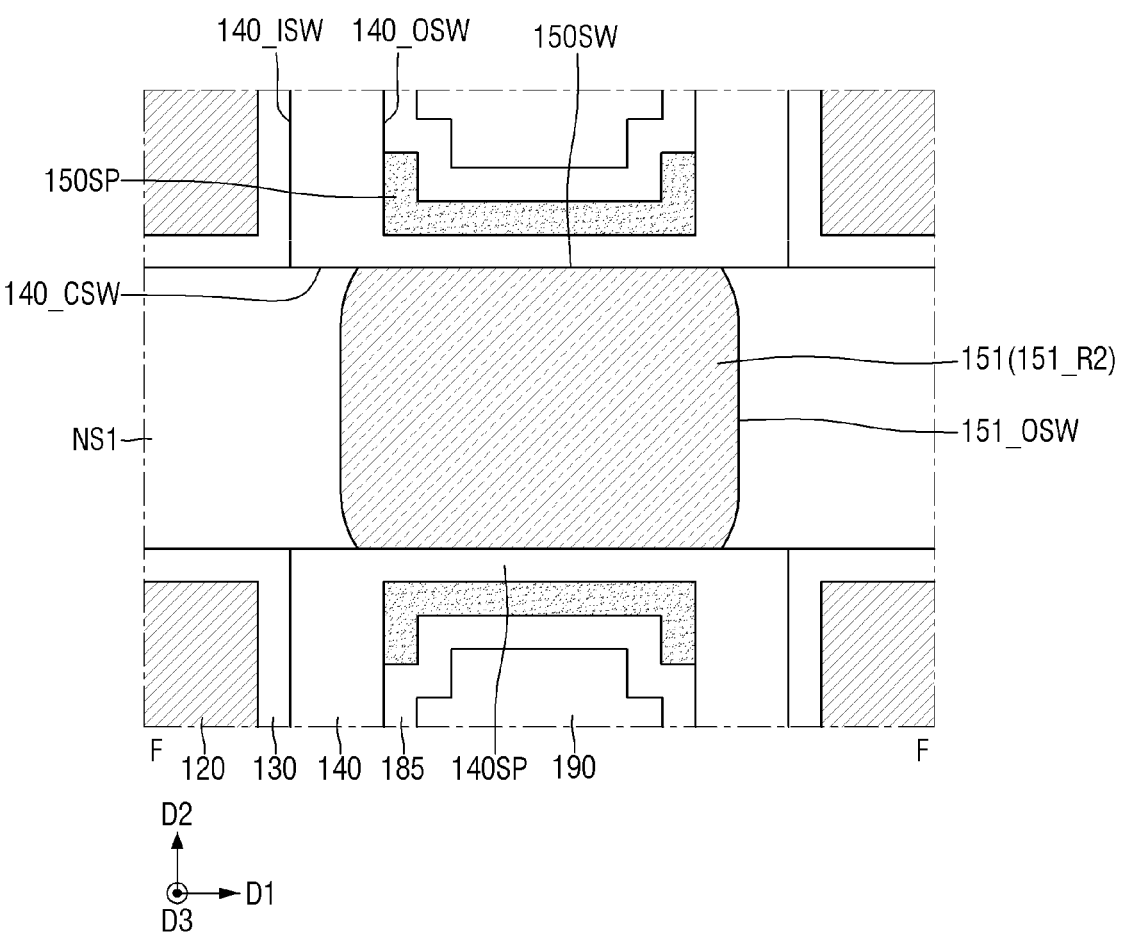

FIGS. 22 to 24 are diagrams that illustrate a semiconductor device according to some embodiments. For convenience of description, the following descriptions are based on differences thereof from those as described above with reference to FIGS. 1 to 14.

For reference, FIG. 24 is a top view taken along F-F of FIG. 22. FIG. 24 may be a plan view cut along a line below a topmost level of the fin spacer (140SP of FIG. 23). A plan view cut along a line above a topmost level of the fin spacer (140SP of FIG. 23) may be similar to FIGS. 6 to 9.

Referring to FIG. 22 to FIG. 24, the semiconductor device according to some embodiments may further include a fin spacer 140SP extending along a portion of the sidewall 150SW of the first source/drain pattern.

The sidewall 150SW of the first source/drain pattern may include a connection sidewall 150FSW, a lower inclined sidewall 150LSW, an upper inclined sidewall 150USW, and a facet intersection 150FC.

The connection sidewall 150FSW of the first source/drain pattern may be located below the lower inclined sidewall 150LSW of the first source/drain pattern. The connection sidewall 150FSW of the first source/drain pattern may be directly connected to the bottom surface 150BS of the first source/drain pattern.

For example, in a portion of the first source/drain pattern 150 including the connection sidewall 150FSW of the first source/drain pattern, a width W13 of the first source/drain pattern 150 in the second direction D2 may decrease in the direction away from the first lower pattern BP1.

The semiconductor liner film 151 may include a second vertical area 151_R2 disposed between the first vertical area 151_R1 of the semiconductor liner film and the first lower pattern BP1. The second vertical area 151_R2 of the semiconductor liner film is in contact with the first lower pattern BP1. The second vertical area 151_R2 of the semiconductor liner film includes the bottom surface 151BS of the semiconductor liner film.

The second vertical area 151_R2 of the semiconductor liner film includes a first sub-connection sidewall 151FSW. The first sub-connection sidewall 151FSW is directly connected to the bottom surface 151BS of the semiconductor liner film. The sidewall of the semiconductor liner film 151 includes the first sub-connection sidewall 151FSW and the first sub-lower sidewall 151LSW.

At least a portion of the connection sidewall 150FSW of the first source/drain pattern may be defined by the semiconductor liner film 151. For example, at least a portion of the connection sidewall 150FSW of the first source/drain pattern is defined by the second vertical area 151_R2 of the semiconductor liner film. In the semiconductor device according to some embodiments, the entire connection sidewall 150FSW of the first source/drain pattern may be defined by the semiconductor liner film 151. The connection sidewall 150FSW of the first source/drain pattern may be the first sub-connection sidewall 151FSW.

In the second vertical area 151_R2 of the semiconductor liner film, a width W13 of the semiconductor liner film 151 in the second direction D2 may decrease in the direction away from the first lower pattern BP1.

The epitaxial insulating liner 150SP may extend along the sidewall of the semiconductor liner film 151. The epitaxial insulating liner 150SP may extend along the first sub-connection sidewall 151FSW and the first sub-lower sidewall 151LSW. The epitaxial insulating liner 150SP may be disposed on the connection sidewall 150FSW of the first source/drain pattern.

The epitaxial insulating liner 150SP may contact the first vertical area 151_R1 of the semiconductor liner film, but may not contact the second vertical area 151_R2 of the semiconductor liner film. The epitaxial insulating liner 150SP may not contact the sidewall 151FSW of the second vertical area 151_R2 of the semiconductor liner film.

The fin spacer 140SP may be disposed on the sidewall 150SW of the first source/drain pattern. The fin spacer 140SP may be disposed on the upper surface 105US of the field insulating film.

The fin spacer 140SP may be disposed between the first source/drain pattern 150 and the epitaxial insulating liner 150SP. The fin spacer 140SP may extend along the connection sidewall 150FSW of the first source/drain pattern. The fin spacer 140SP may extend along the sidewall 151FSW of the second vertical area 151_R2 of the semiconductor liner film. The fin spacer 140SP may contact the entire first sub-connection sidewall 151FSW.

The fin spacer 140SP may be disposed between the semiconductor liner film 151 and the epitaxial insulating liner 150SP. For example, the fin spacer 140SP may be disposed between the second vertical area 151_R2 of the semiconductor liner film and the epitaxial insulating liner 150SP. Due to the fin spacer 140SP, the epitaxial insulating liner 150SP may not come into contact with the first sub-connection sidewall 151FSW.

In a plan view, the first gate spacer 140 may be directly connected to the fin spacer 140SP. In the manufacturing process, the first gate spacer 140 and the fin spacer 140SP may be formed simultaneously. The fin spacer 140SP includes the same material as that of the first gate spacer 140.

Figure 25:
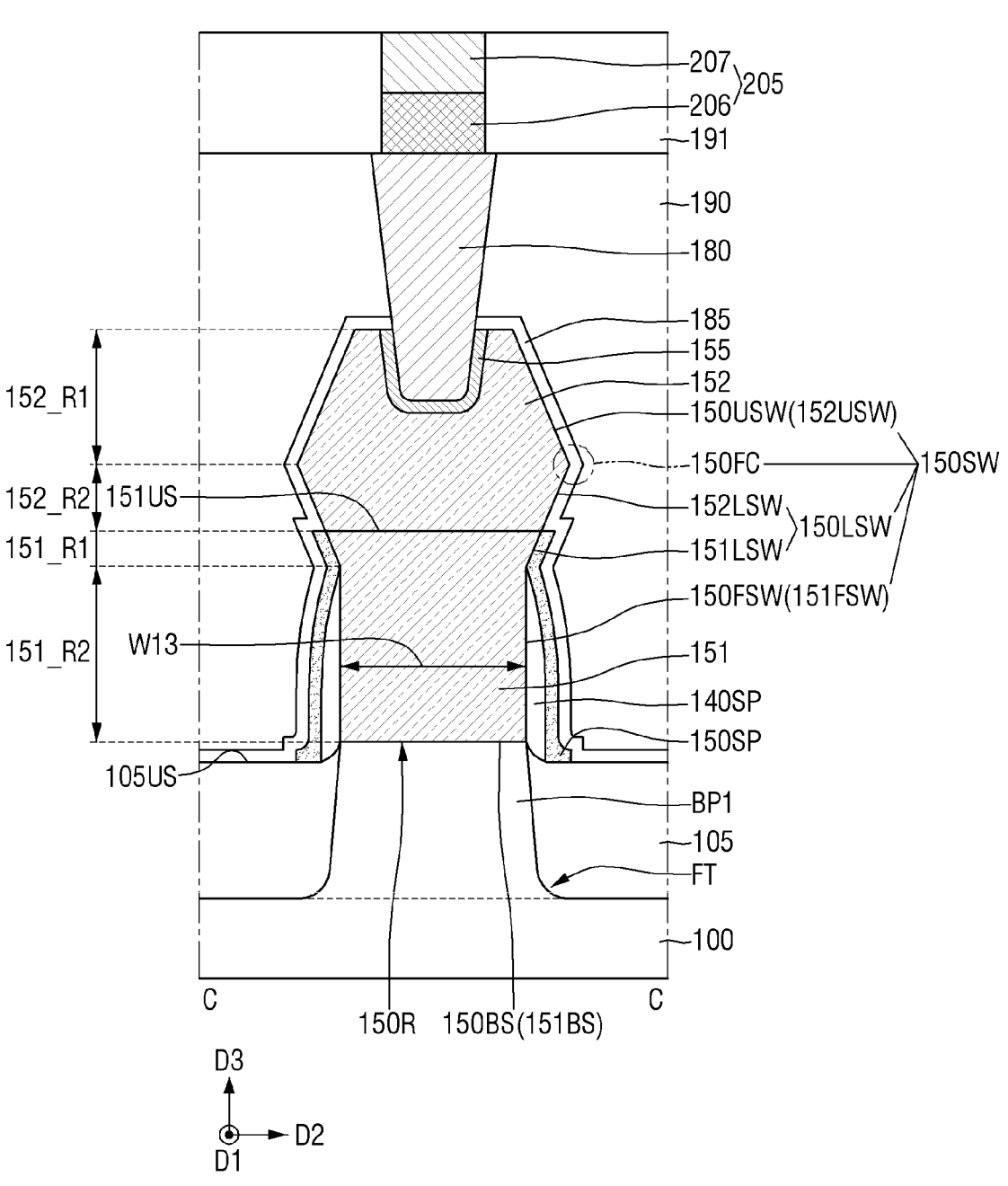
FIGS. 25 to 27 are diagrams that illustrates semiconductor devices according to some embodiments, respectively.
Figure 26:
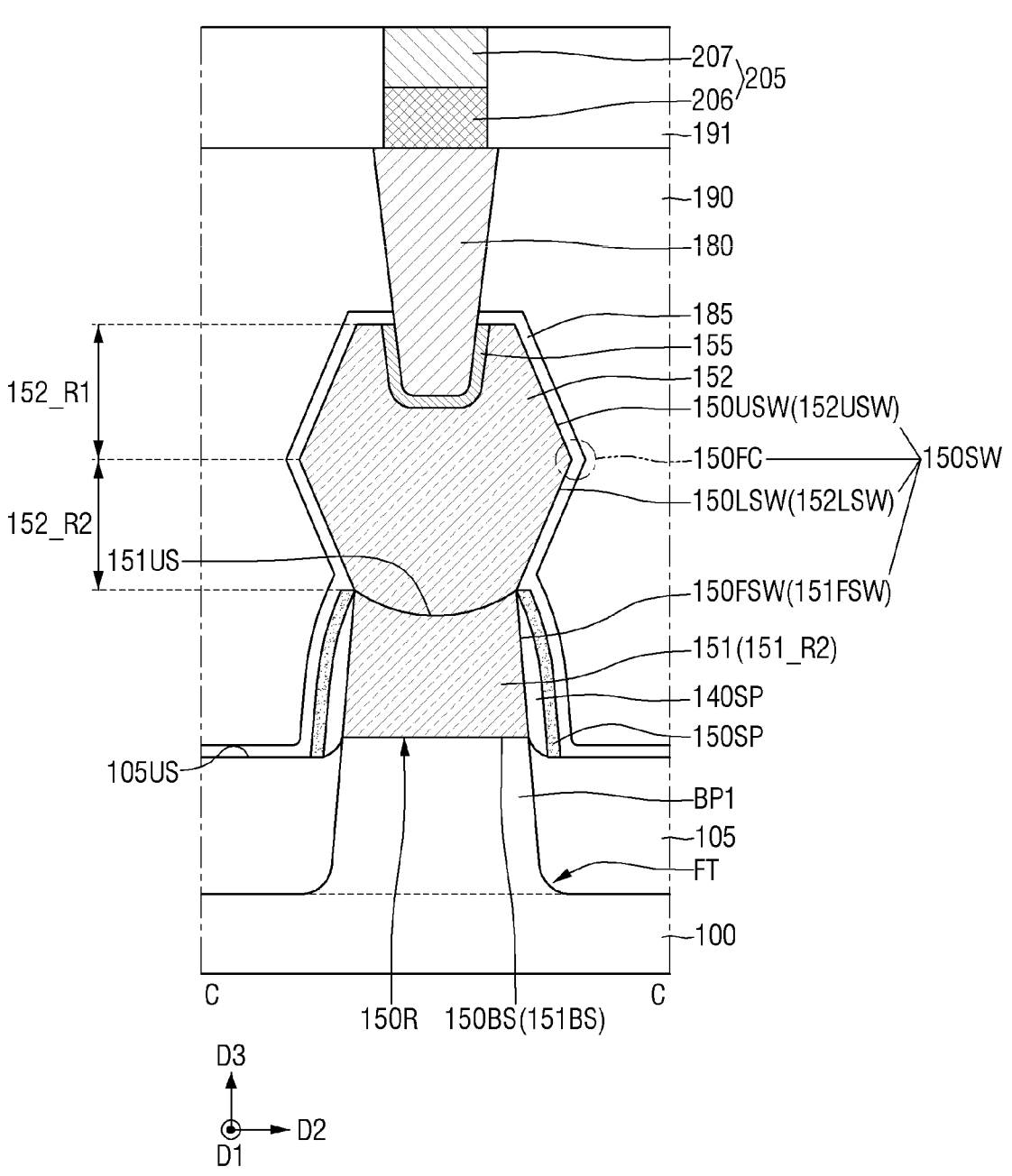
Figure 27:
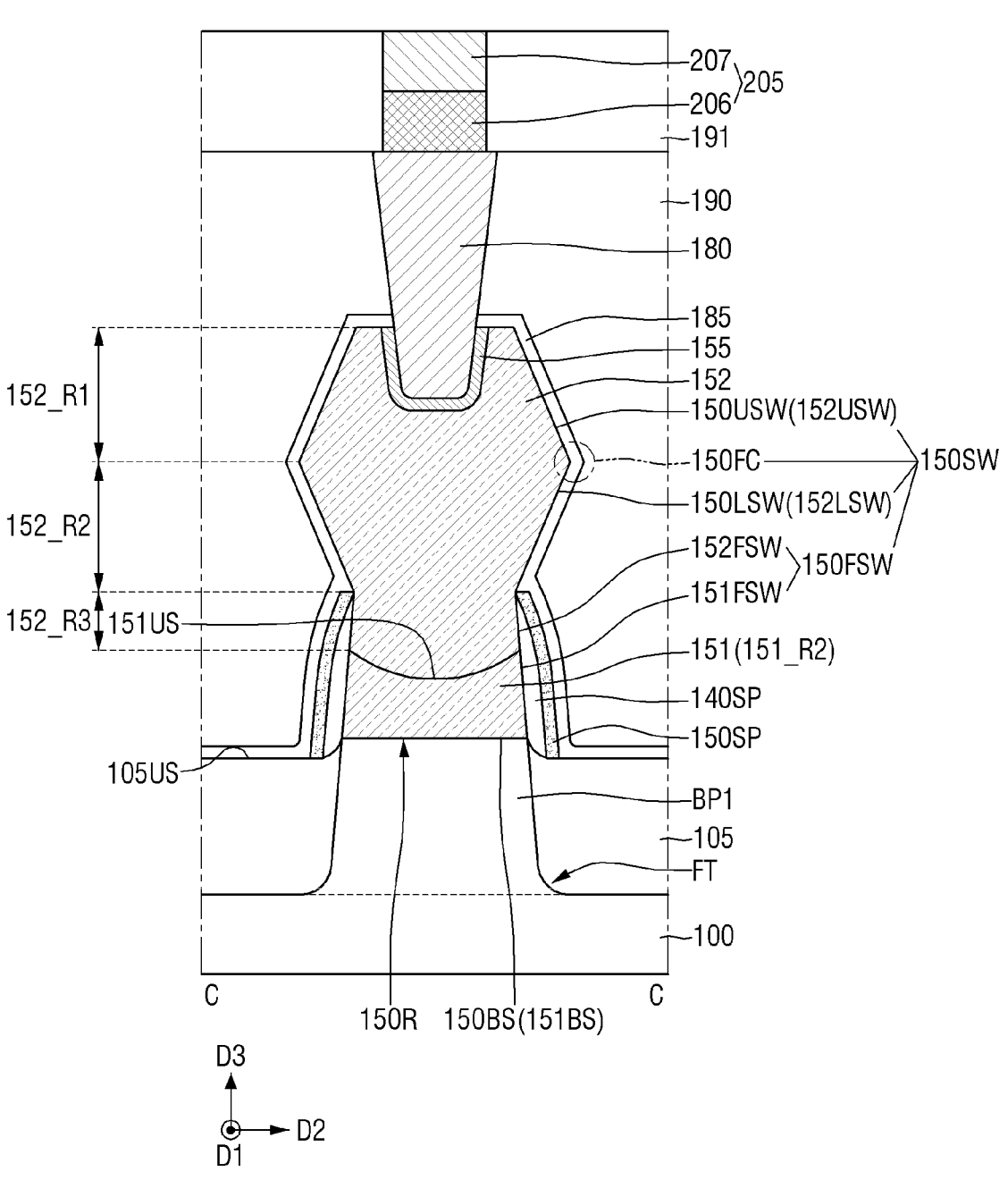

FIGS. 25 to 27 are diagrams that illustrate semiconductor devices according to some embodiments, respectively. For convenience of description, the following description is based on differences thereof from those as described above with reference to FIGS. 1 to 14 and FIG. 22 to FIG. 24.

Referring to FIG. 25, in the semiconductor device according to some embodiments, in a portion of the first source/drain pattern 150 including the connection sidewall 150FSW of the first source/drain pattern, a width W13 of the first source/drain pattern 150 in the second direction D2 may be constant in the direction away from the first lower pattern BP1.

In the second vertical area 151_R2 of the semiconductor liner film, a width W13 of the semiconductor liner film 151 in the second direction D2 may be constant in the direction away from the first lower pattern BP1.

Referring to FIG. 26 and FIG. 27, in the semiconductor device according to some embodiments, the semiconductor liner film 151 does not include the first vertical area (151_R1 in FIG. 23) of the semiconductor liner film.

The second vertical area 151_R2 of the semiconductor liner film is in contact with the semiconductor filling film 152. The second vertical area 151_R2 of the semiconductor liner film includes the upper surface 151US of the semiconductor liner film. For example, the upper surface 151US of the semiconductor liner film may be a concavely curved face.

The lower inclined sidewall 150LSW of the first source/drain pattern includes the second sub-lower sidewall 152LSW defined by the semiconductor filling film 152. The lower inclined sidewall 150LSW of the first source/drain pattern does not include a sidewall defined by the semiconductor liner film 151.

In FIG. 26, the fin spacer 140SP does not extend along the sidewalls 152LSW and 152USW of the semiconductor filling film 152.

In FIG. 27, the semiconductor filling film 152 may further include a third vertical area 152_R3. The third vertical area 152_R3 of the semiconductor filling film is disposed between the second vertical area 152_R2 of the semiconductor filling film 152 and the semiconductor liner film 151.

The third vertical area 152_R3 of the semiconductor filling film includes a second sub-connection sidewall 152FSW. The connection sidewall 150FSW of the first source/drain pattern includes the first sub-connection sidewall 151FSW and the second sub-connection sidewall 152FSW. The fin spacer 140SP is in contact with the second sub-connection sidewall 152FSW.

Figure 28:
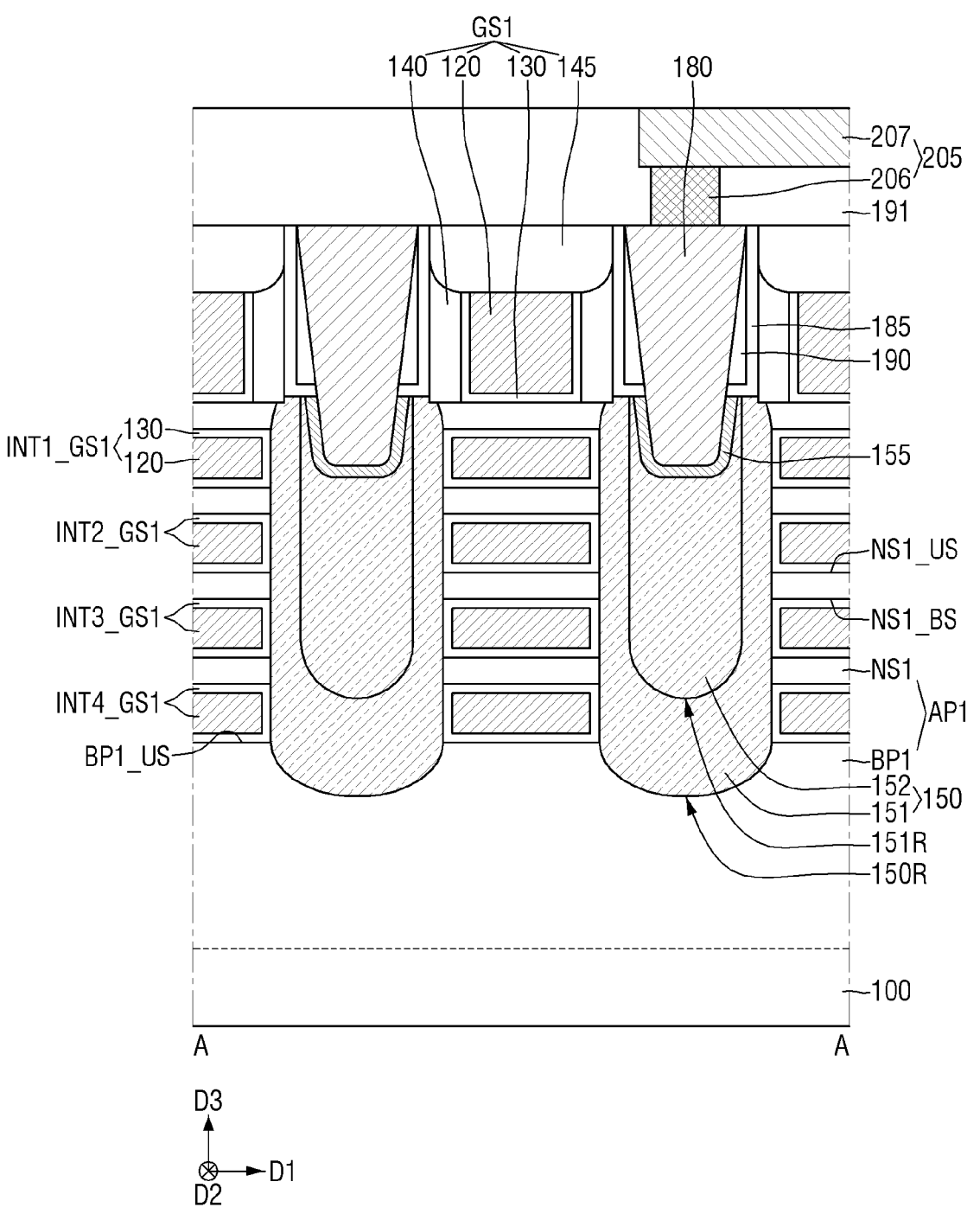
FIGS. 28 to 30 are diagrams that illustrates semiconductor devices according to some embodiments, respectively.
Figure 29:
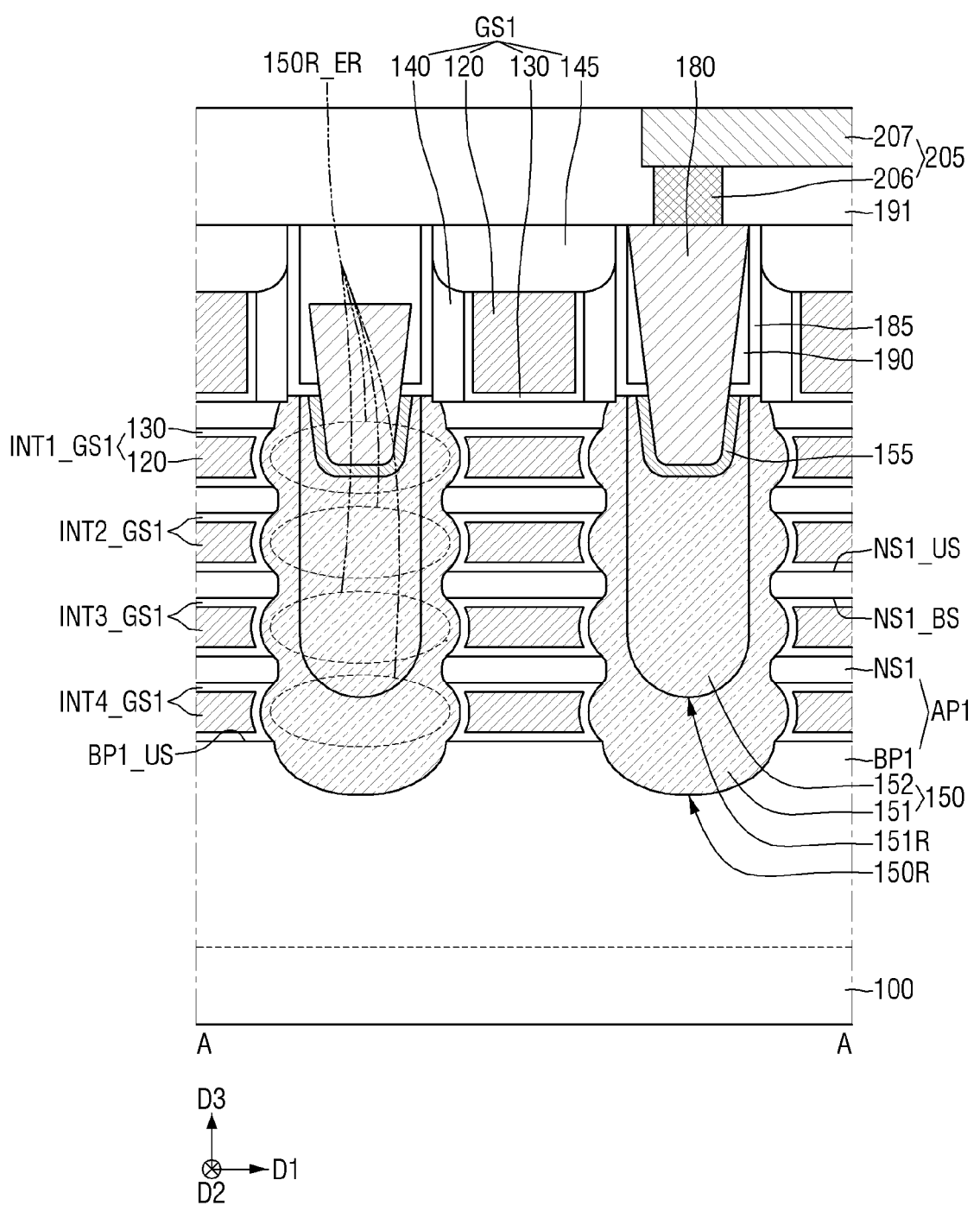
Figure 30:
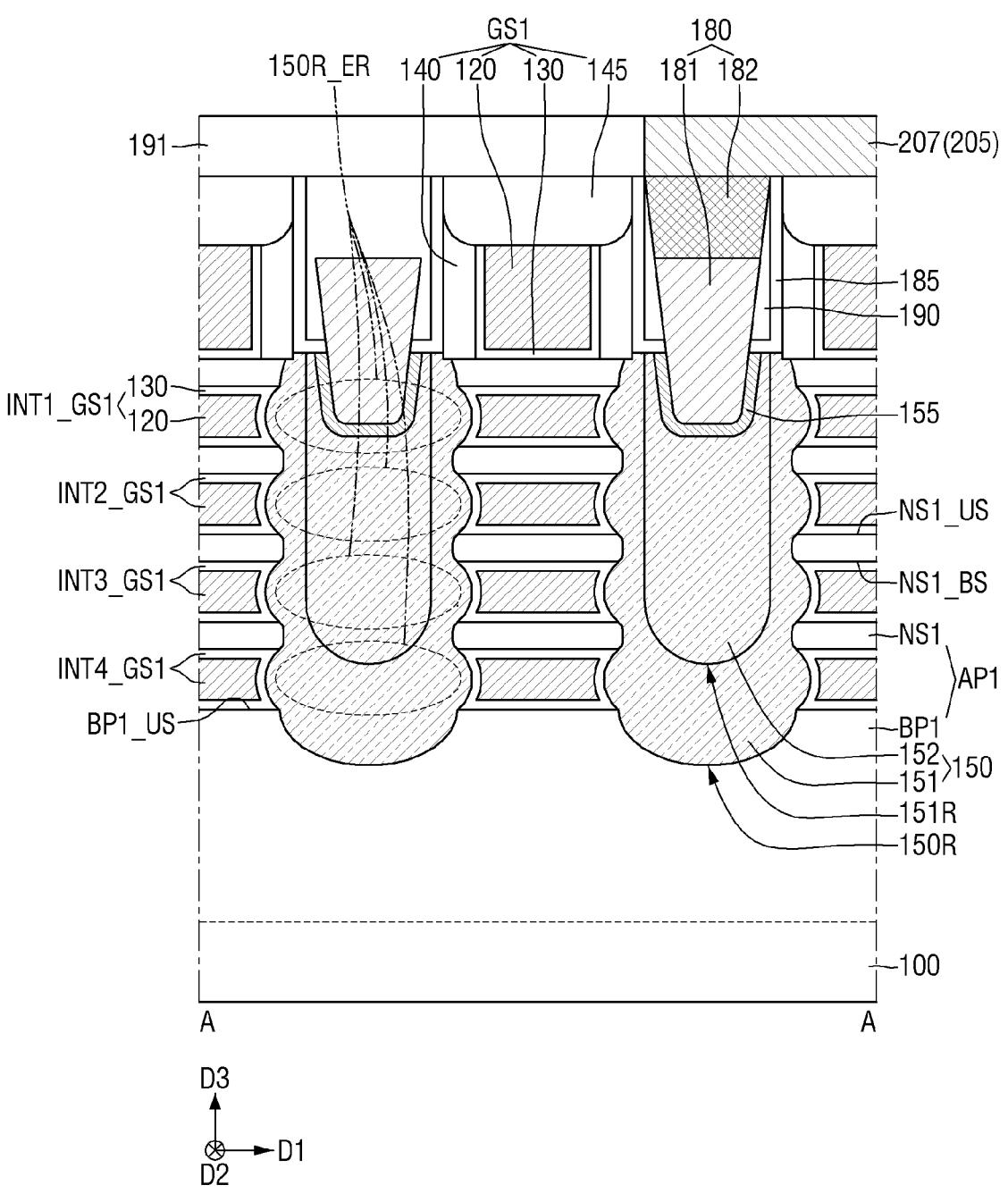

FIGS. 28 to 30 are diagrams that illustrate semiconductor devices according to some embodiments, respectively. For convenience of description, the following descriptions are based on differences thereof from those as described above with reference to FIGS. 1 to 14.

Referring to FIG. 28, in the semiconductor device according to some embodiments, the first source/drain recess 150R does not include the plurality of width extension regions (150R_ER of FIG. 2).

The sidewall of the first source/drain recess 150R does not have a wavy shape. A width of a top portion of the sidewall of the first source/drain recess 150R in the first direction D1 may decrease in the direction away from the first lower pattern BP1.

Referring to FIG. 29, in the semiconductor device according to some embodiments, a vertical level of an upper surface of a portion of the first source/drain contact 180 not connected to the wiring structure 205 is lower than that of the upper surface of the first gate capping pattern 145.

A vertical level of an upper surface of a portion of the first source/drain contact 180 not connected to the wiring structure 205 is lower than that of an upper surface of a portion of the first source/drain contact 180 connected to the wiring structure 205.

Referring to FIG. 30, in the semiconductor device according to some embodiments, the first source/drain contact 180 includes a lower source/drain contact 181 and an upper source/drain contact 182.

The upper source/drain contact 182 may be disposed at a portion connected to the wiring structure 205. The upper source/drain contact 182 is not disposed in a portion not connected to the wiring structure 205.

The wiring line 207 may be connected to the first source/drain contact 180 without the wiring via (206 in FIG. 2). The wiring structure 205 may not include the wiring via (206 in FIG. 2).

Although it is illustrated that each of the lower source/drain contact 181 and the upper source/drain contact 182 is embodied as a single film, this is only for convenience of illustration, and embodiments of the present disclosure are not limited thereto. Each of the lower source/drain contact 181 and the upper source/drain contact 182 may include, for example, one or more materials, such as a metal, a metal alloy, a conductive metal nitride, a conductive metal carbide, a conductive metal oxide, a conductive metal carbonitride, and/or a two-dimensional (2D) material.

Figure 31:
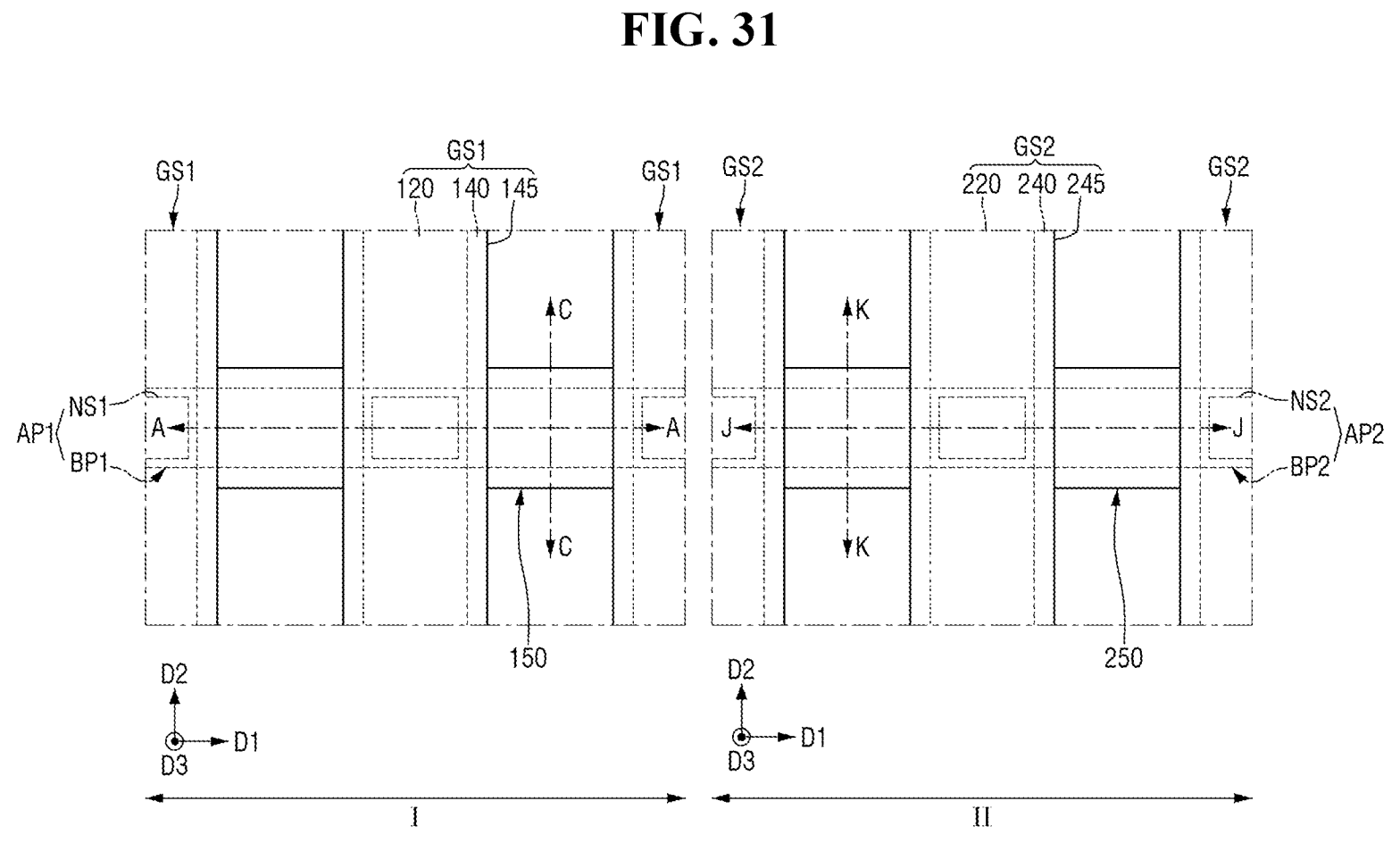
Figure 32:
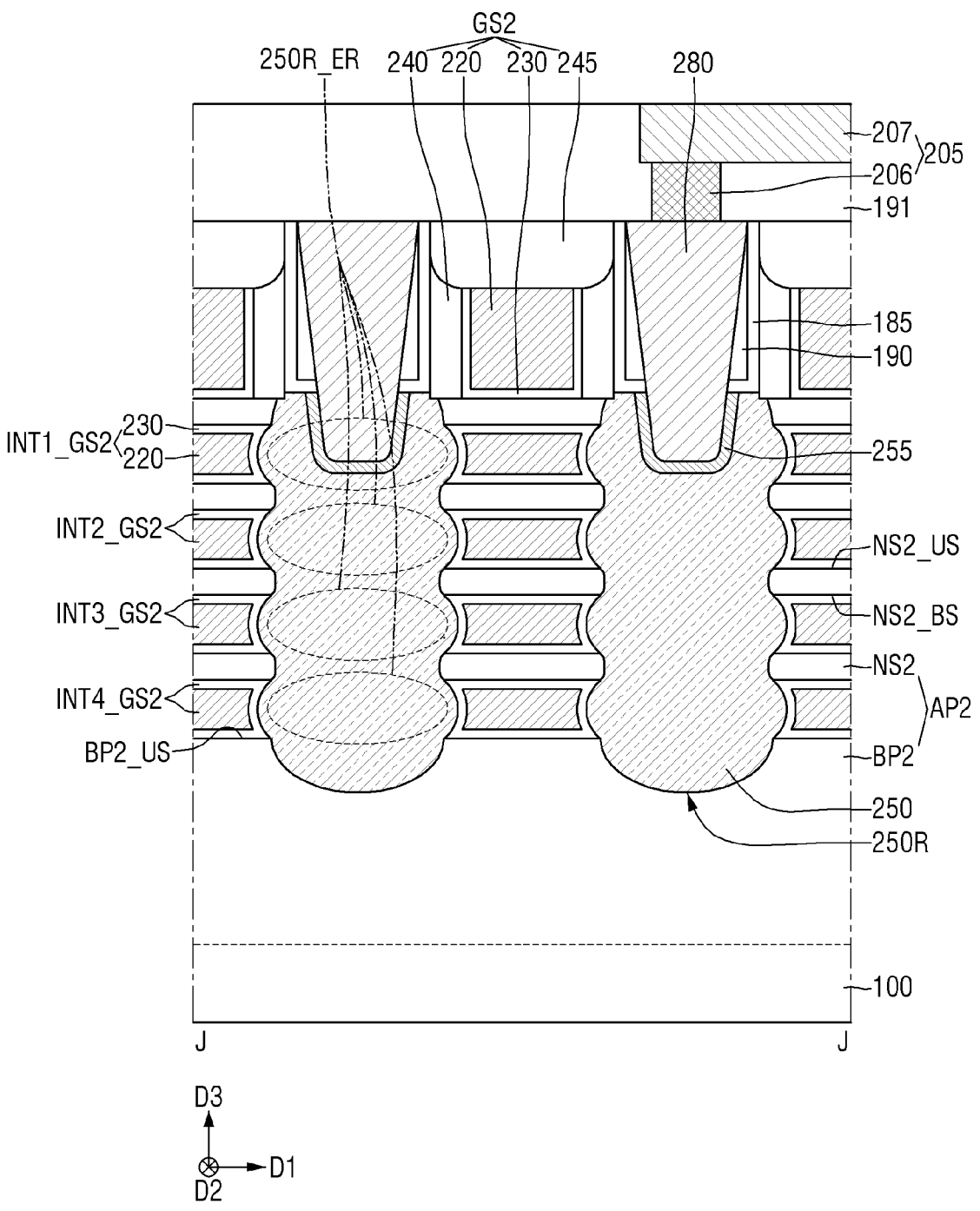
Figure 33:
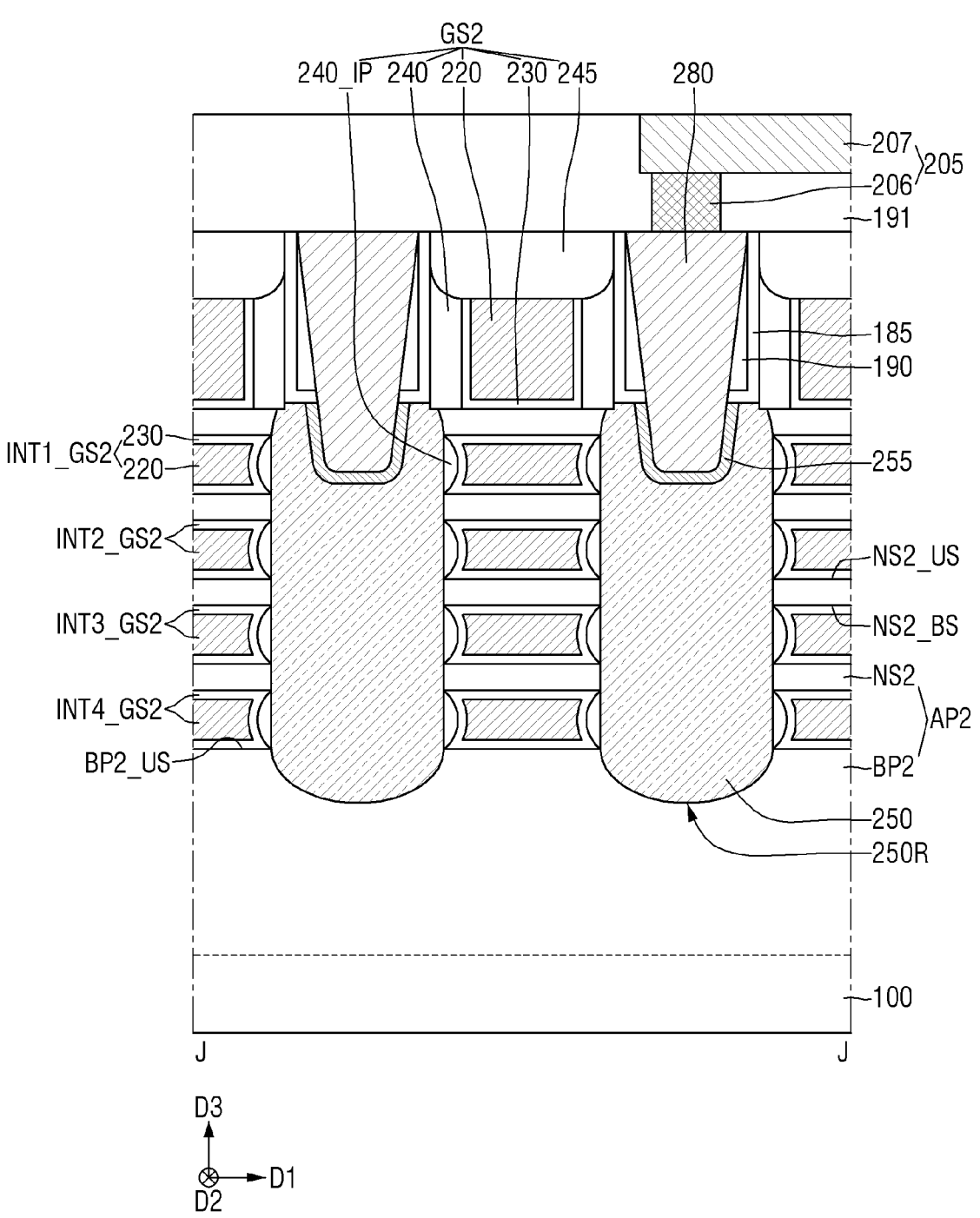
Figure 34:
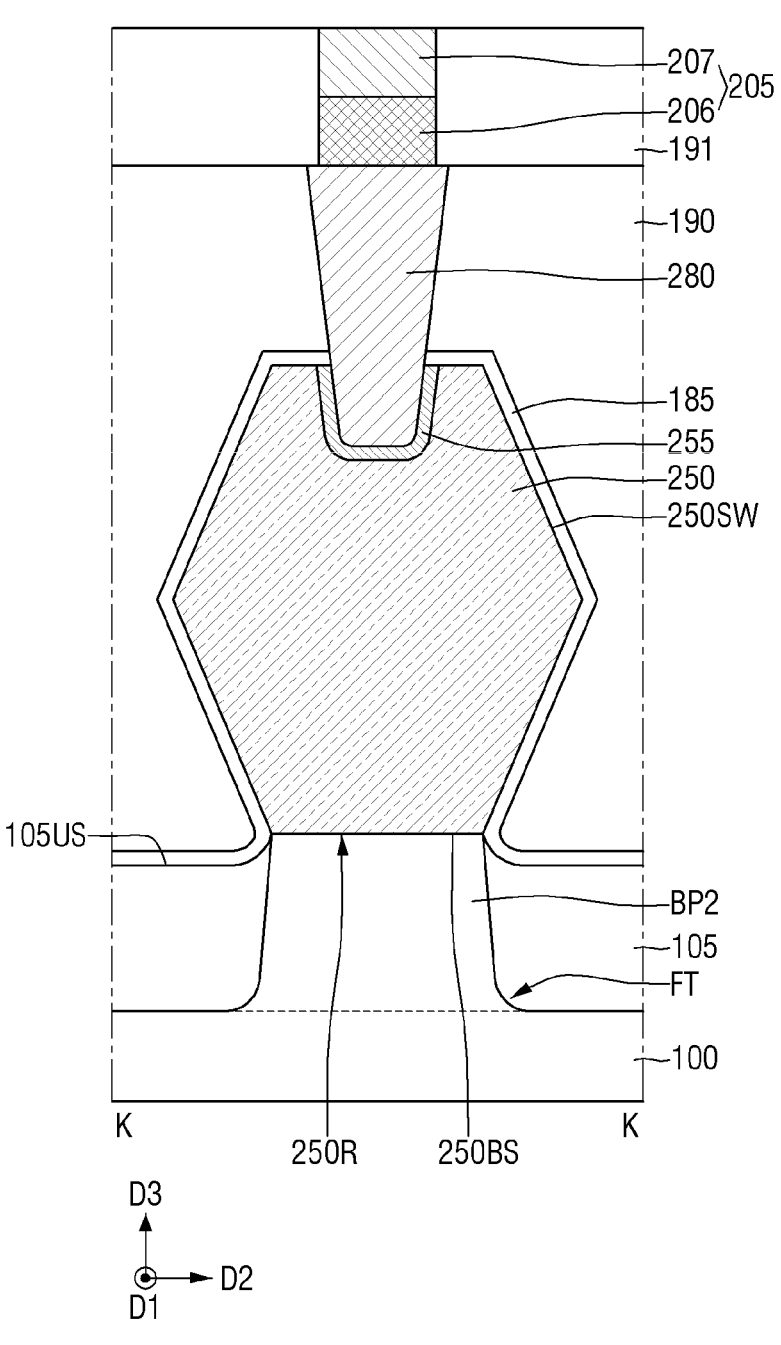

FIGS. 31 to 34 are diagrams that illustrate a semiconductor device according to some embodiments. For reference, FIG. 31 is an illustrative plan view for illustrating a semiconductor device according to some embodiments. FIG. 32 and FIG. 33 are cross-sectional views taken along J-J of FIG. 31. FIG. 34 is a cross-sectional view taken along K-K of FIG. 31.

Further, a cross-sectional view taken along A-A in FIG. 31 may be the same as one of FIG. 2, FIG. 22, and FIG. 28. A cross-sectional view taken along C-C of FIG. 31 may be the same as one of FIG. 4, FIG. 15 to FIG. 21, FIG. 23, FIG. 25 to FIG. 27. In addition, a description of a first area I in FIG. 31 may be substantially the same as that as set forth above with reference to FIGS. 1 to 30. Therefore, the following description is based on content with respect to a second area II in FIG. 31.

Referring to FIG. 31 to FIG. 34, a semiconductor device according to some embodiments includes the first active pattern AP1, a plurality of first gate structures GS1, the first source/drain pattern 150, the epitaxial insulating liner 150SP, a second active pattern AP2, a plurality of second gate structures GS2, and a second source/drain pattern 250.

The substrate 100 may include the first area I and the second area II. The first area I may be an area in which the PMOS transistor is formed, and the second area II may be an area in which the NMOS transistor is formed.

The first active pattern AP1, the plurality of first gate structures GS1, the first source/drain pattern 150, and the epitaxial insulating liner 150SP are disposed in the first area I of the substrate 100. The second active pattern AP2, the plurality of second gate structures GS2, and the second source/drain pattern 250 are disposed in the second area II of the substrate 100.

The second active pattern AP2 may include a second lower pattern BP2 and a plurality of second sheet patterns NS2. The second lower pattern BP2 may be defined by a fin trench FT. the plurality of second sheet patterns NS2 is disposed on an upper surface BP2_US of the second lower pattern. The second sheet pattern NS2 includes the upper surface NS2_US and a bottom surface NS2_BS facing each other in the third direction D3.

Each of the second lower pattern BP2 and the second sheet pattern NS2 may include one of silicon or germanium as an elemental semiconductor material, a group IV-IV compound semiconductor, or a group III-V compound semiconductor. In the semiconductor device according to some embodiments, the second lower pattern BP2 may be a silicon lower pattern including silicon, while the second sheet pattern NS2 may be a silicon sheet pattern including silicon.

The plurality of second gate structures GS2 may be disposed on the substrate 100. The second gate structure GS2 may be disposed on the second active pattern AP2. The second gate structure GS2 may intersect the second active pattern AP2. The second gate structure GS2 may intersect the second lower pattern BP2. The second gate structure GS2 may at least partially surround each of the second sheet patterns NS2. The second gate structure GS2 may include a plurality of inner gate structures INT1_GS2, INT2_GS2, INT3_GS2, and INT4_GS2 respectively disposed between adjacent ones of the second sheet patterns NS2 adjacent to each other in the third direction D3 and between the second lower pattern BP2 and the second sheet pattern NS2. The second gate structure GS2 may include, for example, a second gate electrode 220, a second gate insulating film 230, a second gate spacer 240, and a second gate capping pattern 245.

In FIG. 32, the second gate spacer 240 is not disposed between each of the inner gate structures INT1_GS2, INT2_GS2, INT3_GS2, and INT4_GS2 and the second source/drain pattern 250. The second gate insulating film 230 included in each of the inner gate structures INT1_GS2, INT2_GS2, INT3_GS2, and INT4_GS2 may be in contact with the second source/drain pattern 250.

In FIG. 33, the second gate structure GS2 may include an inner spacer 240_IP. The inner spacer 240_IP may be disposed between adjacent ones of the second sheet patterns NS2 adjacent to each other in the third direction D3 and between the second lower pattern BP2 and the second sheet pattern NS2. The inner spacer 240_IP may contact the second gate insulating film 230 included in each of the inner gate structures INT1_GS2, INT2_GS2, INT3_GS2, and INT4_GS2. The inner spacer 240_IP may define a portion of the second source/drain recess 250R.

The second source/drain pattern 250 may be formed on the second active pattern AP2. The second source/drain pattern 250 may be formed on the second lower pattern BP2. The second source/drain pattern 250 may be connected to the second sheet pattern NS2. The second source/drain pattern 250 may be included in a source/drain of a transistor using the second sheet pattern NS2 as a channel region.

The second source/drain pattern 250 may be disposed in a second source/drain recess 250R. A bottom surface of the second source/drain recess 250R may be defined by the second lower pattern BP2. A sidewall of the second source/drain recess 250R may be defined by the second nanosheet NS3 and the second gate structure GS3.

In FIG. 32, the second source/drain recess 250R may include a plurality of width extension regions 250R_ER. Each of the width extension regions 250R_ER of the second source/drain recess may be defined above the upper surface BP2_US of the second lower pattern.

In FIG. 33, the second source/drain recess 250R does not include the plurality of width extension regions (250R_ER in FIG. 32). A sidewall of the second source/drain recess 250R is not wavy. A width of a top portion of the sidewall of the second source/drain recess 250R in the first direction D1 may decrease in a direction away from the second lower pattern BP2.

The second source/drain pattern 250 may include an epitaxial pattern. The second source/drain pattern 250 may include, for example, silicon or germanium as an elemental semiconductor material. Further, the second source/drain pattern 250 may include, for example, a binary compound or a ternary compound including any combination of two or more of the following materials: carbon (C), silicon (Si), germanium (Ge), and tin (Sn), or a compound in which the binary compound or the ternary compound is doped with an IV group element. For example, the second source/drain pattern 250 may include, but is not limited to, silicon, silicon-germanium, silicon carbide, or the like. Although it is illustrated that the second source/drain pattern 250 is embodied as a single layer, this is only for convenience of illustration, and the present disclosure is not limited thereto.

The second source/drain pattern 250 may include the semiconductor material and further contain impurities doped into the semiconductor material. For example, the second source/drain pattern 250 may contain n-type impurities. The doped n-type impurities may include phosphorus (P), arsenic (As), antimony (Sb), and/or bismuth (Bi).

A bottom surface 250B S of the second source/drain pattern is in contact with the second lower pattern BP2. The epitaxial insulating liner may not be formed on a sidewall 250SW of the second source/drain pattern.

In FIG. 34, it is illustrated that both opposing sidewalls 250SW of the second source/drain pattern spaced apart from each other in the second direction D2 do not meet each other. However, embodiments of the present disclosure are not limited thereto. Unlike what is illustrated, in an example, the second source/drain pattern 250 may have a shape similar to a pentagon. In another example, the second source/drain pattern 250 may have a shape similar to a rectangle.

The second source/drain contact 280 is disposed on the second source/drain pattern 250. The second source/drain contact 280 is connected to the second source/drain pattern 250. A second contact silicide layer 255 may be further disposed between the second source/drain contact 280 and the second source/drain pattern 250.

FIGS. 35 to 54 are diagrams of intermediate structures corresponding to operations for illustrating a method for manufacturing a semiconductor device according to some embodiments.

Figure 35:
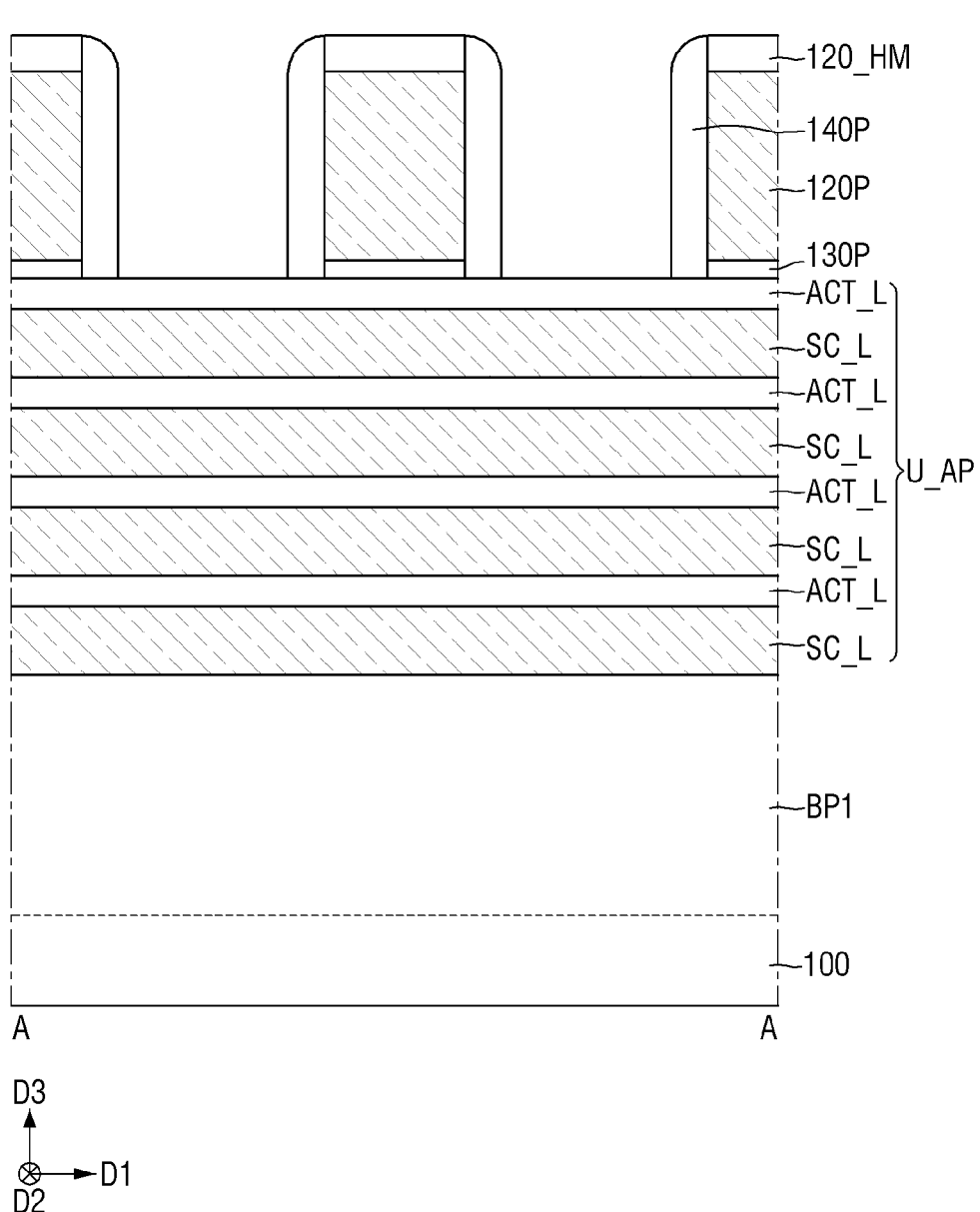
FIGS. 35 to 54 are diagrams of intermediate structures corresponding to operations that illustrates a method for manufacturing a semiconductor device according to some embodiments.

Referring to FIG. 35, the substrate 100 may be provided, and the first lower pattern BP1 and an upper pattern structure U_AP may be formed thereon.

The upper pattern structure U_AP may be disposed on the first lower pattern BP1. The upper pattern structure U_AP may include a plurality of sacrificial patterns SC_L and a plurality of active patterns ACT_L alternately stacked on the first lower pattern BP1.

For example, the sacrificial pattern SC_L may include a silicon-germanium layer. The active pattern ACT_L may include a silicon film.

Subsequently, a dummy gate insulating film 130P, a dummy gate electrode 120P, and a dummy gate capping film 120_HM may be formed on the upper pattern structure U_AP. The dummy gate insulating film 130P may include, for example, silicon oxide. However, embodiments of the present disclosure are not limited thereto. The dummy gate electrode 120P may include, but is not limited to, polysilicon. The dummy gate capping film 120_HM may include, but is not limited to, silicon nitride, for example.

A pre-gate spacer 140P may be formed on a sidewall of the dummy gate electrode 120P. The pre-gate spacer 140P may include the inner sidewall (140_ISW of FIG. 47), the connection sidewall (140_CSW of FIG. 47), and the outer sidewall (140_OSW of FIG. 47).

The inner sidewall 140_ISW of the pre-gate spacer faces a sidewall of the dummy gate electrode 120p extending in the second direction D2. The outer sidewall 140_OSW of the pre-gate spacer is opposite to the inner sidewall 140_ISW of the pre-gate spacer. The connection sidewall 140_CSW of the pre-gate spacer connects the inner sidewall 140_ISW2 of the pre-gate spacer and the outer sidewall 140_OSW of the pre-gate spacer to each other.

Figure 36:
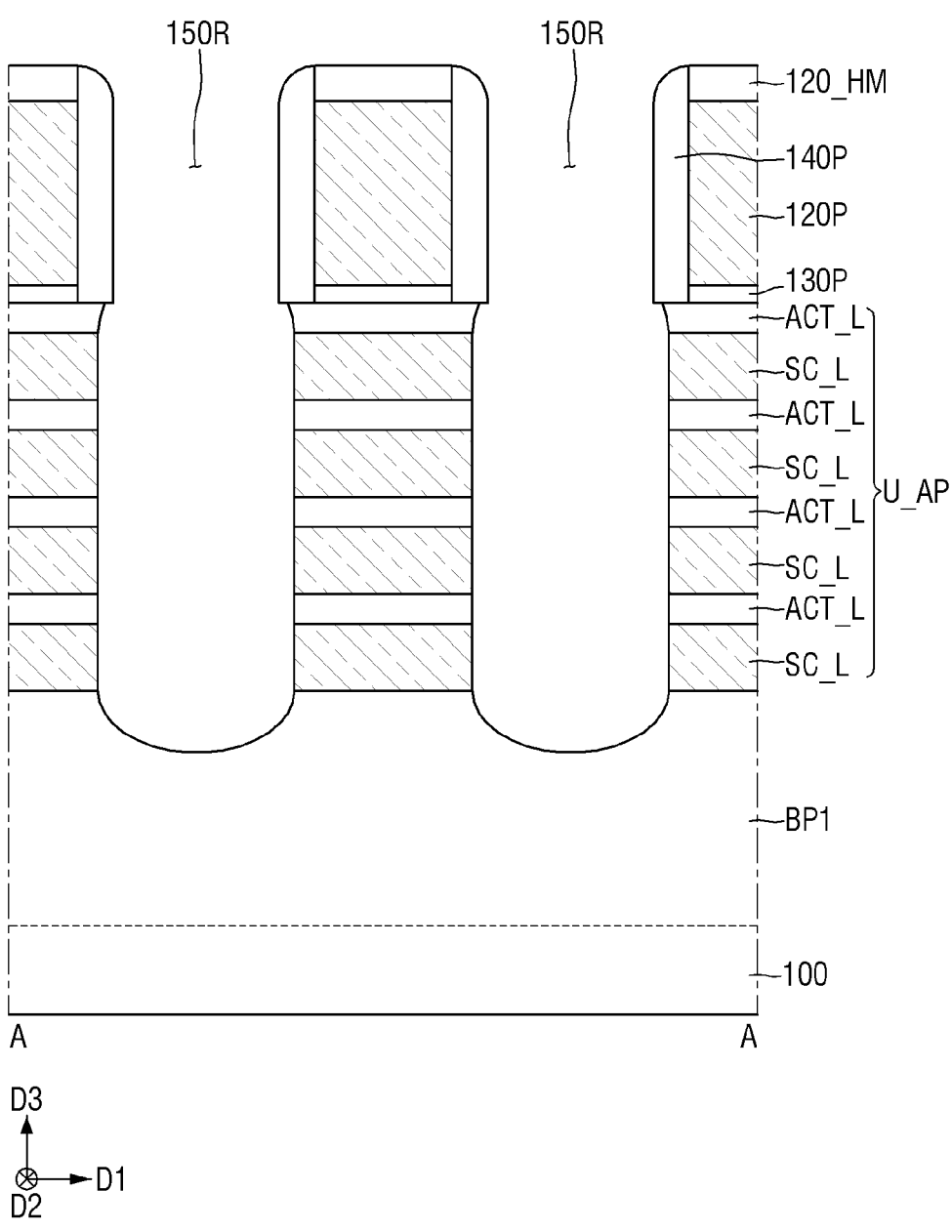

Referring to FIG. 36, the first source/drain recess 150R may be formed in the upper pattern structure U_AP using the dummy gate electrode 120P and the pre-gate spacer 140P as a mask.

A portion of the first source/drain recess 150R may be formed in the first lower pattern BP1.

Although not shown, the fin spacer (140SP of FIG. 23) may be formed while the first source/drain recess 150R is formed.

Figure 37:
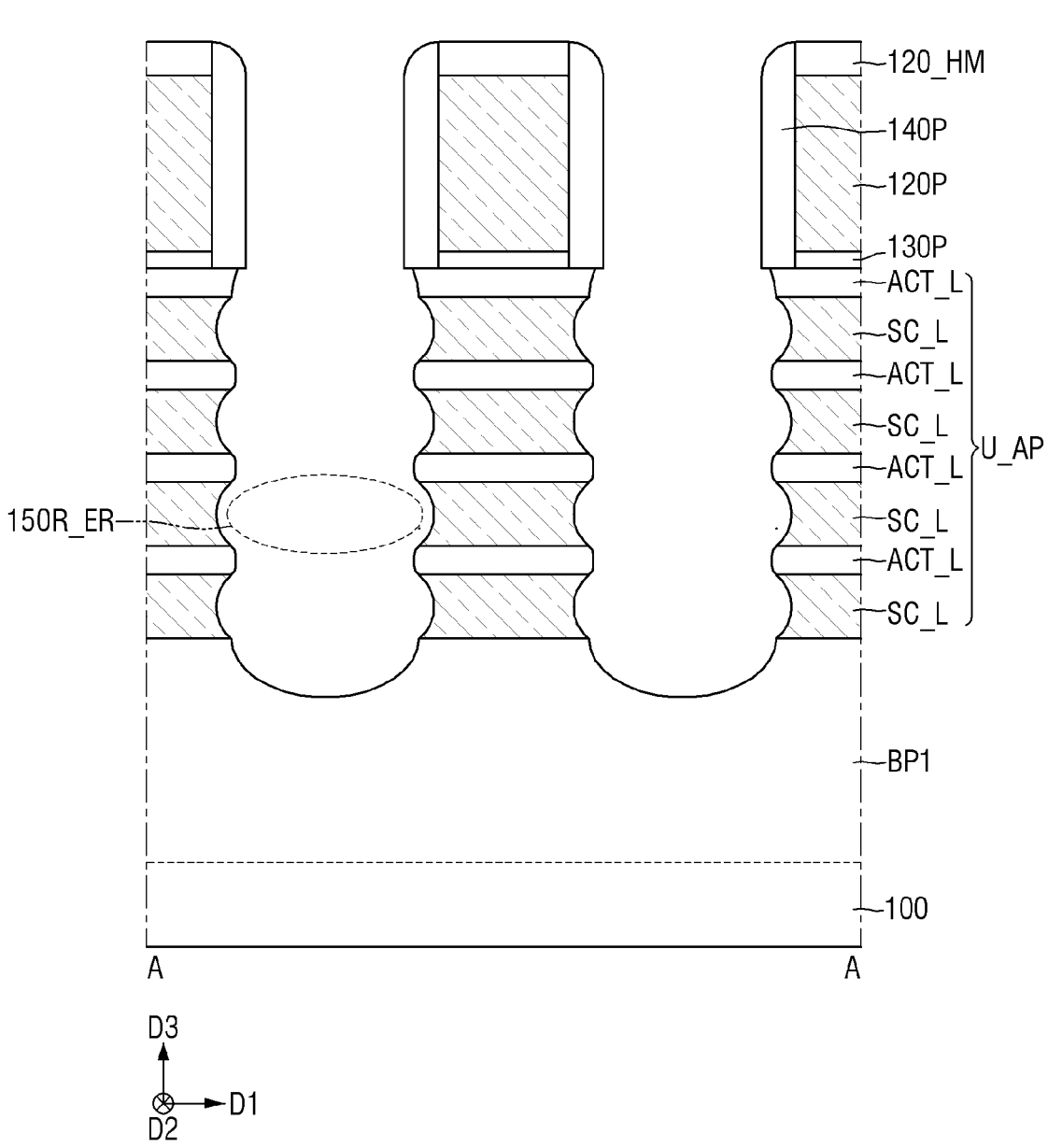

Referring to FIG. 37, a portion of the sacrificial pattern SC_L exposed through the first source/drain recess 150R may be removed.

Thus, the plurality of the width extension regions 150R_ER may be formed. The first source/drain recess 150R may include the width extension region 150R_ER of the first source/drain recess.

Figure 38:
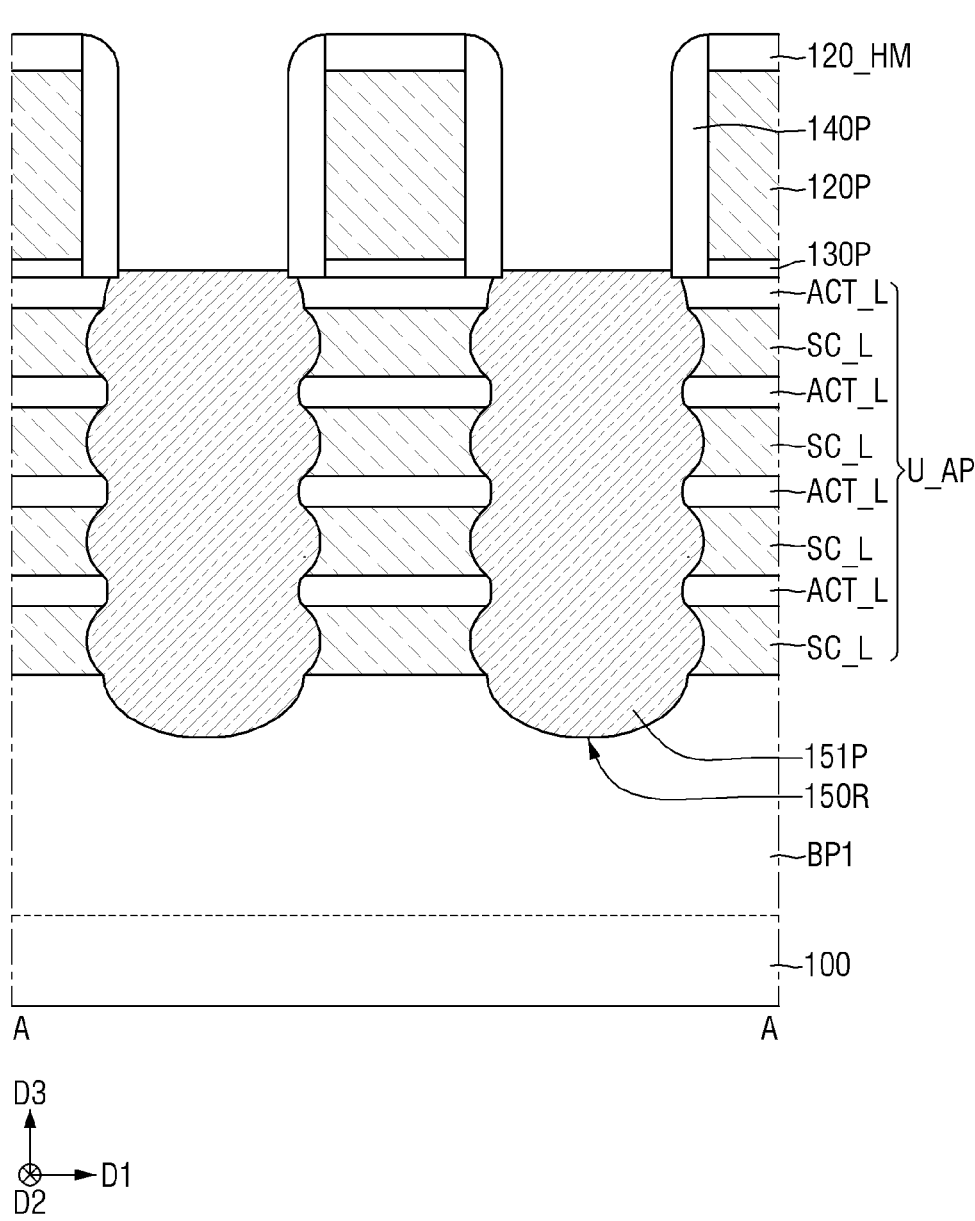
Figure 39:
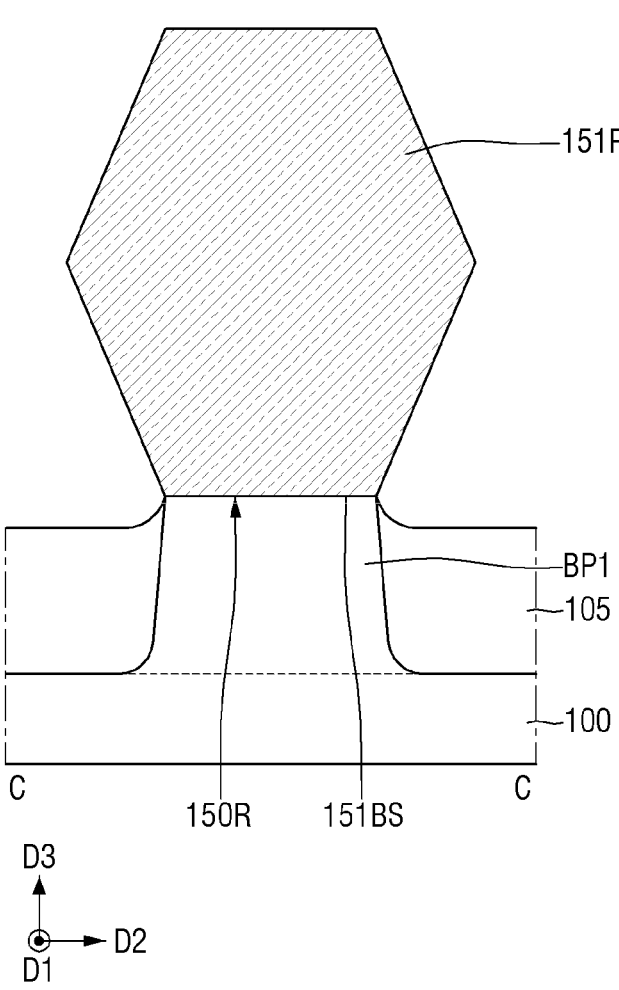

Referring to FIG. 38 and FIG. 39, a pre-semiconductor liner film 151P may be formed on the first lower pattern BP1.

The pre-semiconductor liner film 151P may be in and may fill the entire first source/drain recess 150R.

In FIG. 39, a shape of the pre-semiconductor liner film 151P may be substantially the same as that of the first source/drain pattern (150 in FIGS. 4 and 5).

Figure 40:
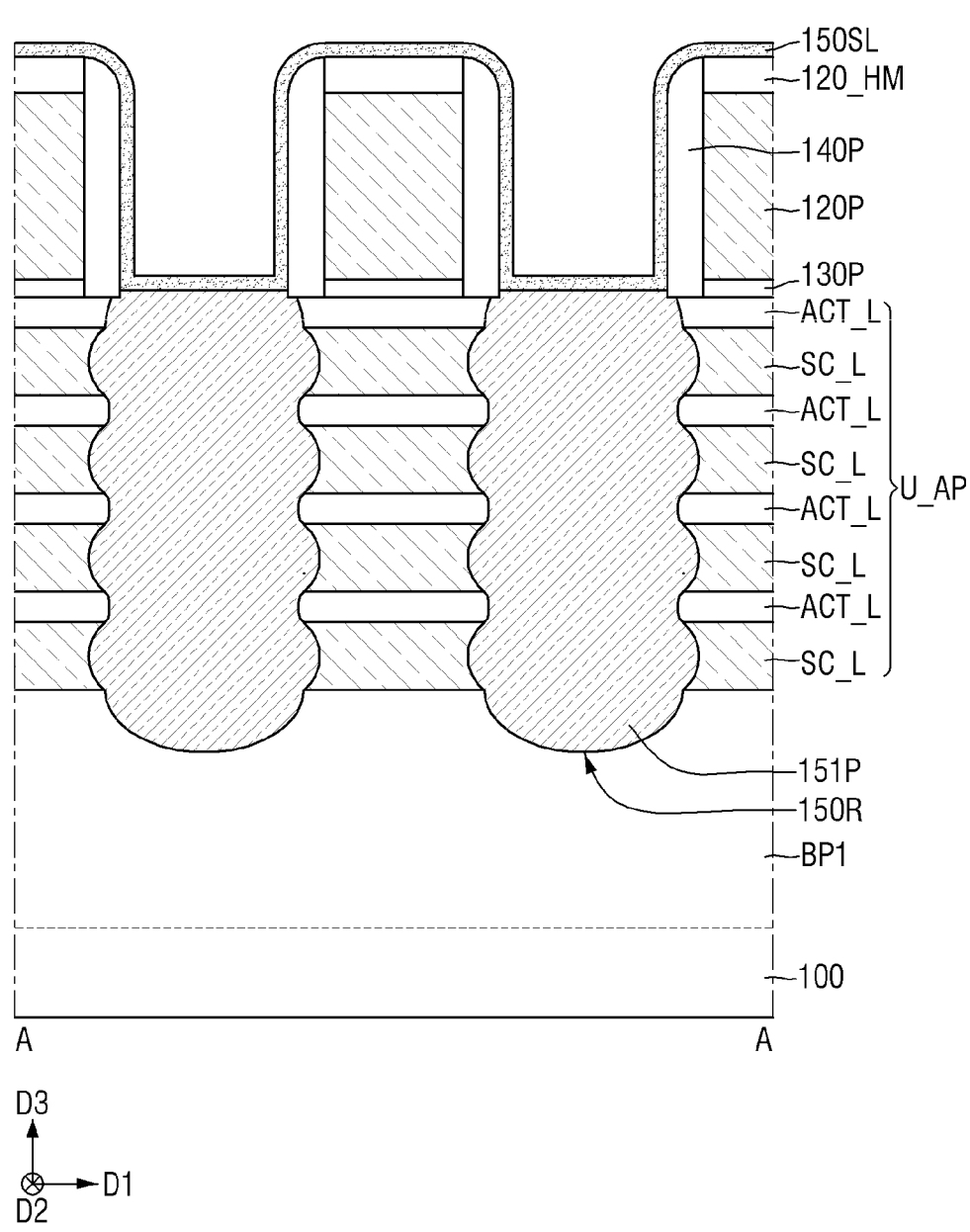
Figure 41:
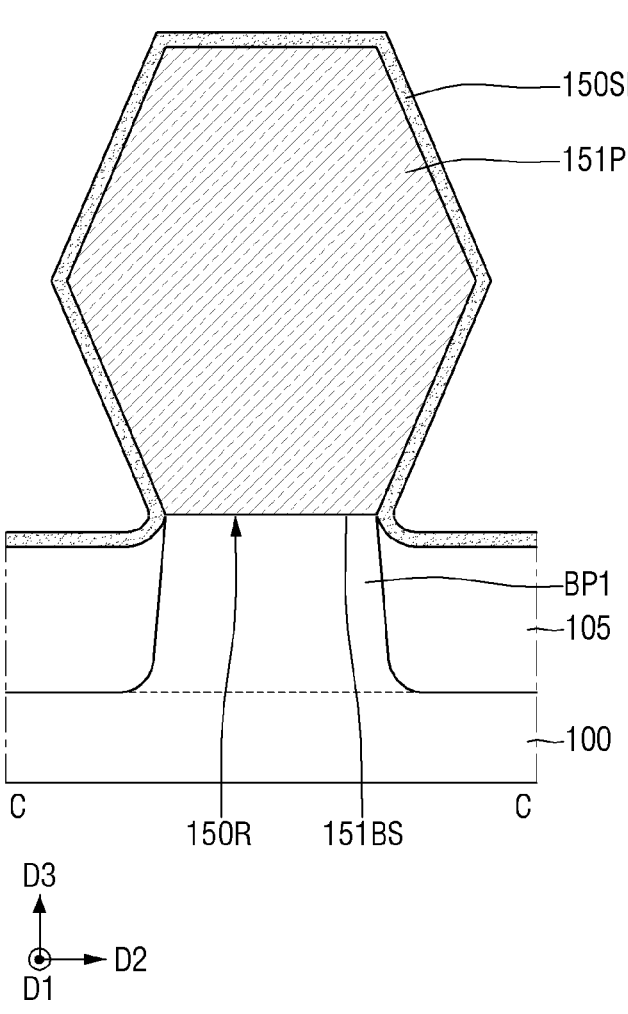

Referring to FIG. 40 and FIG. 41, the epitaxial insulating film 150SL may be formed along a sidewall a bottom surface of the pre-semiconductor liner film 151P.

The epitaxial insulating film 150SL may extend along the upper surface of the field insulating film 105. The epitaxial insulating film 150SL may extend along an outer sidewall of the pre-gate spacer 140P and an upper surface of the dummy gate capping film 120_HM.

Figure 42:
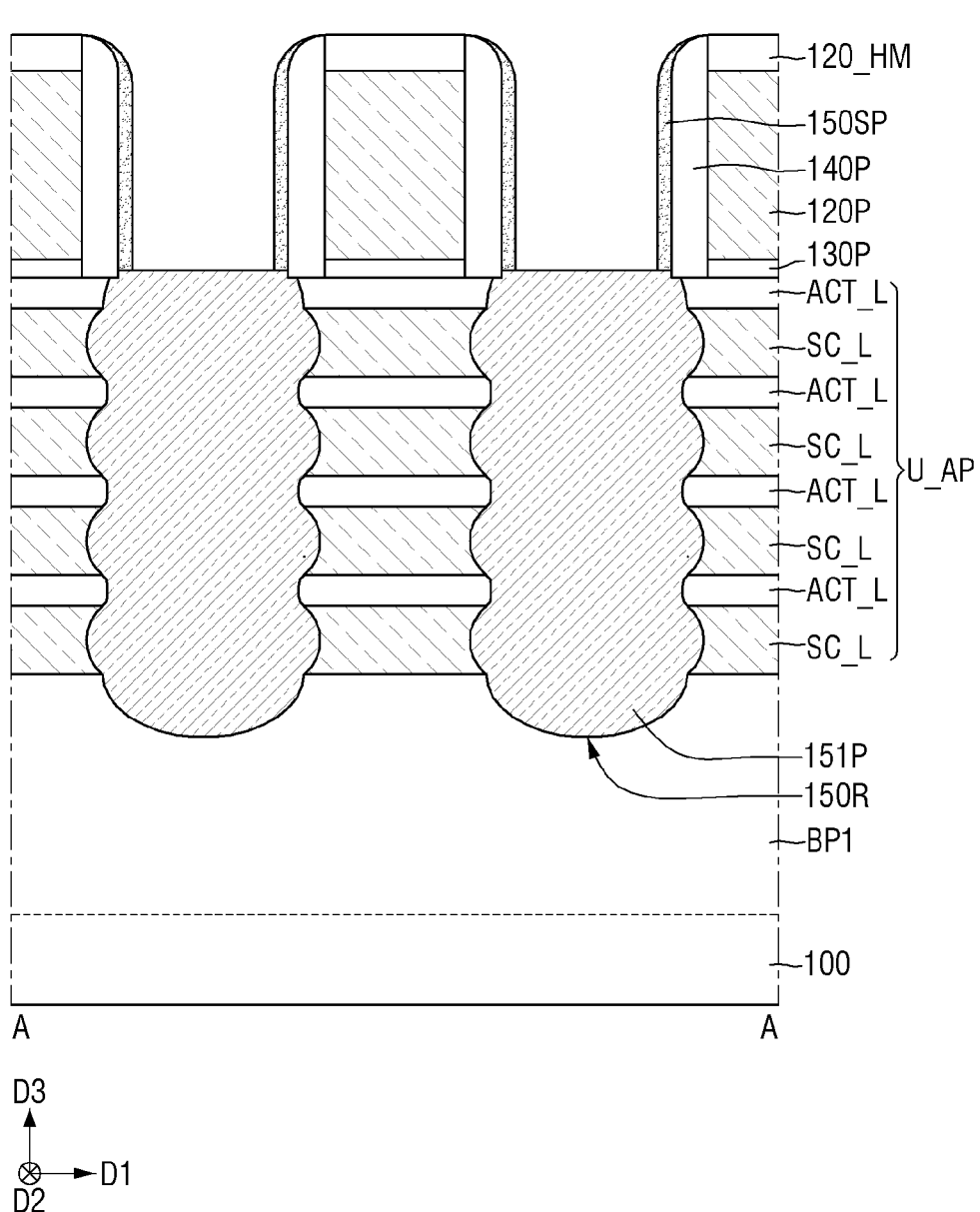
Figure 43:
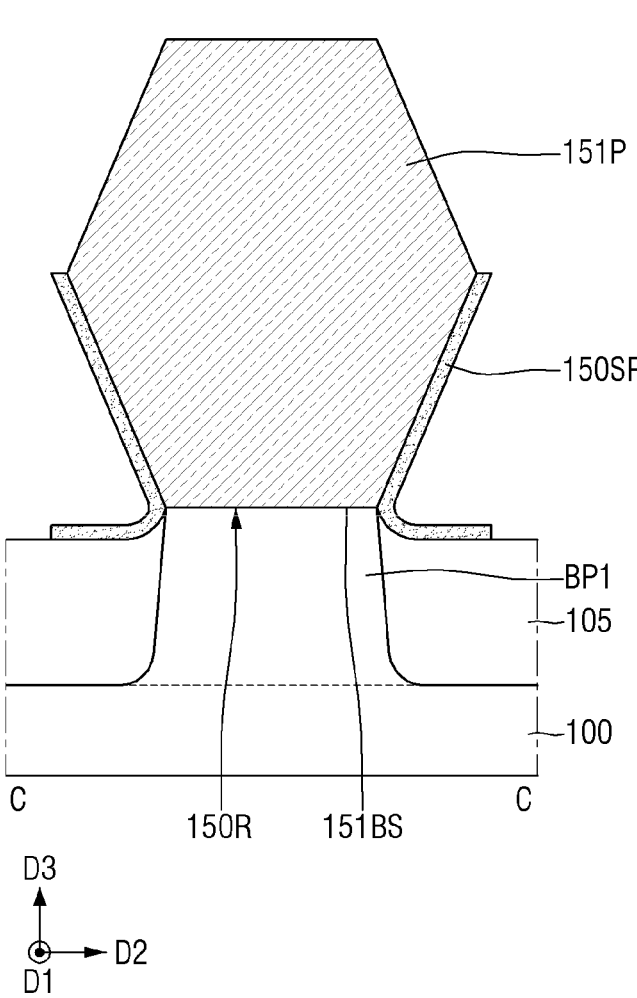
Figure 44:
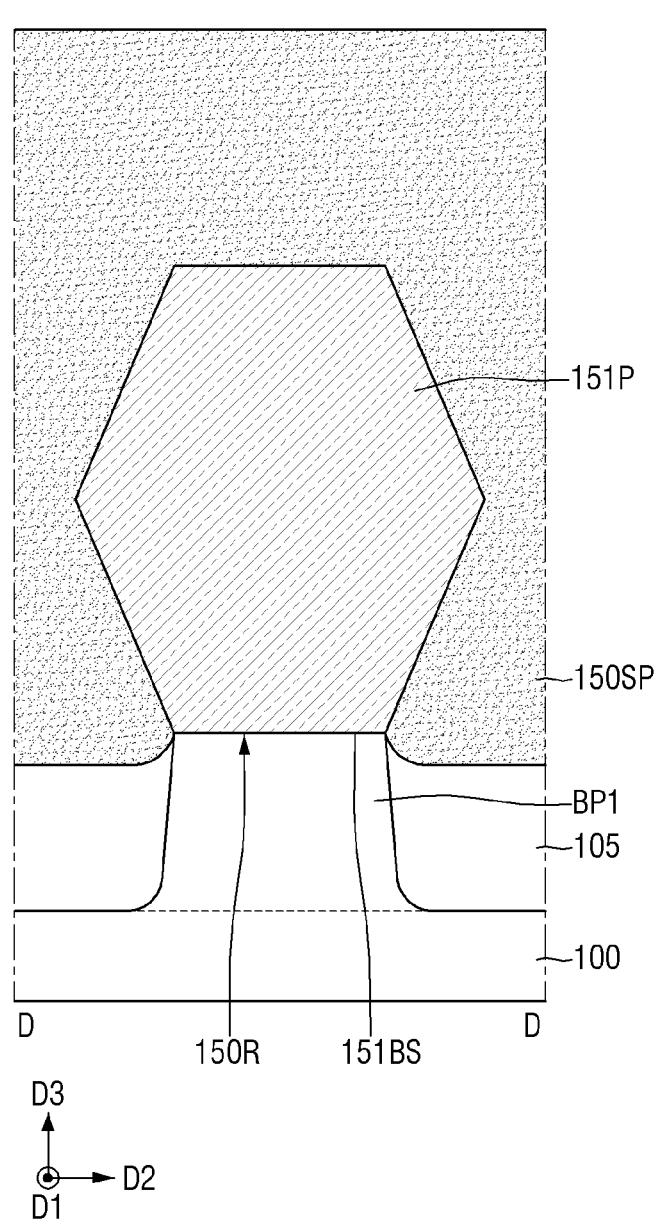

Referring to FIG. 42 to FIG. 44, the epitaxial insulating liner 150SP may be formed on the pre-semiconductor liner film 151P using anisotropic etching of the epitaxial insulating film 150SL.

The epitaxial insulating liner 150SP is formed along the outer sidewall of the pre-gate spacer 140P. The epitaxial insulating liner 150SP may be formed along a lower inclined sidewall of the pre-semiconductor liner film 151P. The epitaxial insulating liner 150SP is not formed along an upper inclined sidewall of the pre-semiconductor liner film 151P and an upper surface of the pre-semiconductor liner film 151P.

While the epitaxial insulating liner 150SP is formed, a portion of the epitaxial insulating film 150SL formed on the upper surface of the field insulating film 105 may also be removed.

In FIG. 44, in a portion adjacent to the pre-gate spacer 140P, the entire pre-semiconductor liner layer 151P may be covered by the epi-insulation liner 150SP.

Referring to FIG. 42 to FIG. 47, a portion of the pre-semiconductor liner film 151P may be etched using the epitaxial insulating liner 150SP as a mask.

A portion of the pre-semiconductor liner film 151P may be etched to form the semiconductor liner film 151. The semiconductor liner film 151 may define the liner recess 151R.

While the semiconductor liner film 151 is being formed, a portion of the epitaxial insulating liner 150SP formed along the lower inclined sidewall of the pre-semiconductor liner film 151P may be etched.

However, as shown in FIG. 44, a portion of the pre-semiconductor liner layer 151P that is entirely covered by the epi-insulation liner 150SP is not etched.

Figure 48:
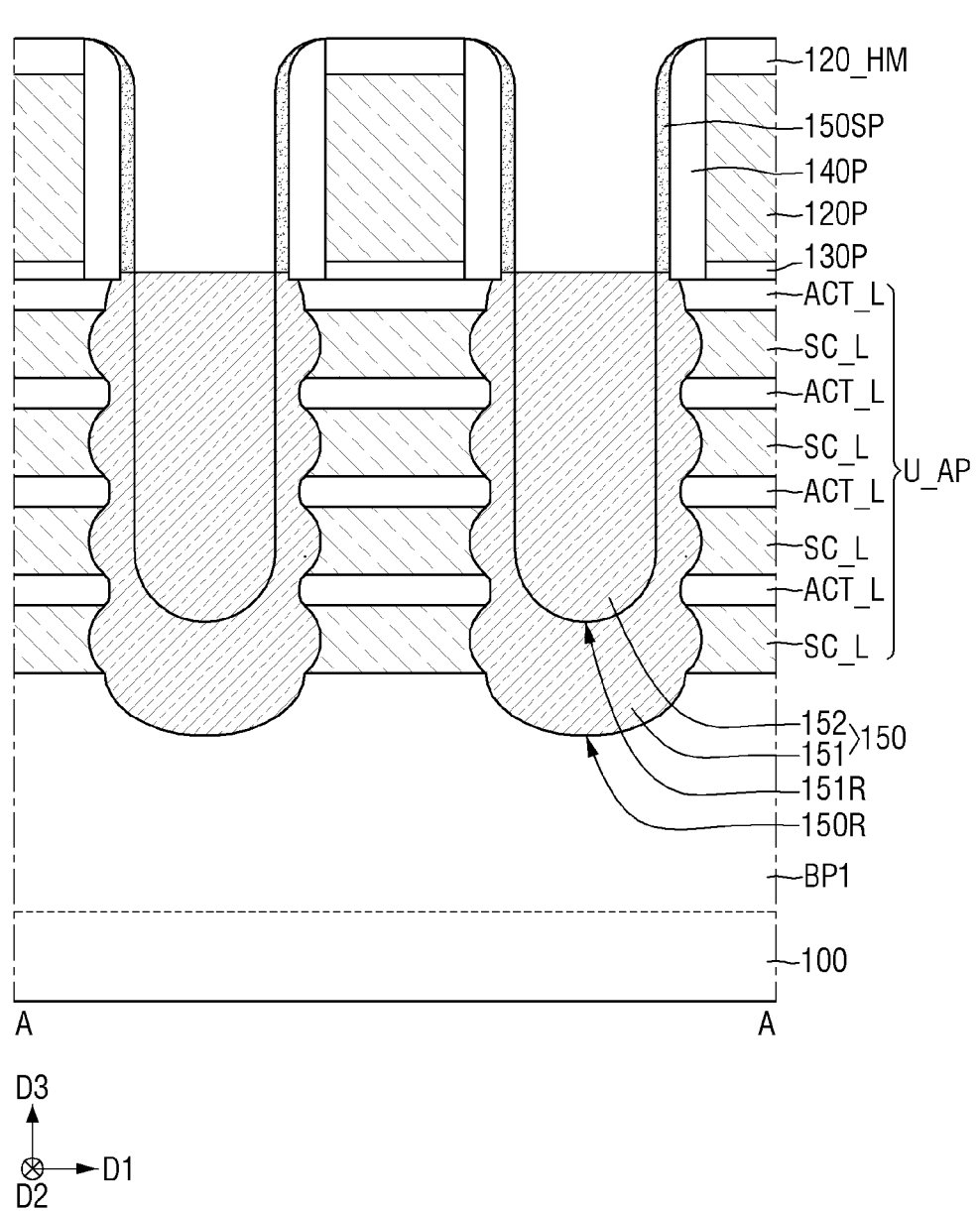
Figure 49:
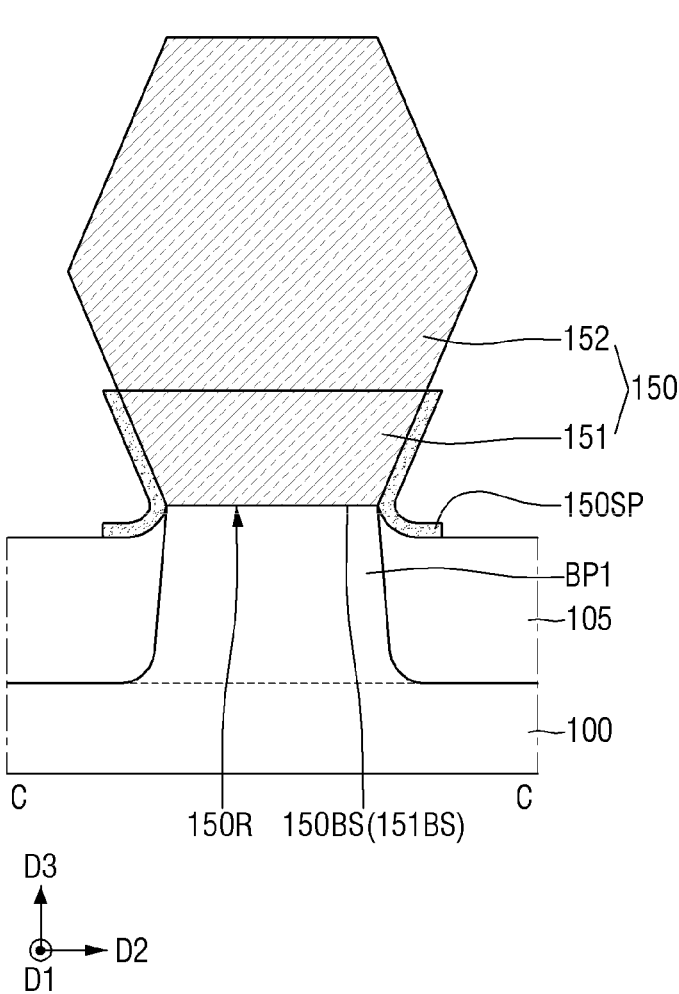

Referring to FIG. 48 and FIG. 49, a semiconductor filling film 152 may be formed on the semiconductor liner film 151 while the epitaxial insulating liner 150SP remains on the outer sidewall of the pre-gate spacer 140P.

The semiconductor filling film 152 may be in and at least partially fill the liner recess 151R. The first source/drain pattern 150 may be formed on the first lower pattern BP1.

Figure 50:
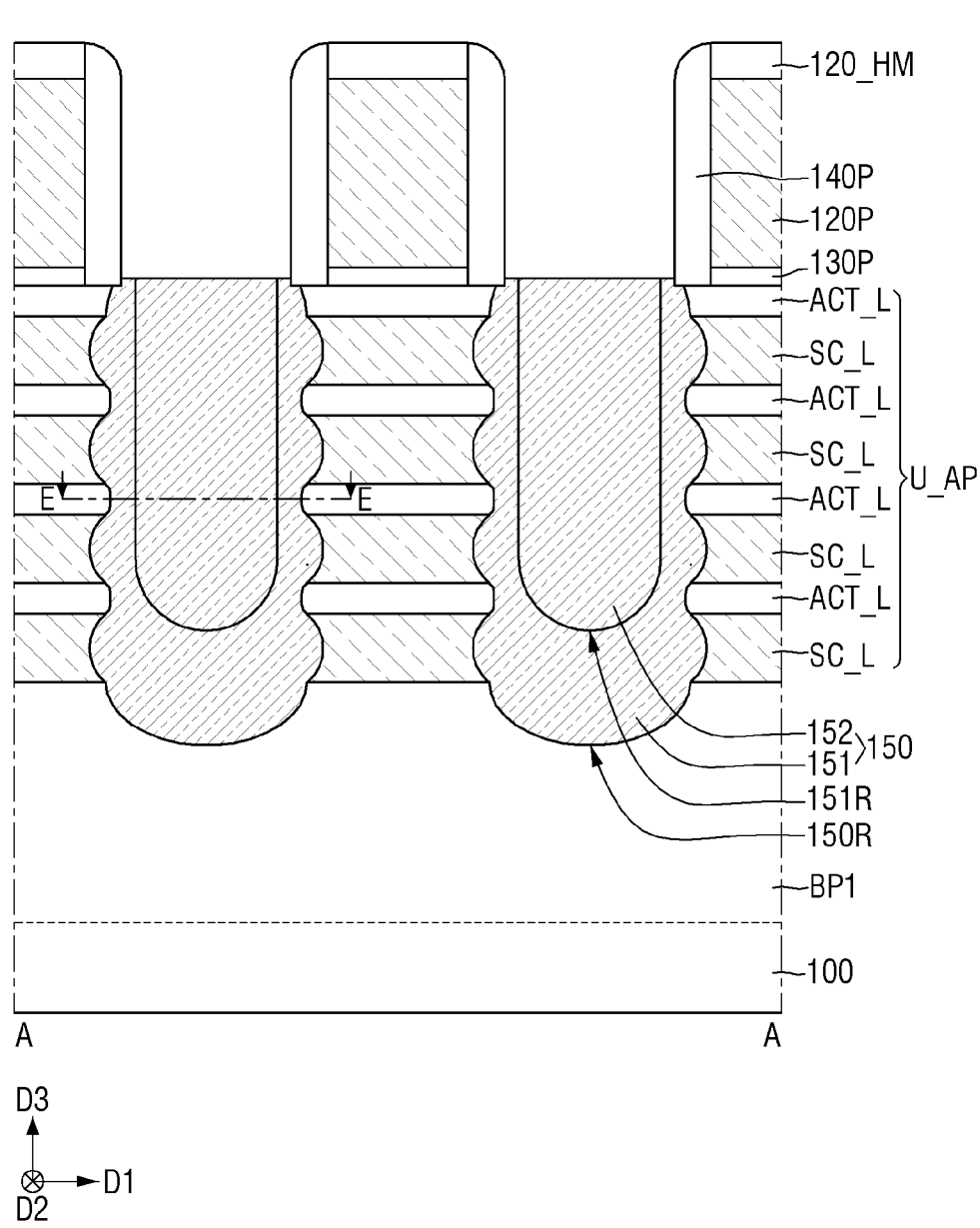
Figure 51:
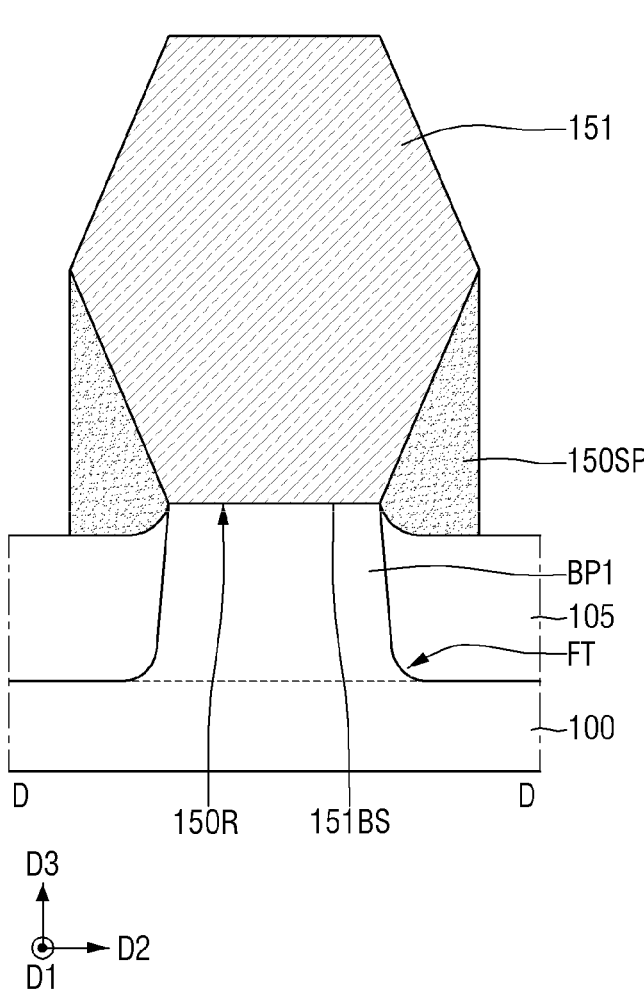
Figure 52:
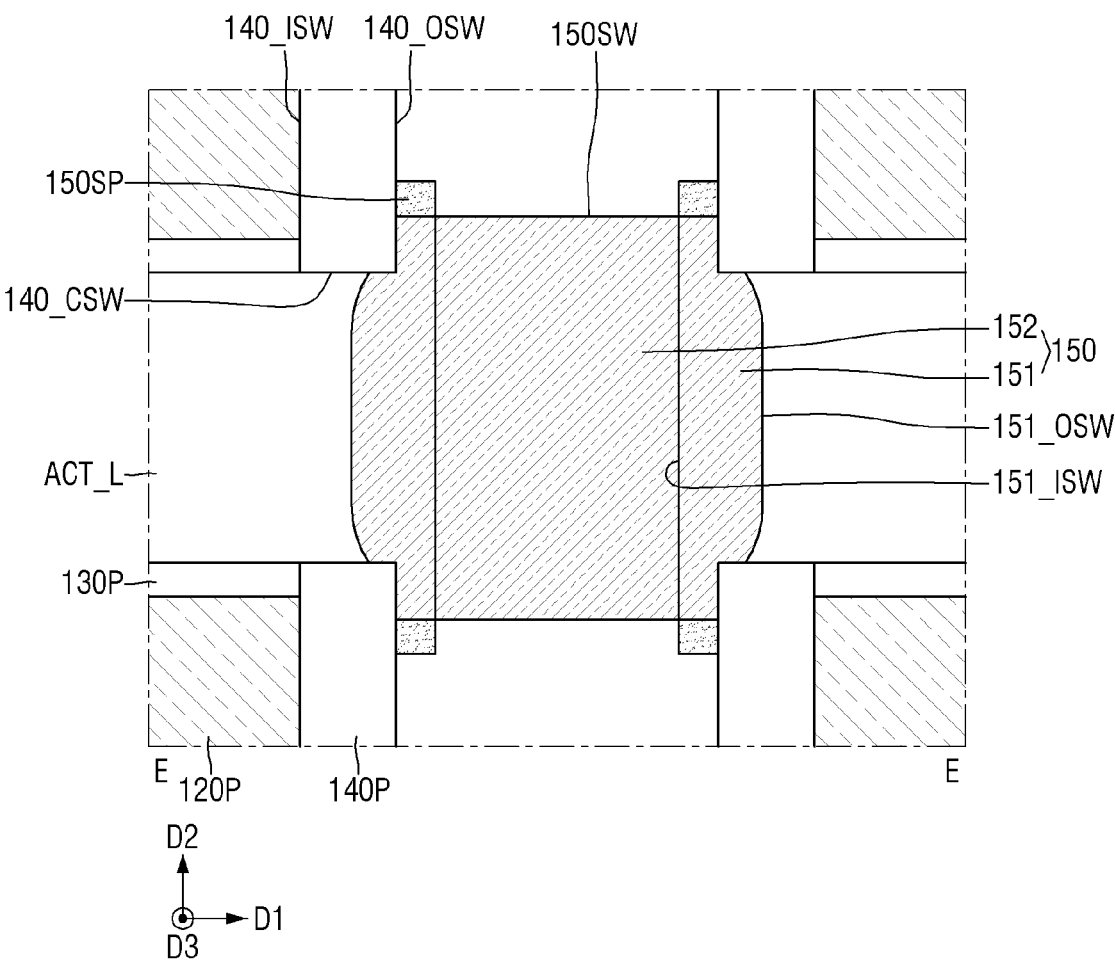

Referring to FIG. 50 to FIG. 52, a portion of the epitaxial insulating liner 150SP may be removed.

The epitaxial insulating liner 150SP formed on the outer sidewall of the pre-gate spacer 140P may be removed using anisotropic etching. While the epitaxial insulating liner 150SP formed on the outer sidewall of the pre-gate spacer 140P is removed, the epitaxial insulating liner 150SP disposed on the lower inclined sidewall of the first source/drain pattern 150 may not be removed.

A portion of the epitaxial insulating liner 150SP disposed on the outer sidewall of the pre-gate spacer 140P and overlapping the first source/drain pattern 150 in the third direction D3 may not be removed.

Figure 53:
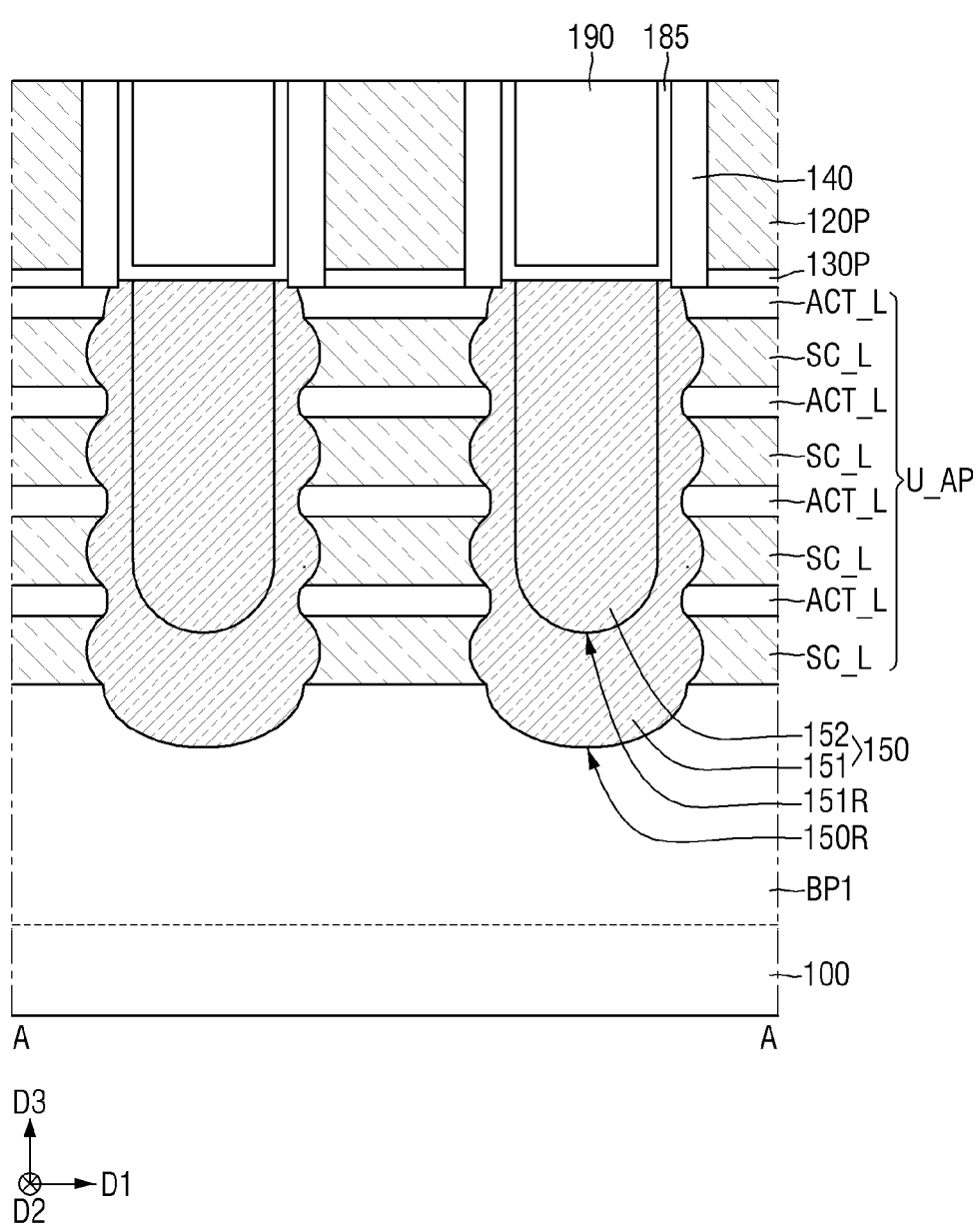

Referring to FIG. 53, the source/drain etch stop film 185 and the first interlayer insulating film 190 are sequentially formed on the first source/drain pattern 150.

Next, a portion of the first interlayer insulating film 190, a portion of the source/drain etch stop film 185, and the dummy gate capping film 120_HM may be removed to expose the upper surface of the dummy gate electrode 120P. While the upper surface of the dummy gate electrode 120P is exposed, the first gate spacer 140 may be formed.

Figure 54:
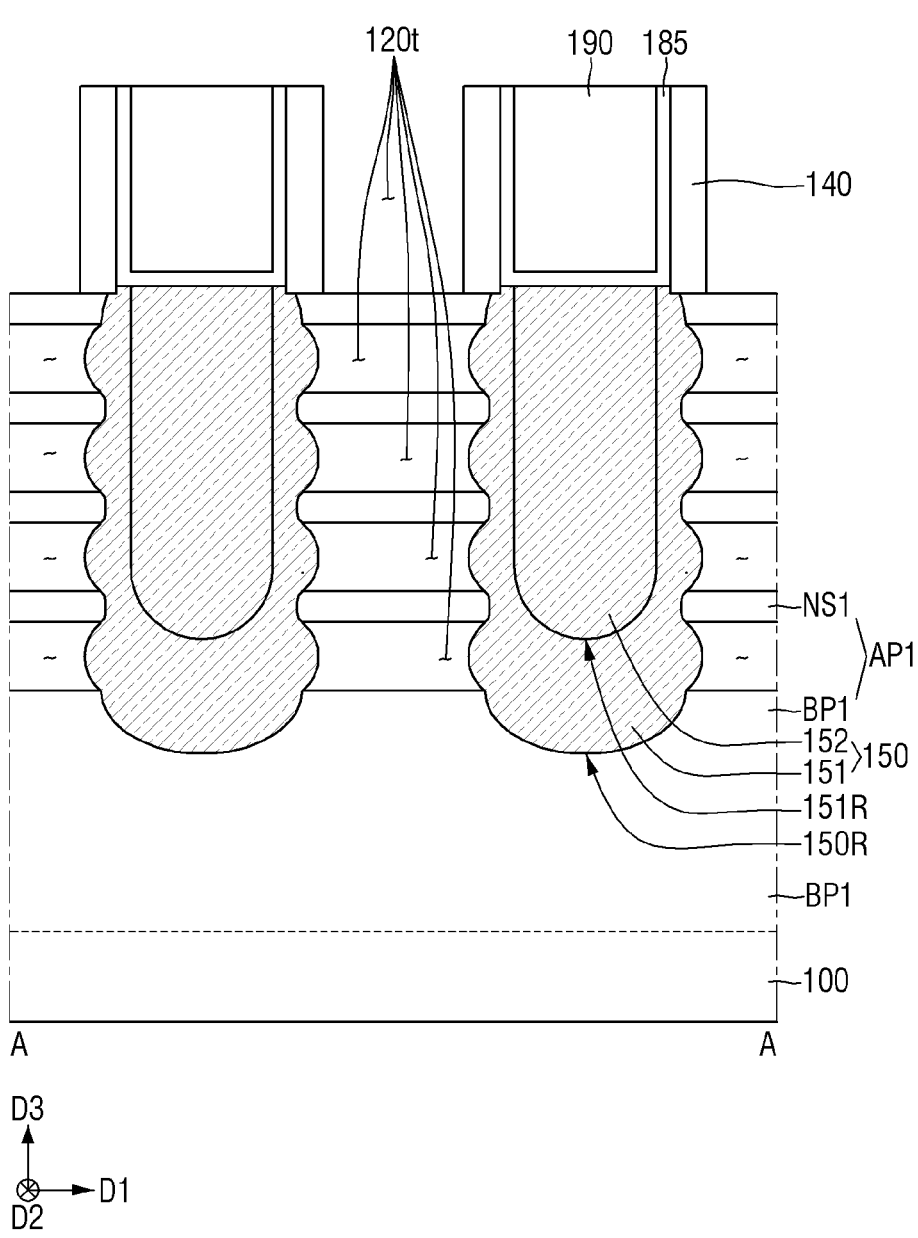

Referring to FIG. 53 and FIG. 54, a portion of the upper pattern structure U_AP between the first gate spacers 140 may be exposed by removing the dummy gate insulating film 130P and the dummy gate electrode 120P.

Subsequently, the sacrificial pattern SC_L may be removed such that the first sheet pattern NS1 may be formed. The first sheet pattern NS1 is connected to the first source/drain pattern 150. Thus, the first active pattern AP1 including the first lower pattern BP1 and the first sheet pattern NS1 is formed.

Further, the sacrificial pattern SC_L may be removed such that a gate trench 120t is formed between the first gate spacers 140. When the sacrificial pattern SC_L has been removed, a portion of the first source/drain pattern 150 may be exposed.

Unlike the illustration, a portion of the semiconductor liner film 151 including silicon-germanium may be removed while the sacrificial pattern SC_L is removed.

While the sacrificial pattern SC_L is removed, an etchant removing the sacrificial pattern SC_L may invade through a portion adjacent to the connection sidewall (140_CSW in FIG. 4) of the first gate spacer. The invading etchant may etch the semiconductor filling film 152, and thus reliability and performance of the semiconductor device may be deteriorated.

However, the semiconductor liner film 151 is formed using the epitaxial insulating liner 150SP, such that the semiconductor liner film 151 may cover the entire connection sidewall 140_CSW of the first gate spacer.

As a contact thickness between the semiconductor liner film 151 and the first gate spacer 140 increases, the etchant removing the sacrificial pattern SC_L may be inhibited or prevented from invading the semiconductor filling film 152 through the connection sidewall 140_CSW of the first gate spacer. This may inhibit or prevent the semiconductor filling film 152 from being etched by the etchant.

Subsequently, referring to FIG. 2, the first gate insulating film 130 and the first gate electrode 120 may be formed in the gate trench 120t. Further, the first gate capping pattern 145 may be formed.

In concluding the detailed description, those skilled in the art will appreciate that many variations and modifications may be made to the example embodiments without substantially departing from the principles of the present inventive concept. Therefore, the disclosed example embodiments of the invention are used in a generic and descriptive sense only and not for purposes of limitation.

What is claimed is:

1. A semiconductor device comprising:
   a lower pattern on a substrate and protruding in a first direction;
   a source/drain pattern on the lower pattern including a semiconductor liner film in contact with the lower pattern and a semiconductor filling film on the semiconductor liner film, wherein the semiconductor liner film covers at least a portion of a first sidewall of the semiconductor filling film and at least a portion of a second sidewall of the semiconductor filling film; and
   an epitaxial insulating liner extending along at least a portion of a sidewall of the semiconductor liner film, wherein the epitaxial insulating liner is in contact with the semiconductor liner film,
   wherein the semiconductor liner film includes a first portion,
   wherein the first portion of the semiconductor liner film includes a first point spaced apart from the lower pattern at a first height and a second point spaced apart from the lower pattern at a second height,
   wherein the second height is greater than the first height,
   wherein a width of the semiconductor liner film in a second direction at the first point is less than a width of the semiconductor liner film in the second direction at the second point, and
   wherein the epitaxial insulating liner extends along at least a portion of a sidewall of the first portion of the semiconductor liner film.

2. The semiconductor device of claim 1, wherein the epitaxial insulating liner extends along an entirety of the sidewall of the first portion of the semiconductor liner film.

3. The semiconductor device of claim 1, wherein the sidewall of the first portion of the semiconductor liner film is directly connected to a bottom face of the semiconductor liner film.

4. The semiconductor device of claim 1, wherein the semiconductor liner film includes a second portion between the first portion of the semiconductor liner film and the lower pattern,
   wherein the epitaxial insulating liner is not in contact with a sidewall of the second portion of the semiconductor liner film.

5. The semiconductor device of claim 4, further comprising:
   a fin spacer between the epitaxial insulating liner and the second portion of the semiconductor liner film, wherein the fin spacer extends along a sidewall of the second portion of the semiconductor liner film.

6. The semiconductor device of claim 1, wherein the source/drain pattern includes the semiconductor filling film on the semiconductor liner film and contacting the semiconductor liner film, wherein the semiconductor filling film includes a first portion, wherein in the first portion of the semiconductor filling film, a width of the semiconductor filling film in the second direction decreases in a direction away from the lower pattern, wherein the epitaxial insulating liner does not extend along a sidewall of the first portion of the semiconductor filling film.

7. The semiconductor device of claim 6, wherein the first portion of the semiconductor filling film is in contact with an upper surface of the semiconductor liner film.

8. The semiconductor device of claim 6, wherein the semiconductor filling film further includes a second portion between the semiconductor liner film and the first portion of the semiconductor filling film, wherein in the second portion of the semiconductor filling film, a width of the semiconductor filling film in the second direction increases in the direction away from the lower pattern.

9. The semiconductor device of claim 8, wherein the epitaxial insulating liner does not extend along a sidewall of the second portion of the semiconductor filling film.

10. The semiconductor device of claim 1, further comprising:

a field insulating film on the substrate and at least partially covering a sidewall of the lower pattern; and a source/drain etch stop film on the field insulating film and the source/drain pattern, wherein the source/drain etch stop film extends along an upper surface of the field insulating film and the sidewall of the semiconductor liner film, wherein the epitaxial insulating liner is between the source/drain etch stop film and the semiconductor liner film.

11. A semiconductor device comprising:

a lower pattern on a substrate and protruding in a first direction;

a field insulating film on the substrate and at least partially covering a sidewall of the lower pattern;

a source/drain pattern on the lower pattern, wherein the source/drain pattern includes a semiconductor liner film in contact with the lower pattern, and a semiconductor filling film on the semiconductor liner film, wherein the semiconductor liner film covers at least a portion of a first sidewall of the semiconductor filling film and at least a portion of a second sidewall of the semiconductor filling film;

an epitaxial insulating liner extending along a portion of a sidewall of the source/drain pattern and contacting the semiconductor liner film; and a source/drain etch stop film extending along an upper surface of the field insulating film and the sidewall of the source/drain pattern, wherein the epitaxial insulating liner is between the source/drain etch stop film and the source/drain pattern, wherein the sidewall of the source/drain pattern includes a lower inclined sidewall, an upper inclined sidewall on the lower inclined sidewall, and a facet intersection at which the lower inclined sidewall and the upper inclined sidewall meet, wherein at the facet intersection, a width of the source/drain pattern in a second direction is maximum, wherein at least a portion of the lower inclined sidewall of the source/drain pattern is defined by the semiconductor liner film, wherein the epitaxial insulating liner does not extend along the upper inclined sidewall of the source/drain pattern, and wherein the epitaxial insulating liner extends along an entirety of the lower inclined sidewall of the source/drain pattern defined by the semiconductor liner film.

12. The semiconductor device of claim 11, wherein an entirety of the upper inclined sidewall of the source/drain pattern is defined by the semiconductor filling film.

13. The semiconductor device of claim 11, wherein a portion of the lower inclined sidewall of the source/drain pattern is defined by the semiconductor filling film.

14. The semiconductor device of claim 11, wherein the sidewall of the source/drain pattern includes a connection sidewall defined by the semiconductor liner film, wherein the source/drain pattern includes a bottom surface in contact with the lower pattern, wherein the connection sidewall of the source/drain pattern connects the bottom surface of the source/drain pattern to the lower inclined sidewall of the source/drain pattern, and wherein the epitaxial insulating liner is on the connection sidewall of the source/drain pattern.

15. The semiconductor device of claim 14, further comprising:

a fin spacer on the field insulating film and extending along the connection sidewall of the source/drain pattern, wherein the fin spacer is between the epitaxial insulating liner and the semiconductor liner film.

16. A semiconductor device comprising:

an active pattern including:

a lower pattern on a substrate and protruding in a first direction; and a sheet pattern spaced apart from the lower pattern in the first direction;

a gate structure on the lower pattern and including a gate electrode and a gate spacer extending in a second direction; and a source/drain pattern on the lower pattern and contacting the sheet pattern and the gate spacer, wherein the source/drain pattern includes:

a semiconductor liner film in contact with the sheet pattern and the gate spacer; and a semiconductor filling film on the semiconductor liner film, wherein in a plan view, the semiconductor liner film includes a first portion having a first width in the second direction, and a second portion having a second width in the second direction, wherein the second width is greater than the first width, and wherein the first portion of the semiconductor liner film is between the second portion of the semiconductor liner film and the sheet pattern, and is in contact with the sheet pattern.

17. The semiconductor device of claim 16, wherein the gate spacer includes an inner sidewall facing the gate electrode, an outer sidewall opposite to the inner sidewall of the gate spacer, and a connection sidewall connecting the inner sidewall of the gate spacer to the outer sidewall of the gate spacer, and wherein the second portion of the semiconductor liner film is on a portion of the outer sidewall of the gate spacer.

18. The semiconductor device of claim 17, wherein the first portion of the semiconductor liner film and the second portion of the semiconductor liner film are divided based on the outer sidewall of the gate spacer.

19. The semiconductor device of claim 16, wherein the semiconductor filling film does not contact an outer sidewall of the gate spacer.

20. The semiconductor device of claim 16, further comprising:

an epitaxial insulating liner in contact with the second portion of the semiconductor liner film and the gate spacer, wherein in the plan view, a thickness of the epitaxial insulating liner in a third direction is equal to a thickness of the second portion of the semiconductor liner film in the third direction.

* * * * *